United States Patent
Fukuzumi et al.

(10) Patent No.: US 9,741,738 B2
(45) Date of Patent: Aug. 22, 2017

(54) NON-VOLATILE SEMICONDUCTOR STORAGE DEVICE AND METHOD OF MANUFACTURING THE SAME

(71) Applicant: KABUSHIKI KAISHA TOSHIBA, Minato-ku (JP)

(72) Inventors: Yoshiaki Fukuzumi, Yokohama (JP); Ryota Katsumata, Yokohama (JP); Masaru Kidoh, Komae (JP); Masaru Kito, Yokohama (JP); Hiroyasu Tanaka, Minato-ku (JP); Yosuke Komori, Yokohama (JP); Megumi Ishiduki, Yokohama (JP); Hideaki Aochi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/141,135

(22) Filed: Apr. 28, 2016

(65) Prior Publication Data

US 2016/0240554 A1    Aug. 18, 2016

Related U.S. Application Data

(63) Continuation of application No. 14/668,270, filed on Mar. 25, 2015, now Pat. No. 9,356,042, which is a (Continued)

(30) Foreign Application Priority Data

Dec. 11, 2007  (JP) ................................. 2007-320215

(51) Int. Cl.
*H01L 29/51* (2006.01)
*H01L 27/11* (2006.01)
(Continued)

(52) U.S. Cl.
CPC .... *H01L 27/11582* (2013.01); *G11C 16/0483* (2013.01); *H01L 27/1052* (2013.01);
(Continued)

(58) Field of Classification Search
CPC . H01L 29/66; H01L 29/668; H01L 29/66825; H01L 27/11; H01L 27/115;
(Continued)

(56) References Cited

U.S. PATENT DOCUMENTS 5,599,724 A    2/1997  Yoshida
5,707,885 A    1/1998  Lim
(Continued)

FOREIGN PATENT DOCUMENTS

JP    6 338602    12/1994
JP    10 93083    4/1998
(Continued)

OTHER PUBLICATIONS

Extended European Search Report issued Sep. 6, 2010 in PCT/JP2008072727.
(Continued)

*Primary Examiner* — Monica D Harrison
(74) *Attorney, Agent, or Firm* — Oblon, McClelland, Maier & Neustadt, L.L.P.

(57) ABSTRACT

A non-volatile semiconductor storage device has a plurality of memory strings to each of which a plurality of electrically rewritable memory cells are connected in series. Each of the memory strings includes first semiconductor layers each having a pair of columnar portions extending in a vertical direction with respect to a substrate and a coupling portion formed to couple the lower ends of the pair of columnar portions; a charge storage layer formed to surround the side surfaces of the columnar portions; and first conductive layers formed to surround the side surfaces of the columnar (Continued)

portions and the charge storage layer. The first conductive layers function as gate electrodes of the memory cells.

11 Claims, 51 Drawing Sheets

Related U.S. Application Data continuation of application No. 14/246,849, filed on Apr. 7, 2014, now Pat. No. 9,035,374, which is a continuation of application No. 13/740,803, filed on Jan. 14, 2013, now Pat. No. 8,729,624, which is a continuation of application No. 12/679,991, filed as application No. PCT/JP2008/072727 on Dec. 9, 2008, now Pat. No. 8,372,720.

(51) Int. Cl.
| | | |
|---|---|---|
| *H01L 27/11582* | (2017.01) | |
| *G11C 16/04* | (2006.01) | |
| *H01L 27/11556* | (2017.01) | |
| *H01L 27/11573* | (2017.01) | |
| *H01L 27/11578* | (2017.01) | |
| *H01L 27/105* | (2006.01) | |
| *H01L 27/11575* | (2017.01) | |
| *H01L 27/11551* | (2017.01) | |

(52) U.S. Cl.
CPC .. *H01L 27/11556* (2013.01); *H01L 27/11573* (2013.01); *H01L 27/11575* (2013.01); *H01L 27/11578* (2013.01); *H01L 29/513* (2013.01); *H01L 27/11551* (2013.01)

(58) Field of Classification Search
CPC ......... H01L 27/11521; H01L 27/11568; H01L 21/28; H01L 21/282; H01L 21/28273
USPC ....................................................... 257/314
See application file for complete search history.

(56) References Cited

U.S. PATENT DOCUMENTS

| | | | |
|---|---|---|---|
| 6,933,556 B2 | 8/2005 | Endoh et al. | |
| 7,115,476 B1 | 10/2006 | Izumida | |
| 7,936,004 B2 | 5/2011 | Kito et al. | |
| 8,008,710 B2 * | 8/2011 | Fukuzumi | G11C 5/02 257/326 |
| 8,729,624 B2 | 5/2014 | Fukuzumi | |
| 2005/0280061 A1 | 12/2005 | Lee | |
| 2006/0091556 A1 | 5/2006 | Shigeoka | |
| 2007/0252201 A1 | 11/2007 | Kito et al. | |
| 2009/0146206 A1 | 6/2009 | Fukuzumi et al. | |
| 2009/0224309 A1 | 9/2009 | Kidoh et al. | |
| 2009/0294844 A1 | 12/2009 | Tanaka et al. | |
| 2010/0038703 A1 | 2/2010 | Fukuzumi et al. | |

FOREIGN PATENT DOCUMENTS

| | | |
|---|---|---|
| JP | 2007 266143 | 10/2007 |
| JP | 2007 317874 | 12/2007 |
| JP | 2008 53170 | 3/2008 |
| JP | 2009-135324 | 6/2009 |
| JP | 2009-212280 | 9/2009 |

OTHER PUBLICATIONS

Office Action issued Jun. 15, 2011 in European Patent Application No. 08 860 456.6-1235.
Office Action issued Mar. 27, 2012, in Korean Patent Application No. 10-2010-7013010 (with English-language translation).
Korean Office Action mailed Jul. 5, 2012 for application No. 10-2010-7013010 (with English Translation).
Office Action issued Aug. 21, 2012 in Japanese Patent Application No. 2007-320215 filed Dec. 11, 2007, with English translation.
Japanese Decision of Refusal and Decision of Dismissal of Amendment issued on Sep. 16, 2014, in Patent Application No. 2012-251671 with English translation.
Chinese Office Action for application No. 200880120172.5 dated Nov. 23, 2012, with English translation.
Taiwanese Office Action issued May 29, 2012 with English Translation.
Office Action mailed on Feb. 18, 2014, in Japanese patent Application No. 2012-251671 (with English-language translation).
Japanease Office Action issued Nov. 17, 2015 in Japanese Patent Application No. 2012-251671 with English translation, 4 pages.

* cited by examiner

RAW DIRECTION SECTIONAL VIEW OF TERMINAL END AND PERIPHERAL REGION Ph OF MEMORY TRANSISTOR REGION 12

NON-VOLATILE SEMICONDUCTOR STORAGE DEVICE AND METHOD OF MANUFACTURING THE SAME

CROSS REFERENCE TO RELATED APPLICATION

This application is a continuation of and claims the benefit of priority under 35 U.S.C. §120 from U.S. Ser. No. 14/668,270, filed Mar. 25, 2015 which is a continuation of U.S. Ser. No. 14/246,849, filed Apr. 7, 2014, which is a continuation of U.S. Ser. No. 13/740,803, filed Jan. 14, 2013, now U.S. Pat. No. 8,729,624, which is a continuation of U.S. Ser. No. 12/679,991, filed Mar. 25, 2010, now U.S. Pat. No. 8,372,720, which is a national stage of PCT/JP2008/072727, filed Dec. 9, 2008, and claims the benefit or priority under 35 U.S.C. §119 from Japanese Patent Application No. JP 2007-320215, filed Dec. 11, 2007, the entire contents of each of which are incorporated herein by reference.

TECHNICAL FIELD

The present invention relates to an electrically rewritable non-volatile semiconductor storage device and to a method of manufacturing the same.

BACKGROUND ART

Conventionally, LSIs are formed by integrating elements in a two-dimensional plane on a silicon substrate. Although the size of one element is ordinarily reduced (miniaturized) to increase the storage capacity of a memory, this becomes recently difficult from a viewpoint of cost and technology. Although a photolithography technology must be improved for miniaturization, a cost necessary for a lithography process is more and more increased. Further, even if miniaturization has been achieved, it is predicted that a withstanding voltage between elements and the like reaches a physical limit unless a drive voltage and the like are scaled. That is, there is a high possibility that a device becomes difficult to operate.

To cope with the above problem, recently, a lot of semiconductor storage devices are proposed in which memory cells are three-dimensionally disposed to increase the degree of integration of the memories (refer to Japanese Patent Application Laid-Open No. 2007-266143 and U.S. Pat. Nos. 5,599,724 and 5,707,885).

As one of conventional semiconductor storage devices in which memory cells are disposed three-dimensionally, there is a semiconductor storage device using a transistor having a columnar structure (refer to Japanese Patent Application Laid-Open No. 2007-266143 and U.S. Pat. Nos. 5,599,724 and 5,707,885). The semiconductor storage device using the transistor having the columnar structure is provided with a multi-layered conductive layer acting as a gate electrode and a pillar-shaped columnar semiconductor. The columnar semiconductor functions as a channel (body) of the transistor. A memory gate insulation layer is disposed around the columnar semiconductor. An arrangement including the conductive layer, the columnar semiconductor and the memory gate insulation layer is called a memory string.

In the above conventional technology, holes are formed to the laminated conductive layers at the same time. Subsequently, memory gate insulation layers are formed to the side walls of the thus formed holes and subjected to a diluted fluorinated acid process. Then, columnar semiconductors are formed so that the holes are filled therewith. The memory cells are three-dimensionally formed by repeating the above processes a plurality of times. However, a problem arises in that the memory gate insulation layers are removed by etching due to the diluted fluorinated acid process.

DISCLOSURE OF INVENTION

A non-volatile semiconductor storage device according to one aspect of the present invention has a plurality of memory strings in each of which a plurality of electrically rewritable memory cells are connected in series, each of the memory strings comprising: first semiconductor layers each having a pair of columnar portions extending in a vertical direction with respect to a substrate and a coupling portion formed to couple the lower ends of the pair of columnar portions; a charge storage layer formed to surround the side surfaces of the columnar portions; and first conductive layers formed to surround the side surfaces of the columnar portions and the charge storage layer, the first conductive layers functioning as gate electrodes of the memory cells.

According to one aspect of the present invention, there is provided a method of manufacturing a non-volatile semiconductor storage device having a plurality of memory strings in each of which a plurality of electrically rewritable memory cells are connected in series, the method comprising: forming a first conductive layer on a substrate through a first insulation layer; forming grooves extending in a first direction that is in parallel with the substrate so as to dig the first conductive layers; forming a plurality of second conductive layers on the upper layers of the first conductive layers through second insulation layers; forming first through holes so that the first through holes pass through the second conductive layers and the second insulation layers as well as are aligned with the vicinities of both the ends in the first direction of the grooves; forming charge storage layers to the grooves and side surfaces facing the first through holes; and forming first semiconductor layers to the side surfaces of the charge storage layers.

EMBODIMENTS

Figure 1:
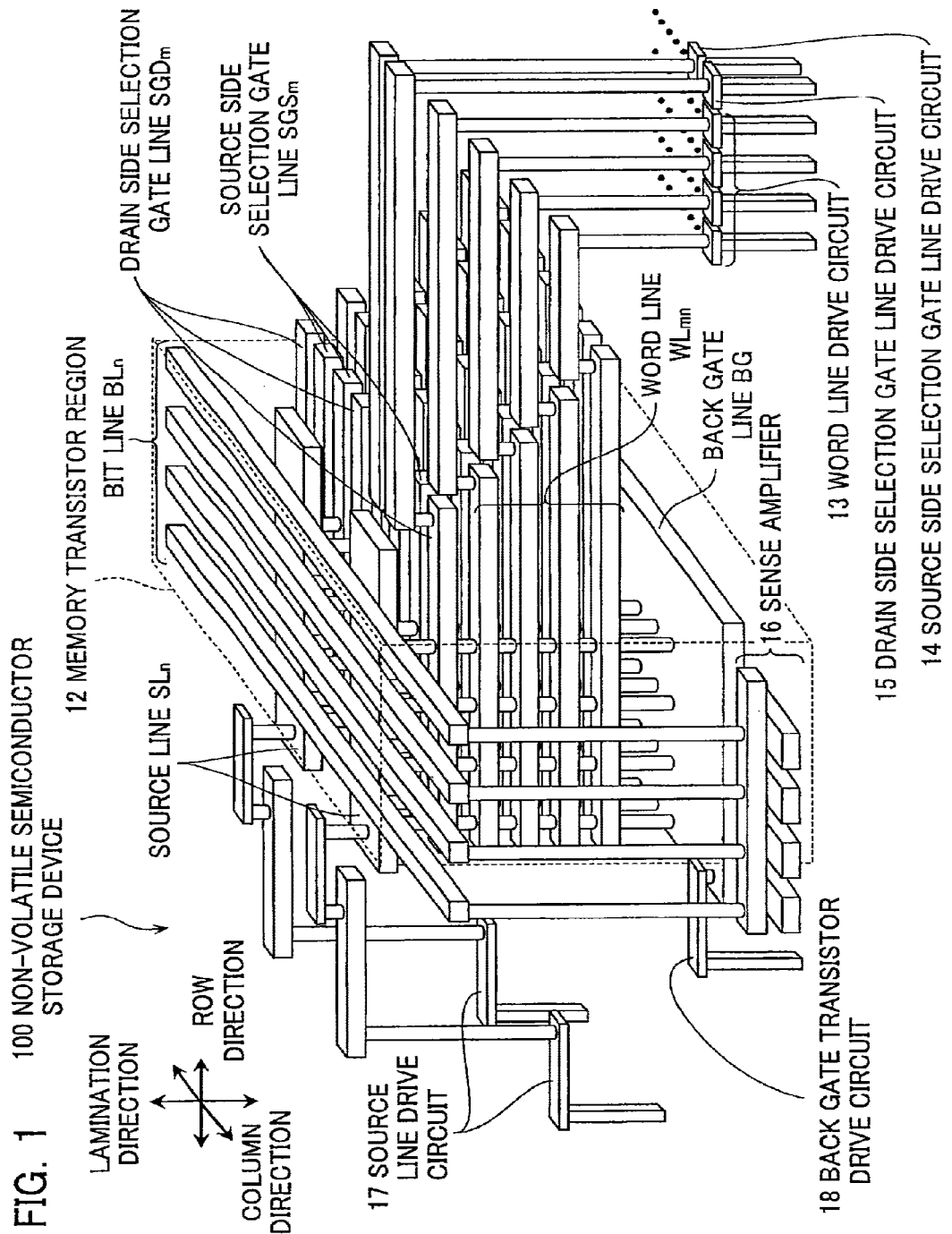
FIG. 1 is a schematic view of an arrangement of a non-volatile semiconductor storage device 100 according to a first embodiment of the present invention.

Embodiments of a non-volatile semiconductor storage device and a method of manufacturing the same according to the present invention will be explained below referring to the drawings.

First Embodiment

Arrangement of Non-Volatile Semiconductor Storage Device 100 According to First Embodiment FIG. 1 shows a schematic view of a non-volatile semiconductor storage device 100 according to a first embodiment of the present invention. As shown in FIG. 1, the non-volatile semiconductor storage device 100 according to the first embodiment mainly has a memory transistor region 12, a word line drive circuit 13, a source side selection gate line ($SGS_m$) drive circuit 14, a drain side selection gate line ($SGD_m$) drive circuit 15, a sense amplifier 16, a source line drive circuit 17, and a back gate transistor drive circuit 18. The memory transistor region 12 has memory transistors for storing data. The word line drive circuit 13 controls a voltage applied to the word line $WL_m$. The source side selection gate line ($SGS_m$) drive circuit 14 controls a voltage applied to the source side selection gate line $SGS_m$. The drain side selection gate line ($SGD_m$) drive circuit 15 controls a voltage applied to the drain side selection gate line ($SGD_m$). The sense amplifier 16 amplifies an electric potential read out from the memory transistors. The source line drive circuit 17 controls a voltage applied to a source line $SL_n$. The back gate transistor drive circuit 18 controls a voltage applied to a back gate line BG. Note that the non-volatile semiconductor storage device 100 according to the first embodiment has a bit line drive circuit (not shown) for controlling a voltage applied to a bit line $BL_n$ in addition to those described above.

Figure 2:
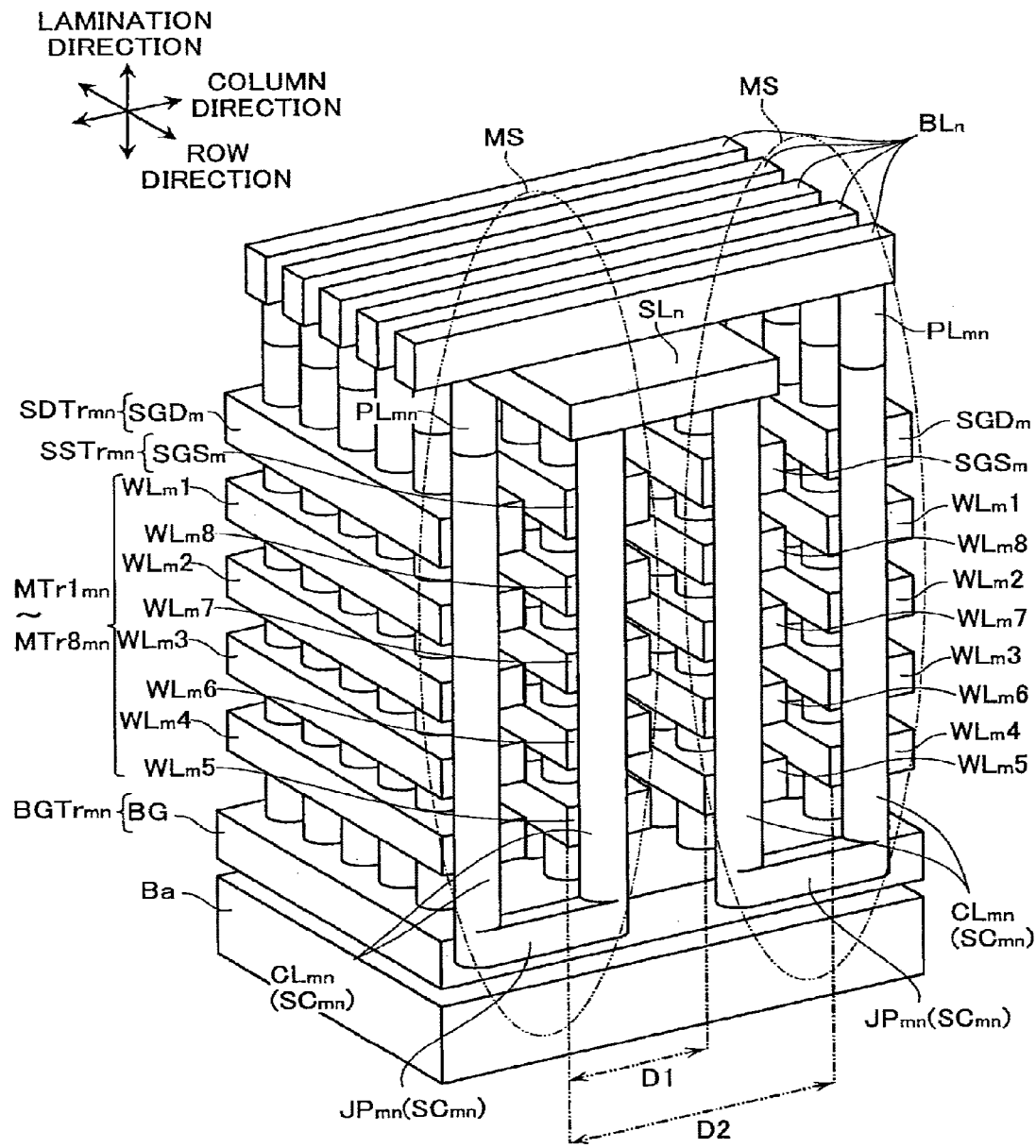
FIG. 2 is a schematic perspective view of a part of a memory transistor region 12 according to the first embodiment of the present invention.
Figure 3:
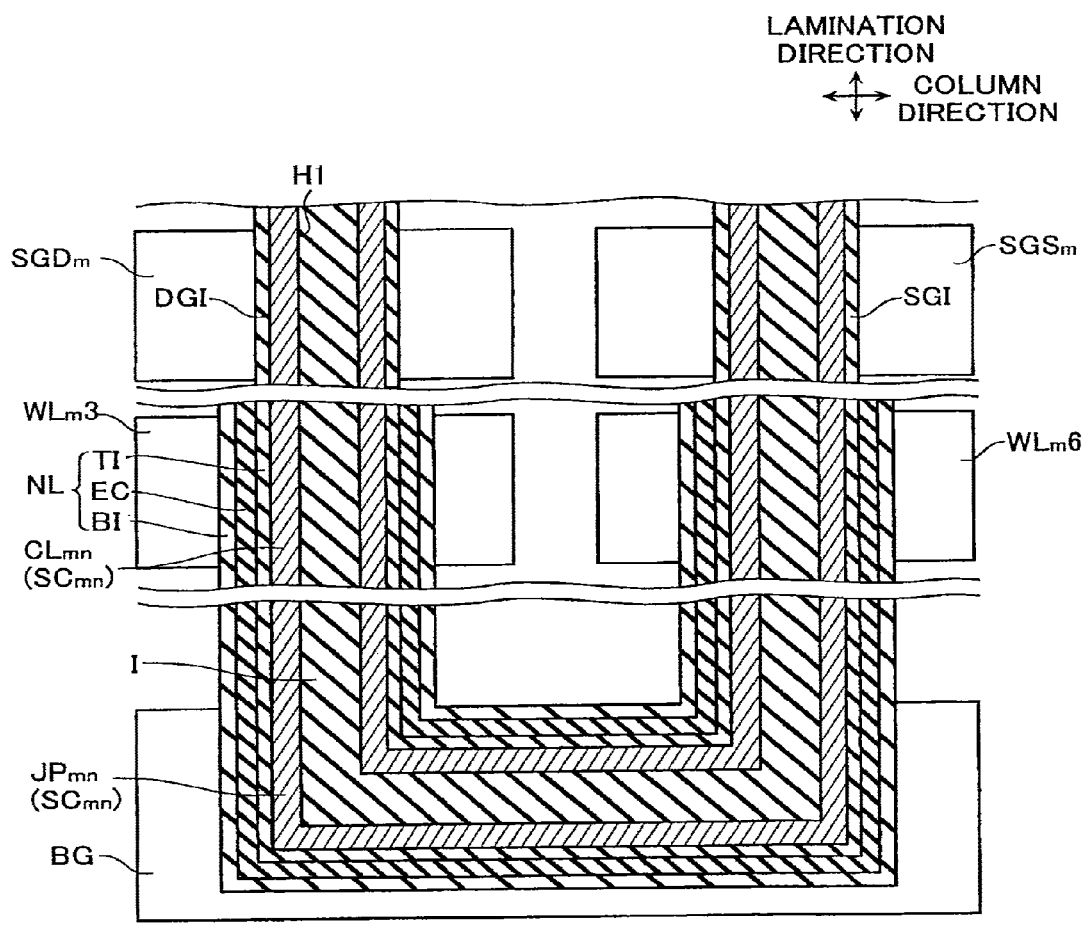
FIG. 3 is an enlarged view of one memory string MS according to the first embodiment of the present invention.

FIG. 2 is a schematic perspective view of a part of the memory transistor region 12 of the non-volatile semiconductor storage device 100 according to the first embodiment. In the first embodiment, the memory transistor region 12 has m×n (m, n are natural numbers) pieces of memory strings MS each composed of the memory transistors ($MTr1_{mn}$ to $MTr8_{mn}$), a source side select gate transistor $SSTr_{mn}$ and a drain side select gate transistor $SDTr_{mn}$. FIG. 2 shows an example of m=6, n=2. FIG. 3 is a partly enlarged sectional view of FIG. 2.

In the non-volatile semiconductor storage device 100 according to the first embodiment, a plurality of the memory strings MS are disposed to the memory transistor region 12. Although explained below in detail, each of the memory strings MS has such an arrangement that the plurality of electrically rewritable memory transistors $MTr_{mn}$ are connected in series. As shown in FIGS. 1 and 2, the memory transistors $MTr_{mn}$ constituting each of the memory strings MS is formed by laminating a plurality of semiconductor layers.

Each memory string MS has a U-shaped semiconductor $SC_{mn}$, word lines $WL_{mn}$ ($WL_m1$ to $WL_m8$), the source side selection gate line $SGS_m$, and the drain side selection gate line $SGD_m$. Further, the memory string MS has the back gate line BG.

The U-shaped semiconductor $SC_{mn}$ is formed in a U-shape when viewed from a row direction. The U-shaped semiconductor $SC_{mn}$ has a pair of columnar portions $CL_{mn}$ extending in an approximately vertical direction with respect to a semiconductor substrate Ba and a coupling portion $JP_{mn}$ formed so as to be coupled with lower ends of the pair of columnar portions $CL_{mn}$. Further, as shown in FIG. 3, the U-shaped semiconductor $SC_{mn}$ has hollow portions H1 which communicate from an upper end of one of the columnar portions $CL_{mn}$ to an upper end of the other columnar portion $CL_{mn}$ through the coupling portion $JP_{mn}$. An insulating portion I is formed in the hollow portions H1. Note that the columnar portions $CL_{mn}$ may be formed in any of a circular columnar shape and an angular columnar shape. Further, the columnar portions $CL_{mn}$ may be formed in a stepped columnar shape. Here, the row direction is a direction orthogonal to a lamination direction, and a column direction to be described later is a direction orthogonal to a vertical direction and to the row direction.

The U-shaped semiconductor $SC_{mn}$ is disposed such that a linear line connecting the center axes of the pair of columnar portions $CL_{mn}$ is in parallel with the column direction. Further, the U-shaped semiconductors $SC_{mn}$ are disposed such that they are formed in a matrix state in a plane formed in the row direction and the column direction.

The word line $WL_{mn}$ of each layer has a shape extending in parallel with the row direction. The word lines $WL_{mn}$ of the respective layers are repeatedly formed in a line state by being insulated and separated from each other at first intervals formed in the column direction.

Gates of the memory transistors ($MTr1_{mn}$ to $MTr8_{mn}$), which are disposed at the same positions in the column direction and arranged in the row direction, are connected to the same word lines $WL_{mn}$. The respective word lines $WL_{mn}$ are disposed approximately vertical to the memory strings MS. Ends of the word lines $WL_{mn}$ in the row direction are formed stepwise. Note that the ends of the word lines $WL_{mn}$ in the column direction are not limited to be formed stepwise. For example, the ends of the word lines $WL_{mn}$ in the column direction may be aligned at a certain position in the column direction.

As shown in FIG. 3, an ONO (Oxide-Nitride-Oxide) layer NL is formed between the word line $WL_{mn}$ and the columnar portions $CL_{mn}$. The ONO layer NL has a tunnel insulation layer TI in contact with the columnar portions $CL_{mn}$, a charge storage layer EC in contact with the tunnel insulation layer TI, and a block insulation layer BI in contact with the charge storage layer EC. The charge storage layer EC has a function for accumulating charge.

In other words, the charge storage layer EC is formed so as to surround a side surface of the columnar portion $CL_{mn}$. Further, each word line $WL_{mn}$ is formed so as to surround the side surface of the columnar portion $CL_{mn}$ and the charge storage layer EC. Further, each word line $WL_{mn}$ is divided for each of respective columnar portions $CL_{mn}$ adjacent to each other in the column direction.

The drain side selection gate line $SGD_m$ is disposed above the uppermost word line $WL_{mn}$. The drain side selection gate line $SGD_m$ has a shape extending in parallel with the row direction. The drain side selection gate lines $SGD_m$ are repeatedly formed in a line state by being insulated and separated from each other at first intervals D1 or second intervals D2 (D2>D1) formed alternately in the column direction. The drain side selection gate lines $SGD_m$ are formed at second intervals D2 with the source side selection gate line $SGS_m$ to be described later sandwiched therebetween. Further, the columnar portions $CL_{mn}$ are formed passing through the centers of the drain side selection gate lines $SGD_m$ in the column direction. As shown in FIG. 3, a gate insulation layer DGI is formed between the drain side selection gate line $SGD_m$ and the columnar portion $CL_{mn}$.

The source side selection gate line $SGS_m$ is disposed above the uppermost word line $WL_{mn}$. The source side selection gate line $SGS_m$ has a shape extending in parallel with the row direction. The source side selection gate lines $SGS_m$ are repeatedly formed in a line state by being insulated and separated from each other at first intervals D1, second intervals D2 formed alternately in the column direction. The source side selection gate line $SGS_m$ are formed at the second intervals D2 with the drain side selection gate line $SGD_m$ sandwiched therebetween. Further, the columnar portions $CL_{mn}$ are formed passing through the centers of the source side selection gate line $SGS_m$ in the column direction. As shown in FIG. 3, a gate insulation layer SGI is formed between the source side selection gate line $SGS_m$ and the columnar portion $CL_{mn}$.

In other words, the two drain side selection gate lines $SGD_m$ and the two source side selection gate lines $SGS_m$ are alternately formed by forming the first intervals D1 in the column direction. Further, the respective drain side selection gate lines $SGD_m$ and the respective source side selection gate lines $SGS_m$ are formed to surround the columnar portions $CL_{mn}$ and the gate insulation layers SGI, DGI. Further, each drain side selection gate line $SGD_m$ and each source side selection gate line $SGS_m$ are divided for each of respective columnar portions $CL_{mn}$ adjacent to each other in the column direction.

The back gate line BG is formed to two-dimensionally expand in the row direction and the column direction so as to cover below a plurality of coupling portions $JP_{mn}$. As shown in FIG. 3, the ONO layer NL described above is formed between the back gate line BG and the coupling portions $JP_{mn}$.

Further, the source lines $SL_n$ are formed on upper ends of the columnar portions $CL_{mn}$ of the U-shaped semiconductors $SC_{mn}$ adjacent in the column direction.

Further, the bit lines $BL_n$ are formed on the upper ends of the columnar portions $CL_{mn}$ extending upward of the drain side selection gate lines $SGD_m$ through plug lines $PL_{mn}$. The respective bit lines $BL_n$ are formed to be located on the source lines $SL_n$. The respective bit lines $BL_n$ are repeatedly formed in a line state which extends in the column direction at predetermined intervals formed in the row direction.

Figure 4:
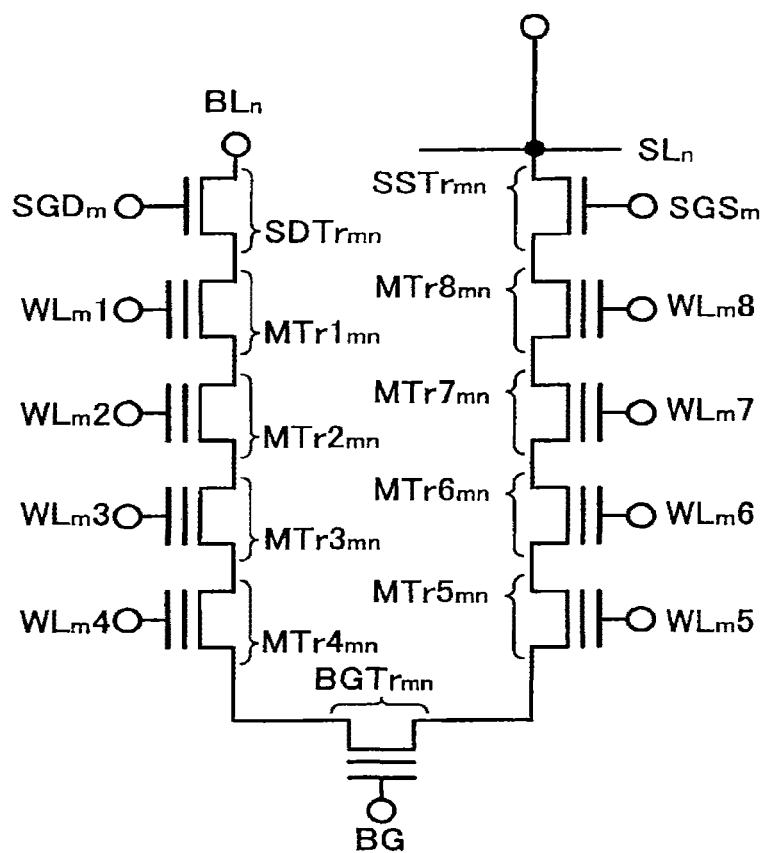
FIG. 4 is a circuit diagram of the one memory string MS according to the first embodiment of the present invention.

Next, a circuit arrangement that is arranged by the memory strings MS of the first embodiment will be explained referring to FIGS. 2 to 4. FIG. 4 is a circuit diagram of one memory string MS of the first embodiment.

As shown in FIGS. 2 to 4, in the first embodiment, each of the memory strings MS has the eight memory transistors $MTr1_{mn}$ to $MTr8_{mn}$, the source side select gate transistor $SSTr_{mn}$, the drain side select gate transistor $SDTr_{mn}$, and a back gate transistor $BGTr_{mn}$. The eight memory transistors $MTr1_{mn}$ to $MTr8_{mn}$, the source side select gate transistor $SSTr_{mn}$, and the drain side select gate transistor $SDTr_{mn}$ are connected in series, respectively (refer to FIG. 4). Further, a control circuit is connected to the source lines $SL_n$.

Each memory transistor $MTr_{mn}$ is composed of the columnar portions $CL_{mn}$, the ONO layer NL (charge storage layer EC), and the word line $WL_{mn}$. An end of the word line $WL_{mn}$ in contact with the ONO layer NL functions as a control gate electrode of the memory transistors $MTr_{mn}$.

The drain side select gate transistor $SDTr_{mn}$ is composed of the columnar portions $CL_{mn}$, the gate insulation layer DGI, and the drain side selection gate line $SGD_m$. An end of the drain side selection gate line $SGD_m$ in contact with the gate insulation layer DGI functions as a control gate electrode of the drain side select gate transistor $SDTr_{mn}$.

The source side select gate transistor $SSTr_{mn}$ is composed of the columnar portions $CL_{mn}$, the gate insulation layer SGI, and the source side selection gate line $SGS_m$. An end of the source side selection gate line $SGS_m$ in contact with the gate insulation layer SGI functions as a control gate electrode of the source side select gate transistor $SSTr_{mn}$.

The back gate transistor $BGTr_{mn}$ is composed of the coupling portion $JP_{mn}$, the ONO layer NL (charge storage layer EC), and the back gate line BG. An end of the back gate line BG in contact with the ONO layer NL functions as a control gate electrode of the back gate transistor $BGTr_{mn}$.

Figure 5:
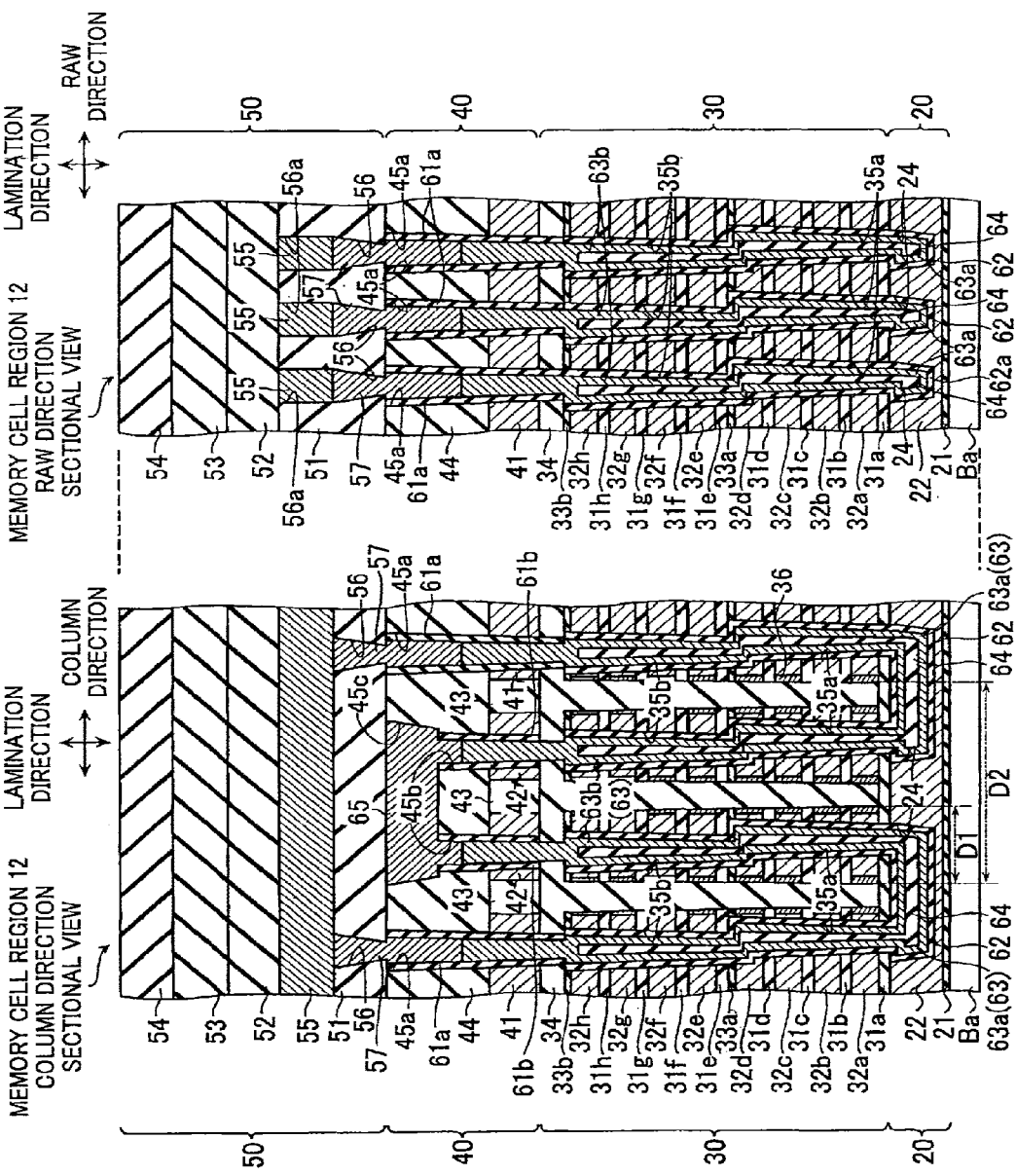
FIG. 5 is a sectional view of the memory transistor region 12 according to the first embodiment.
Figure 6:
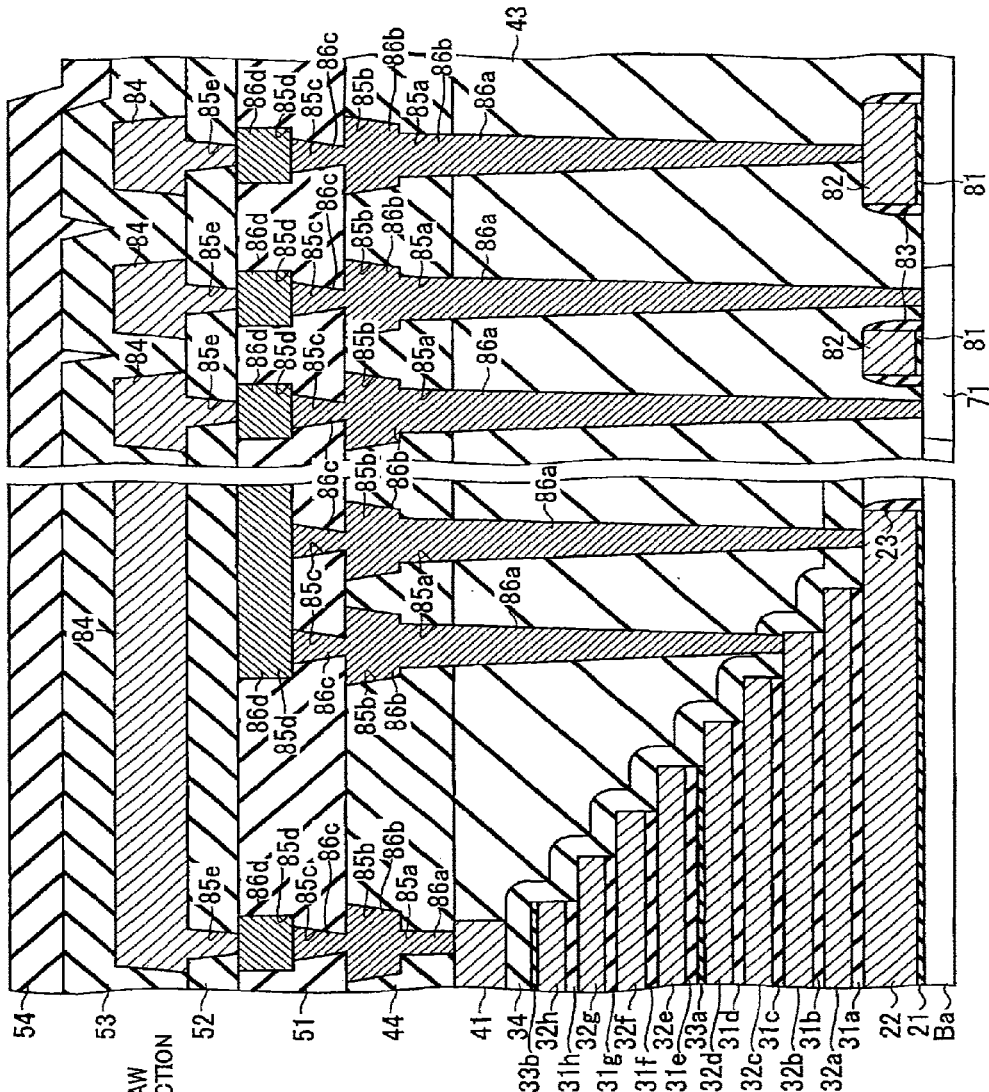
FIG. 6 is a sectional view of the memory transistor region 12 according to the first embodiment from a terminal end to a peripheral region Ph in a row direction.

Specific Arrangement of Non-Volatile Semiconductor Storage Unit 100 According to First Embodiment Next, a specific arrangement of the non-volatile semiconductor device 100 according to the first embodiment will be explained referring to FIGS. 5 and 6. FIG. 5 is a sectional view of the memory transistor region 12 of the non-volatile semiconductor device 100 according to the first embodiment, and FIG. 6 is a sectional view in the row direction of a terminal end and a peripheral region Ph of the memory transistor region 12. Further, FIG. 5 shows a cross section in the column direction and a cross section in the row direction. FIGS. 5 and 6 show a memory string in which 16 memory transistors are connected in series different from the memory string shown in FIGS. 1 to 4.

First, an arrangement of the memory transistor region 12 of the non-volatile semiconductor storage device 100 according to the first embodiment will be explained. As shown in FIGS. 5 and 6, the memory transistor region 12 (memory string MS) has a back gate transistor layer 20, a memory transistor layer 30, a select gate transistor layer 40, and a wiring layer 50 sequentially from the semiconductor substrate Ba in the lamination direction. The back gate transistor layer 20 functions as the back gate transistor $BGTr_{mn}$ described above. The memory transistor layer 30 functions as the memory transistor $MTr_{mn}$ described above. The select gate transistor layer 30 functions as the source side select gate transistor layer $SSTr_{mn}$ and the drain side select gate transistor $SDTr_{mn}$ described above.

The back gate transistor layer 20 has a back gate insulation layers 21 and back gate conductive layers 22 sequentially laminated on the semiconductor substrate Ba. The back gate insulation layers 21 and the back gate conductive layers 22 are formed to expand to an end of the memory transistor region 12 in the row direction and the column direction. Further, the back gate transistor layer 20 has side wall insulation layers 23 for covering the side walls of the ends in the row direction and the column direction of the back gate insulation layers 21 and the back gate conductive layers 22.

The back gate conductive layers 22 are formed to cover the lower surface and the side surface of a coupling portion 63a of a U-shaped semiconductor layer 63 to be described later and is formed to the same height as the upper surface of the coupling portion 63a.

The back gate insulation layers 21 are composed of silicon oxide ($SiO_2$). The back gate conductive layers 22 are composed of polysilicon (p-Si). The side wall insulation layers 23 are composed of silicon oxide ($SiO_2$).

Further, the back gate transistor layer 20 has back gate holes 24 formed by digging the back gate conductive layers 22. Each of the back gate holes 24 has an opening having a short side in the row direction and a long side in the column direction. The back gate holes 24 are formed at predetermined intervals in the row direction and the column direction. In other words, the back gate holes 24 are formed in a plane including the row direction and the column direction in a matrix state.

The memory transistor layer 30 has first to fourth inter-word-line insulation layers 31a to 31d and first to fourth word line conductive layers 32a to 32d alternately laminated on each of the back gate conductive layer 22. Further, the memory transistor layer 30 has a first separation/insulation layer 33a deposited on the fourth the word line conductive layer 32d. Further, the memory transistor layer 30 has fifth to eighth inter-word-line insulation layers 31e to 31h and fifth to eighth word line conductive layers 32e to 32h alternately laminated on the first separation/insulation layer 33a. Further, the memory transistor layer 30 has a second separation/insulation layer 33b and a memory protection/insulation layer 34 sequentially deposited on the eighth word line conductive layer 32h.

The first to eighth inter-word-line insulation layers 31a to 31h, the first to eighth word line conductive layers 32a to 32h, the first separation/insulation layer 33a, and the second separation/insulation layer 33b are repeatedly formed in a line state so as to extend in the row direction at predetermined intervals formed in the column direction. The first to eighth inter-word-line insulation layers 31a to 31h, the first to eighth word line conductive layers 32a to 32h, the first separation/insulation layer 33a, and the second separation/insulation layer 33b are formed stepwise at the ends thereof in the row direction. The memory protection/insulation layer 34 is formed to cover the ends in the row direction and the column direction of the first to eighth inter-word-line insulation layers 31a to 31h, the first to eighth word line conductive layers 32a to 32h, the first separation/insulation layer 33a, and the second separation/insulation layer 33b and the upper surface of the second separation/insulation layer 33b. Further, silicide films 36 are formed on the side surfaces of the ends in the column direction of the first to eighth word line conductive layers 32a to 32h.

The first to eighth inter-word-line insulation layers 31a to 31h are composed of silicon oxide ($SiO_2$). The first to eighth word line conductive layers 32a to 32h are composed of polysilicon (p-Si). The first separation/insulation layer 33a and the second separation/insulation layer 33b are composed of silicon oxide ($SiO_2$). The memory protection/insulation layer 34 is composed of silicon nitride (SiN). The silicide films 36 are composed of cobalt silicide ($CoSi_2$).

Further, the memory transistor layer 30 has first memory holes 35a formed to pass through the first separation/insulation layer 33a, the first to fourth the inter-word-line insulation layers 31a to 31d, the first to fourth word line conductive layers 32a to 32d. The first memory holes 35a are formed to be aligned at positions in the vicinity of both the ends in the column direction of the respective back gate holes 24. Further, the memory transistor layer 30 has second memory holes 35b formed to pass through the second separation/insulation layer 33b, the fifth to eighth inter-word-line insulation layers 31e to 31h, the fifth to eighth word line conductive layers 32e to 32h, and the first separation/insulation layer 33a and to dig the fourth word line conductive layer 32d. That is, the first memory holes 35a and the second memory holes 35b are formed such that they are overlapped a predetermined length in the lamination direction. The overlapped length is set to an expected maximum amount of offset in alignment, for example, about one third a minimum feature size. Note that, in FIG. 5, although the center axes of the first memory holes 35a are offset from the center axes of the second memory holes 35b, these holes 35a, 35b may be formed such that these center axes are aligned with each other.

The select gate transistor layer 40 has drain side conductive layers 41, source side conductive layers 42, and inter-layer insulation layers 43 which are deposited on the memory protection/insulation layers 34. The drain side conductive layers 41, the source side conductive layers 42, the interlayer insulation layers 43 are repeatedly formed in a line state so as to extend in the row direction at predetermined intervals formed in the column direction.

The drain side conductive layers 41 are formed by alternately forming first intervals D1 or the second intervals D2 in the column direction. Likewise, the source side conductive layers 42 are formed by alternately forming first intervals D1 or the second intervals D2 in the column direction. Two source side conductive layers 41, which are formed at the first intervals D1, are formed between the drain side conductive layers 41 formed in the column direction at the second intervals D2. Further, two drain side conductive layers 42, which are formed at the first intervals D1, are formed between the source side conductive layers 42 formed in the column direction at the second intervals D2. The interlayer insulation layers 43 are formed between the drain side conductive layers 41 and the source side conductive layers 42 formed as described above.

Further, the select gate transistor layer 40 has select gate transistor insulation layers 44 formed on the drain side conductive layers 41, the source side conductive layers 42, and the interlayer insulation layers 43.

The drain side conductive layers 41 and the source side conductive layers 42 are composed of polysilicon (p-Si). The interlayer insulation layers 43 and the select gate transistor insulation layers 44 are composed of silicon oxide ($SiO_2$).

Further, the select gate transistor layer 40 has drain side holes 45a formed to pass through the select gate transistor insulation layers 44 and the drain side conductive layers 41. Further, the select gate transistor layer 40 has source side holes 45b formed to pass through the select gate transistor insulation layers 44 and the source side conductive layers 42. The drain side holes 45a and the source side holes 45b are formed at the positions where they are aligned with the second memory holes 35b. Source line wiring grooves 45c are formed on the source side holes 45b adjacent with each other in the column direction so as to dig the select gate transistor insulation layers 44. The source line wiring grooves 45c are formed to connect the upper portions of the source side holes 45b adjacent to each other in the column direction and to extend in the row direction.

In the above arrangement, drain side gate insulation layers 61a are formed on side walls facing the drain side holes 45a. Further, source side gate insulation layers 61b are formed on side walls facing the source side holes 45b. Further, memory gate insulation layers 62 are formed to side walls facing the second memory holes 35b, the first memory holes 35a, and the back gate holes 24. Further, the U-shaped semiconductor layer 63 is formed up to a first height of the drain side holes 45a and the source side holes 45b so as to come into contact with the drain side gate insulation layers 61a, the source side gate insulation layers 61b, and the memory gate insulation layers 62. The U-shaped semiconductor layer 63 has hollow portions. Internal insulation layers 64 are formed in the hollow portions of the U-shaped semiconductor layer 63.

The drain side gate insulation layers 61a and the source side gate insulation layers 61b have a cylindrical shape. The memory gate insulation layers 62 have a U-shape when viewed from the row direction. The memory gate insulation layers 62 have hollow portions which are continuous from one upper ends to the other upper ends. The U-shaped semiconductor layer 63 has a U-shape when viewed from the row direction. The U-shaped semiconductor layer 63 has a pair of columnar portions 63a, which extend in the vertical direction with respect to the semiconductor substrate Ba when viewed from the row direction, and a coupling portion 63b formed to couple the lower ends of the pair of columnar portions 63a.

The U-shaped semiconductor layer 63 functions as the U-shaped semiconductor $SC_{mn}$ described above. The back gate conductive layer 22 functions as the back gate line BG. Further, the ends of the back gate conductive layers 22 in the vicinity of the coupling portions 63a function as control gates of the back gate transistors $BGTr_{mn}$. The first to eighth word line conductive layers 32a to 32h function as the word lines $WL_m1$ to $WL_m8$. Further, the ends of the first to eighth word line conductive layers 32a to 32h, which are located in the vicinity of the columnar portions 63b, function as control gates of the memory transistors $MTr_{mn}$. The drain side conductive layers 41 function as the drain side selection gate lines $SGD_m$. Further, the ends of the drain side conductive layers 41, which are located in the vicinity of the columnar portions 63b, function as control gates of the drain side select gate transistors $SDTr_{mn}$. The source side conductive layers 42 function as the source side selection gate lines $SGS_m$. Further, the ends of the source side conductive layers 42, which are located in the vicinity of the columnar portions 63b, function as control gates of the source side select gate transistors $SSTr_{mn}$. Further, the internal dielectric layers 64 correspond to the insulating portions I.

Further, in the above arrangement, source line conductive layers 65 are formed so that the source line wiring grooves 45c are filled therewith from a first height of the source side holes 45b. The source line conductive layers 65 are formed in a sheet shape in parallel with the semiconductor substrate Ba. The source line conductive layers 65 correspond to the source lines $SL_n$ described above.

The drain side gate insulation layers 61a and the source side gate insulation layers 61b are composed of silicon oxide ($SiO_2$). Each of the memory gate insulation layers 62 is composed of the block insulation layer BI, the charge storage layer EC, and the tunnel insulation layer TI. The block insulation layer BI is composed of silicon oxide ($SiO_2$). The charge storage layer EC is composed of silicon nitride (SiN). The tunnel insulation layer TI is composed of silicon oxide ($SiO_2$). That is, each of the memory gate insulation layers 62 is composed of the ONO layer. The U-shaped semiconductor layer 63 is composed of polysilicon (p-Si). Each of the internal dielectric layers 64 is composed of silicon oxide ($SiO_2$). The source line conductive layer 65 is composed of titanium (Ti), titanium nitride (TiN), and tungsten (W).

The wiring layer 50 has a first wiring insulation layer 51, a second wiring insulation layer 52, a third wiring insulation layer 53, and a fourth wiring insulation layer 54 sequentially laminated on each of the select gate transistor insulation layers 44.

The first to third wiring insulation layers 51 to 53 are composed of silicon oxide ($SiO_2$). The fourth wiring insulation layer 54 is composed of silicon nitride (SiN).

Further, the wiring layer 50 has bit line wiring grooves 56a, which are formed to dig the first wiring insulation layer 51, and the bit line plug holes 56 which are formed to pass through the first wiring insulation layer 51 from under the bit line wiring grooves 56a.

The bit line wiring grooves 56a are formed at the positions where they are aligned with the bit line plug holes 56. The bit line wiring grooves 56a are repeatedly formed in a line state so as to extend in the column direction at predetermined intervals formed in the row direction. The bit line plug holes 56 are formed at the positions where they are aligned with the drain side holes 45a.

Bit line conductive layers 55 are formed in the bit line wiring grooves 56a. The bit line conductive layers 55 correspond to the bit lines $BL_n$ described above. Further, bit line plug layers 57 are formed from the upper surface of the U-shaped semiconductor layer 63 in the drain side holes 45a to the openings of the bit line plug holes 56. The bit line conductive layers 55 are repeatedly formed in a line state so as to extend in the column direction at predetermined intervals formed in the row direction. Further, the bit line plug layers 57 are formed in a columnar shape so as to come into contact with the lower surfaces of the bit line conductive layers 55.

The bit line conductive layers 55 are composed of tantalum (Ta), tantalum nitride (TaN), copper (Cu). The bit line plug layers 57 are composed of titanium (Ti), titanium nitride (TiN), and tungsten (W).

Next, the peripheral region Ph of the non-volatile semiconductor storage device according to the first embodiment will be explained. As shown in FIG. 6, in the peripheral region Ph, a base region 71 is formed on the semiconductor substrate Ba.

Gate insulation layers 81 and gate conductive layers 82 are disposed on the base region 71 of the semiconductor substrate Ba. Further, side wall insulation layers 83 are disposed on the side walls of the gate insulation layers 81 and the gate conductive layers 82. More specifically, transistors are composed of the base region 71, the gate insulation layers 81, and the gate conductive layers 82 in the peripheral region Ph. The transistors are used for a periphery circuit formed in the peripheral region Ph.

Further, the interlayer insulation layers 43 are formed up to the upper surfaces of the drain side conductive layers 41 and the source side conductive layers 42 of the memory transistor region 12 so that the gate insulation layers 81, the gate conductive layers 82, and the side wall insulation layer 83 are filled therewith. Further, the select gate transistor insulation layers 44 are formed on the interlayer insulation layers 43.

Further, in the peripheral region Ph, the first wiring insulation layer 51, the second wiring insulation layer 52, third wiring layers 84, the third wiring insulation layer 53, and the fourth wiring insulation layer 54, which are sequentially laminated, are formed on each of the select gate transistor insulation layers 44.

First plug holes 85a are formed in the peripheral region Ph so as to pass through the select gate transistor insulation layers 44 or the select gate transistor insulation layers 44 and the interlayer insulation layers 43. The first plug holes 85a are formed to reach the drain side conductive layers 41, the source side conductive layers 42, the first to eighth word line conductive layers 32a to 32h, the back gate conductive layers 22, the gate conductive layers 82, and the base region 71.

First wiring grooves 85b, which extend in the column direction so as to dig the select gate transistor insulation layers 44, are formed to the upper portions of the first plug holes 85a. Second plug holes 85c are formed to the upper portions of the first wiring grooves 85b at the position where they are aligned with the first plug holes 85a so as to pass through the first wiring insulation layer 51. Second wiring grooves 85d, which extend in the row direction or in the column direction so as to dig the first wiring insulation layer 51, are formed to the upper portions of the second plug holes 85c. Third plug holes 85e are formed to the upper portions of the second wiring grooves 85d at the positions where they are aligned with the second plug holes 85c so as to pass through the second wiring insulation layer 52.

First plug conductive layers 86a are formed in the first plug holes 85a. First wiring layers 86b are formed in the first wiring grooves 85b. Second plug conductive layers 86c are formed in the second plug holes 85c. Second wiring layers 86d are formed in the second wiring grooves 85d. The third wiring layers 84 are formed in the third plug holes 85e so as to project downward and come into contact with the upper surface of the second wiring layers 86d.

The first plug conductive layers 86a, the first wiring layers 86b, and the second plug conductive layers 86c are composed of titanium (Ti), titanium nitride (TiN), and tungsten (W). The second wiring layers 86d are composed of tantalum (Ta), tantalum nitride (TaN), and copper (Cu). The third wiring layers 84 are composed of titanium (Ti), titanium nitride (TiN), and aluminum-copper (AlCu).

Operation of Non-Volatile Semiconductor Storage Device 100 According to First Embodiment Next, an operation of the non-volatile semiconductor device 100 according to the first embodiment will be explained referring to FIGS. 1 to 4 again. A "read-out operation", a "write operation", and an "erase operation" in the memory transistors $MTr1_{mn}$ to $MTr8_{mn}$ will be explained. Note that the "read-out operation" and the "write operation" will be explained as to an example in which the memory transistor $MTr4_{mn}$ is used as a subject from which and to which data is read out and written. Further, the explanation will be made assuming that the threshold value Vth (neutral threshold value) of the transistor MTr, which is in a state that no charge is accumulated in the charge storage layer EC, is about 0 V.

(Read-Out Operation)

When data is read out from the memory transistor $MTr4_{mn}$, the bit line drive circuit applies a bit line voltage Vbl to the bit line $BL_n$. The source line drive circuit 17 sets the source line $SL_n$ to 0 V. The source side selection gate line drive circuit 14 applies a drive voltage Vdd to the source side selection gate line $SGS_m$. The drain side selection gate line drive circuit 15 applies the drive voltage Vdd to the drain side selection gate line $SGD_m$. The back gate line drive circuit 19 applies a conductive voltage Vj to the back gate line BG. More specifically, the source side select gate transistor $SSTr_{mn}$, the drain side select gate transistor $SSTr_{mn}$, and the back gate transistor $BGTr_{mn}$ are turned ON.

Further, when data is read out, the word line drive circuit 13 sets the word line $WL_m4$, to which a bit ($MTr4_{mn}$) from which data is desired to be read out is connected, to 0 V. In contrast, the word line drive circuit 13 sets the word lines $WL_{mn}$, to which the other bits are connected, to a read-out voltage Vread (for example, 4.5 V). With this operation, whether or not a current flows to the bit line $BL_n$ is determined depending on whether or not the threshold value voltage Vth of the memory transistor $MTr4_{mn}$ from which the data is desired to be read out is set equal to or larger or smaller than 0 V. Therefore, the data information of the memory transistor $MTr4_{mn}$ can be read out by sensing the current of the bit line $BL_n$ by the sense amplifier 16.

(Write Operation)

When data "0" is written to the memory transistor $MTr4_{mn}$, that is, when electrons are injected into the charge storage layer EC of the memory transistor $MTr4_{mn}$ and the threshold value voltage Vth of the memory transistor $MTr4_{mn}$ is increased, the bit line drive circuit sets the bit line BLm to 0 V. The source line drive circuit 17 applies the drive voltage Vdd (for example, 3 V) to the source line $SL_n$. The source side selection gate line drive circuit 14 applies an off voltage Voff (for example, 0 V) to the source side selection gate line $SGS_m$. The drain side selection gate line drive circuit 15 applies the drive voltage Vdd to the drain side selection gate line $SGD_m$. The back gate line drive circuit 19 applies the conductive voltage Vj to the back gate line BG.

Further, when the data "0" is written, the word line drive circuit 13 applies a program voltage Vprog (for example, 18 V) to the word line $WL_m4$ of the bit ($MTr4_{mn}$) to which the data is desired to be written. In contrast, the word line drive circuit 13 applies a pass voltage Vpass (for example, 10 V) to the other word lines $WL_{mn}$. With this operation, since the electric field strength that is applied to the charge storage layer EC of only in the desired bit ($MTr4_{mn}$) is increased and the electrons are injected into the charge storage layer EC, the threshold value voltage Vth of the memory transistor $MTr4_{mn}$ shifts in a positive direction.

When data "1" is written to the memory transistor $MTr4_{mn}$, that is, when the threshold value voltage Vth of the memory transistor $MTr4_m$ is not increased from an erase state (when no electrons are injected into the charge storage layer EC), the bit line drive circuit applies the drive voltage Vdd to the bit line $BL_n$. Note that the other drive circuits execute the same operation as that when the data "0" is written. Application of the drive voltage Vdd to the bit line $BL_n$ makes the gate electric potential of the drain side select gate transistor $SDTr_{mn}$ the same as the source electric potential thereof. With this operation, since the drain side select gate transistor $SDTr_{mn}$ is turned OFF and the electric potential difference between the channel forming region (body portion) of the memory transistor $MTr4_{mn}$ and the word line $WL_m4$ is reduced, electrons are not injected into the charge storage layer EC of the memory transistor $MTr4_{mn}$.

(Erase Operation)

When data is erased, the data of the memory transistors is erased in a block unit composed of a plurality of memory strings MS.

First, the back gate line drive circuit 19 applies the conductive voltage Vj to the back gate line BG. Subsequently, in a selected block (block from which data is desired to be erased), an erase voltage Verase (for example, 20 V) is applied to one end of the source line $SL_n$ and further the source line $SL_n$ is placed in a floating state. Then, the source side selection gate line drive circuit 14 increases the electric potential of the source side select gate transistor $SSTr_{mn}$ (for example, 15 V) at a timing somewhat offset from the timing at which the source line $SL_n$ is placed in the floating state. Likewise, the drain side selection gate line drive circuit 15 increases the electric potential of the drain side select gate transistor SDTr$_{mn}$ (for example, 15 V). With these operations, a GIDL (Gate Induced Drain Leak) current is generated in the vicinity of a gate end of the source side select gate transistor SSTr$_{mn}$, and created holes flow into the columnar portions CL$_{mn}$ acting as body portions of the memory transistors MTr1$_{mn}$ to MTr8$_{mn}$. In contrast, electrons flow in the direction of the source line SL$_n$. With these operations, since an electric potential, which is near to the erase voltage Verase, is transmitted to the channel forming region (body portion) of the memory transistor MTr, when the word drive circuit 13 sets the word lines WL$_m$1 to WL$_m$8 to, for example, 0 V, the electrons of the charge storage layer EC of the memory transistors MTr1$_{mn}$ to MTr8$_{mn}$ are extracted. That is, the data of the memory transistors MTr1$_{mn}$ to MTr8$_{mn}$ is erased.

In contrast, when the data of the memory transistors of the selected block is erased, the word lines WL$_m$1 to WL$_m$8 are placed in the floating state in the non-selected blocks. With this operation, an increase of the electric potential of the channel forming regions (body portions) of the memory transistors MTr1$_{mn}$ to MTr8$_{mn}$ increases the electric potential of the word lines WL$_m$1 to WL$_m$8 by coupling. Accordingly, since an electric potential difference is not caused between the word lines WL$_m$1 to WL$_m$8 and the charge storage layers EC of the memory transistors MTr1 to MTr8$_{mn}$, electrons are not extracted (erased) from the charge storage layers EC.

Method of Manufacturing Non-Volatile Semiconductor Storage Device 100 According to First Embodiment Next, a method of manufacturing the non-volatile semiconductor storage device 100 according to the first embodiment will be explained referring to FIGS. 7 to 46. The drawings denoted by the odd figure numbers in FIGS. 7 to 45 are sectional views showing the memory transistor region 12. The drawings denoted by the odd figure numbers in FIGS. 7 to 45 are sectional views in the row direction and sectional views in the column direction. The drawings denoted by the even numbers in FIGS. 8 to 45 are sectional views in the column direction showing a terminal end and a peripheral region Ph of the memory transistor region 12.

Figure 7:
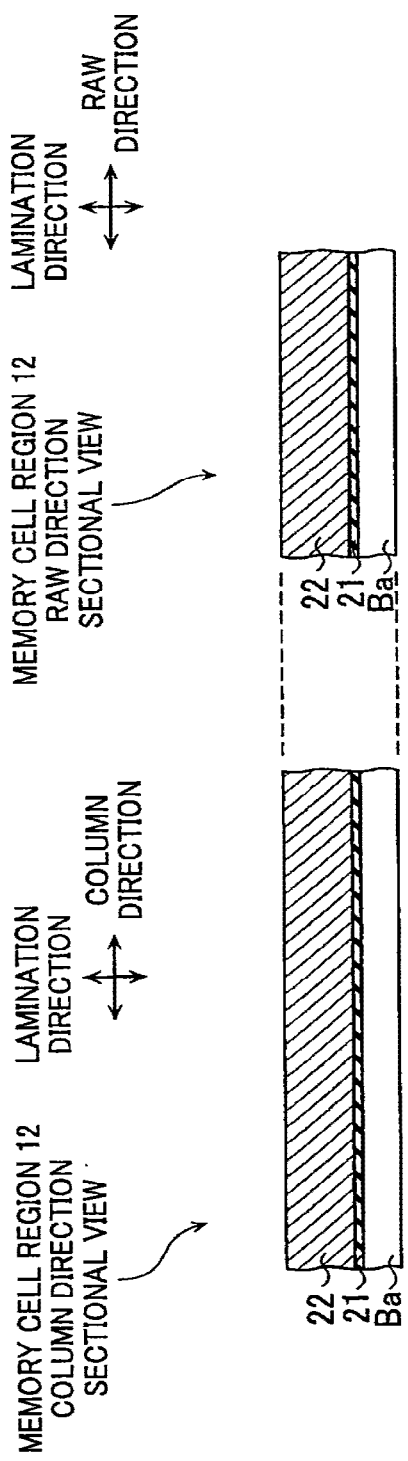
FIG. 7 is a sectional view of the memory transistor region 12 showing a manufacturing process according to the first embodiment.
Figure 8:
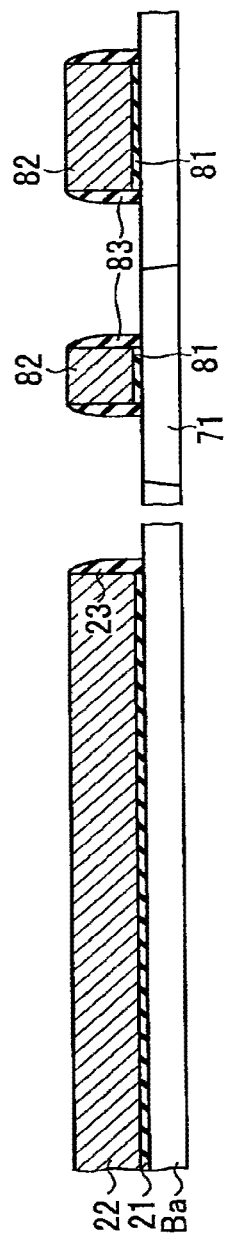
FIG. 8 is a sectional view of the memory transistor region 12 from the terminal end to the peripheral region Ph in the row direction showing a manufacturing process according to the first embodiment.

First, as shown in FIGS. 7 and 8, the semiconductor substrate Ba in which the base region 71 is formed on the front surface of a position acting as the peripheral region Ph, is prepared. Next, after silicon oxide (SiO$_2$) and polysilicon (p-Si) are deposited on the semiconductor substrate Ba, the back gate insulation layer 21, the back gate conductive layer 22, and the side wall insulation layer 23 are formed in the memory transistor region 12 using a lithography method, a RIE (Reactive Ion Etching) method, and an ion implantation method. Further, the gate insulation layer 81, the gate conductive layer 82, and the side wall insulation layer 83 are formed in the peripheral region Ph.

Figure 9:
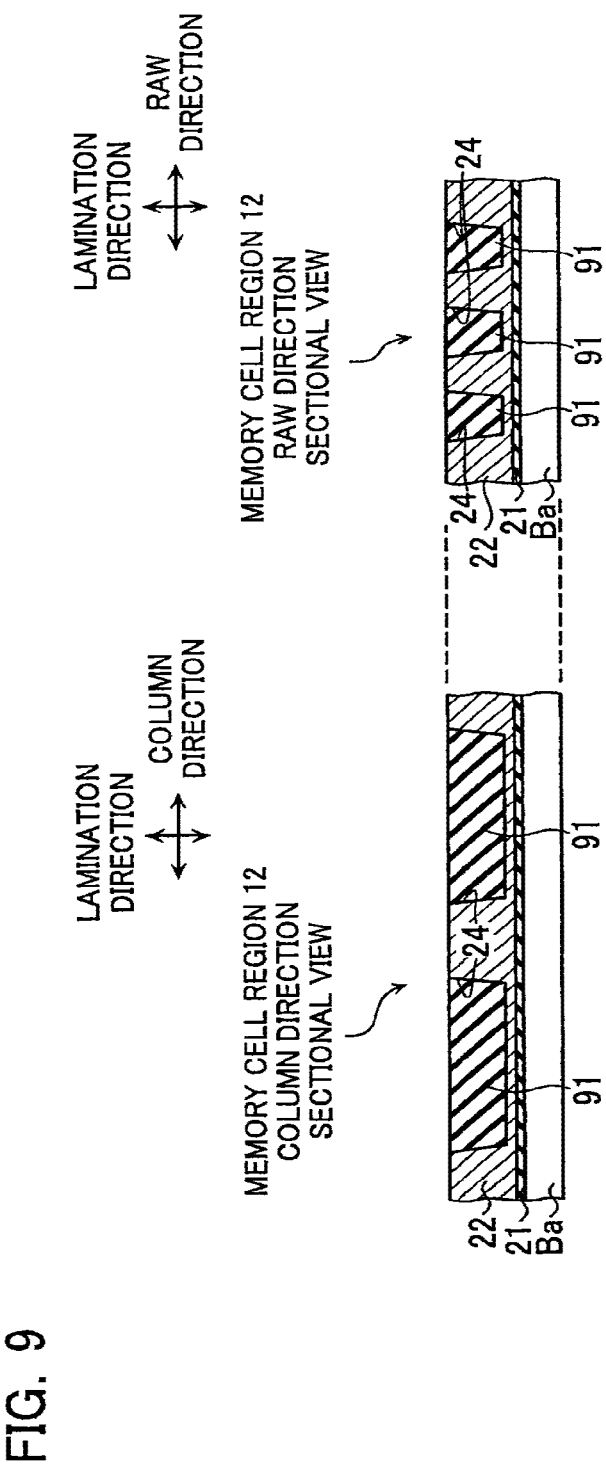
FIG. 9 is a sectional view of the memory transistor region 12 showing a manufacturing process according to the first embodiment.
Figure 10:
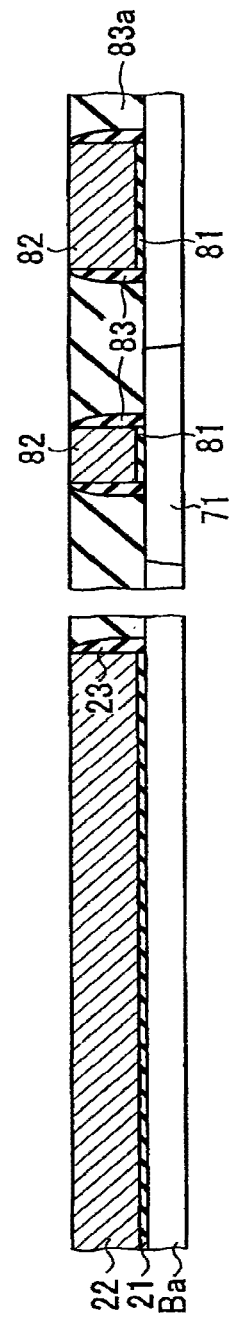
FIG. 10 is a sectional view of the memory transistor region 12 from the terminal end to the peripheral region Ph in the row direction showing a manufacturing process according to the first embodiment.

Next, as shown in FIGS. 9 and 10, in the peripheral region Ph, silicon oxide (SiO$_2$) is deposited from the upper surface of the semiconductor substrate Ba to the upper surface of the gate conductive layer 82 (back gate conductive layer 22), and the interlayer insulation layer 83$a$ is formed. Subsequently, the back gate holes 24 are formed in the memory transistor region 12 by etching the back gate conductive layer 22. Each of the back gate holes 24 is formed to have an island-shaped opening having a long side in the column direction and a short side in the row direction. The back gate holes 24 are formed at predetermined intervals in the row direction and the column direction. Next, silicon nitride (SiN) is deposited so that the back gate holes 24 are filled therewith. Subsequently, the silicon nitride (SiN) of the upper portion of the back gate conductive layer 22 is removed using a chemical mechanical polishing (CMP) method or a RIE method, and first sacrificial layers 91 are formed in the back gate holes 24. Note that although the back gate holes 24 are formed up to such a depth that they do not pass through the back gate conductive layer 22 as shown in FIG. 9, they may be formed to pass through the back gate conductive layer 22.

Figure 11:
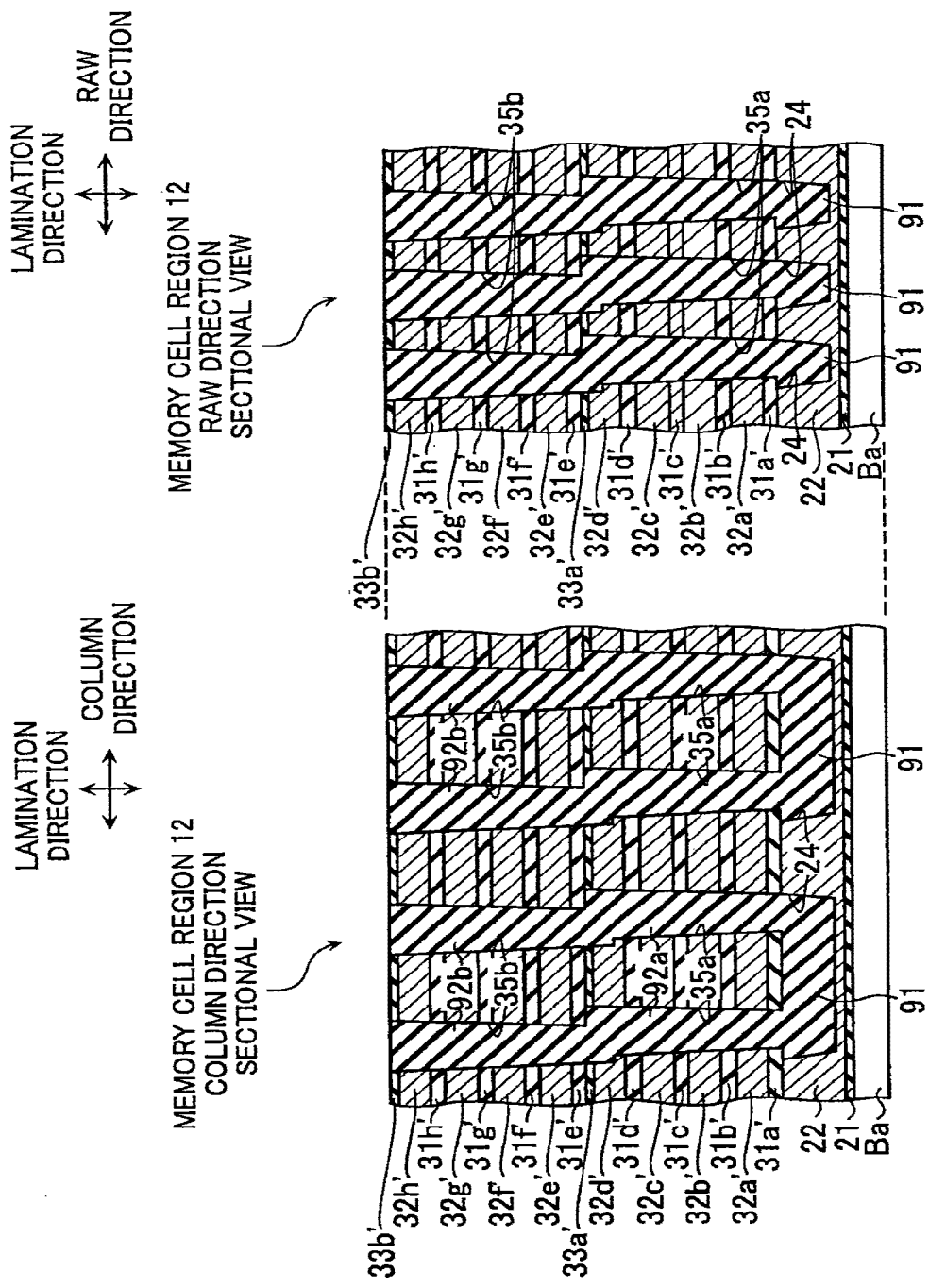
FIG. 11 is a sectional view of the memory transistor region 12 showing a manufacturing process according to the first embodiment.
Figure 12:
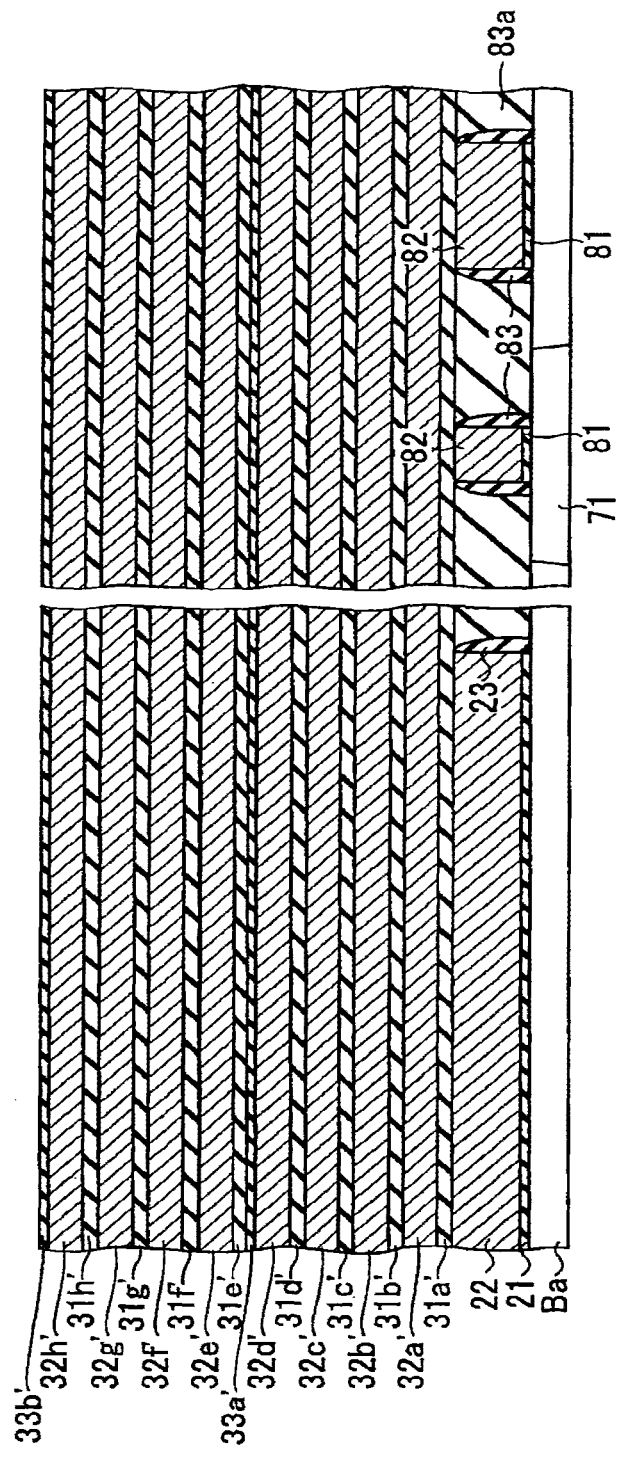
FIG. 12 is a sectional view of the memory transistor region 12 from the terminal end to the peripheral region Ph in the row direction showing a manufacturing process according to the first embodiment.

Next, as shown in FIGS. 11 and 12, silicon oxide (SiO$_2$) and polysilicon (p-Si) are alternately laminated on the back gate conductive layer 22, the sacrificial layers 91, the gate conductive layer 82, and the interlayer insulation layer 83$a$, and first to fourth sheet-shaped inter-word-line insulation layers 31$a'$ to 31$d'$, first to fourth sheet-shaped polysilicon conductive layers 32$a'$ to 32$d'$, and a first sheet-shaped separation/insulation layer 33$a'$ are formed. The first to fourth sheet-shaped inter-word-line insulation layers 31$a'$ to 31$d'$, the first to fourth sheet-shaped polysilicon conductive layers 32$a'$ to 32$d'$, and the first sheet-shaped separation/insulation layer 33$a'$ are formed to two-dimensionally expand in directions orthogonal to the lamination direction (row direction and column direction).

Subsequently, the first memory holes 35$a$ are formed to pass through the first to fourth sheet-shaped inter-word-line insulation layers 31$a'$ to 31$d'$, the first to fourth sheet-shaped polysilicon layers 32$a'$ to 32$d'$, and the first sheet-shaped separation/insulation layer 33$a'$. Further, the first memory holes 35$a$ are formed at the positions where they are aligned with the vicinities of both the ends in the column direction of the back gate holes 24. Silicon nitride (SiN) is deposited in the first memory holes 35$a$, and second sacrificial layers 92$a$ are formed.

Subsequently, silicon oxide (SiO$_2$) and polysilicon (p-Si) are alternately laminated on the first sheet-shaped separation/insulation layer 33'$a$, and fifth to eighth sheet-shaped inter-word-line insulation layers 31$e'$ to 31$h'$, fifth to eighth sheet-shaped polysilicon layers 32$e'$ to 32$h'$, and second sheet-shaped separation/insulation layer 33$b'$ are formed. The fifth to eighth sheet-shaped inter-word-line insulation layers 31$e'$ to 31$h'$, the fifth to eighth sheet-shaped polysilicon layers 32$e'$ to 32$h'$, and the second sheet-shaped separation/insulation layer 33$b'$ are formed to two-dimensionally expand in directions orthogonal to the lamination direction (row direction and column direction).

Subsequently, the second memory holes 35$b$ are formed such that they pass through the second sheet-shaped separation/insulation layer 33$b'$, the fifth to eighth sheet-shaped inter-word-line insulation layers 31$e'$ to 31$h'$, the fifth to eighth sheet-shaped polysilicon layers 32$e'$ to 32$h'$, and the first sheet-shaped separation/insulation layer 33$a'$ and etch the fourth sheet-shaped word line polysilicon layer 32$d'$. Further, the second memory holes 35$b$ are formed at the positions where they are aligned with the first memory holes 35$a$. Silicon nitride (SiN) is deposited in the second memory holes 35$b$, and the third sacrificial layers 92$b$ are formed.

Figure 13:
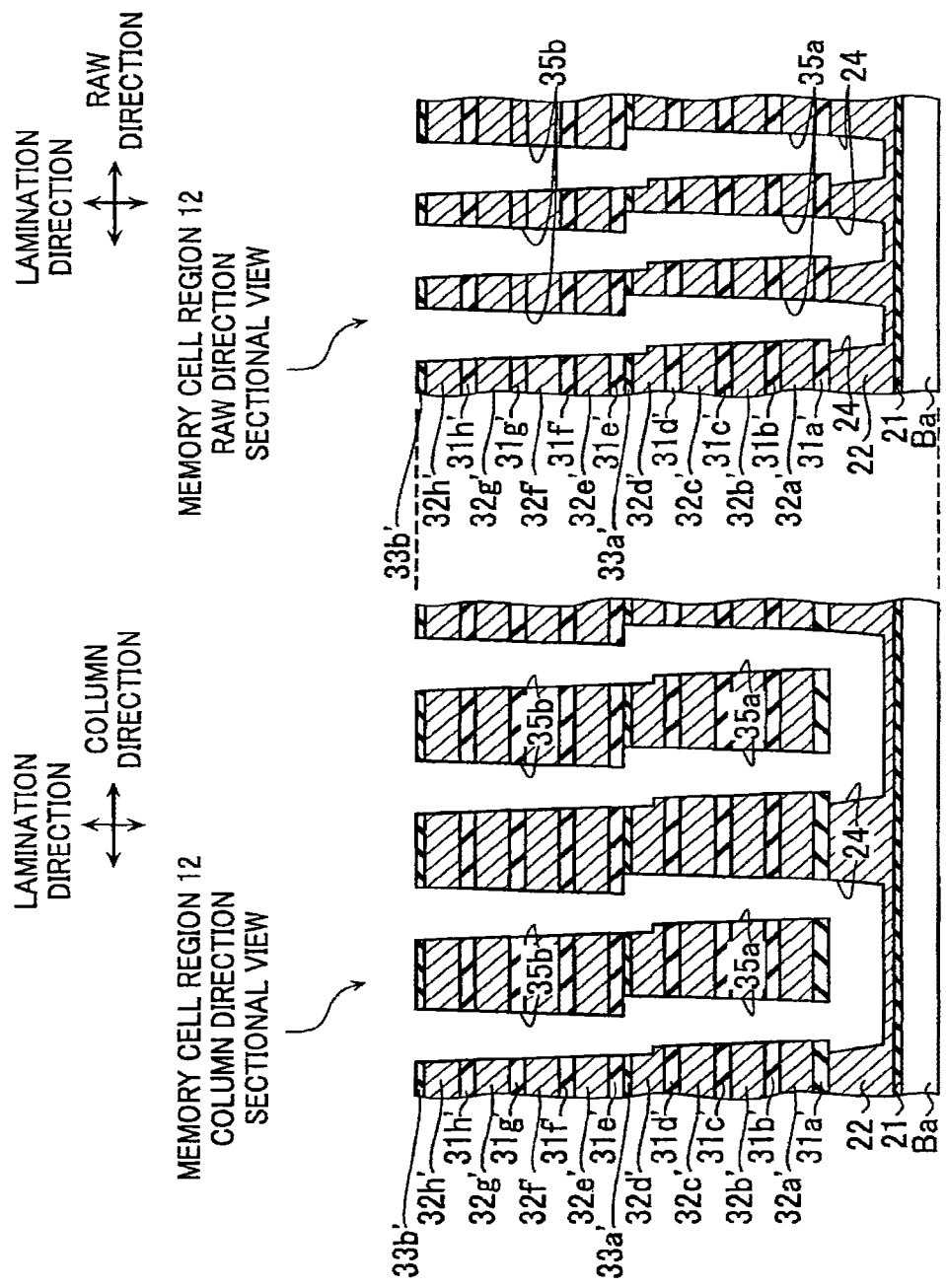
FIG. 13 is a sectional view of the memory transistor region 12 showing a manufacturing process according to the first embodiment.
Figure 14:
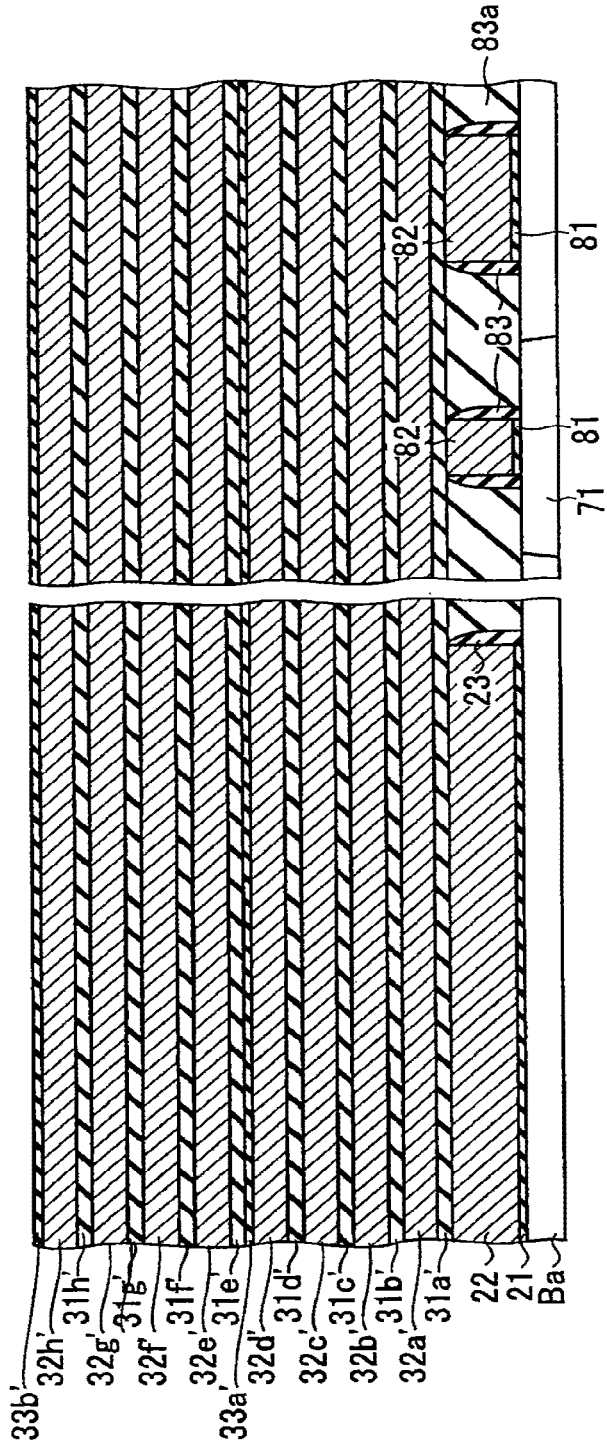
FIG. 14 is a sectional view of the memory transistor region 12 from the terminal end to the peripheral region Ph in the row direction showing a manufacturing process according to the first embodiment.

Next, as shown in FIGS. 13 and 14, the first sacrificial layers 91, the second sacrificial layers 92$a$, and the third sacrificial layers 92$b$ are removed. The first sacrificial layers 91, the second sacrificial layers 92$a$, and the third sacrificial layer 92$b$ are removed in, for example, a heated phosphoric acid solution. The first memory holes 35$a$, the second memory holes 35$b$, and the back gate holes 24 are formed again through the processes shown in FIGS. 13 and 14. The first memory holes 35$a$, the second memory holes 35$b$, and the back gate holes 24 communicate with each other and are formed in a U-shape when viewed from the row direction. Subsequently, the front surface of the exposed back gate conductive layer 22 and the front surfaces of exposed first to eighth sheet-shaped polysilicon layer 32a' to 32h' are rinsed by a diluted fluorinated acid process to thereby remove natural oxide films.

Figure 15:
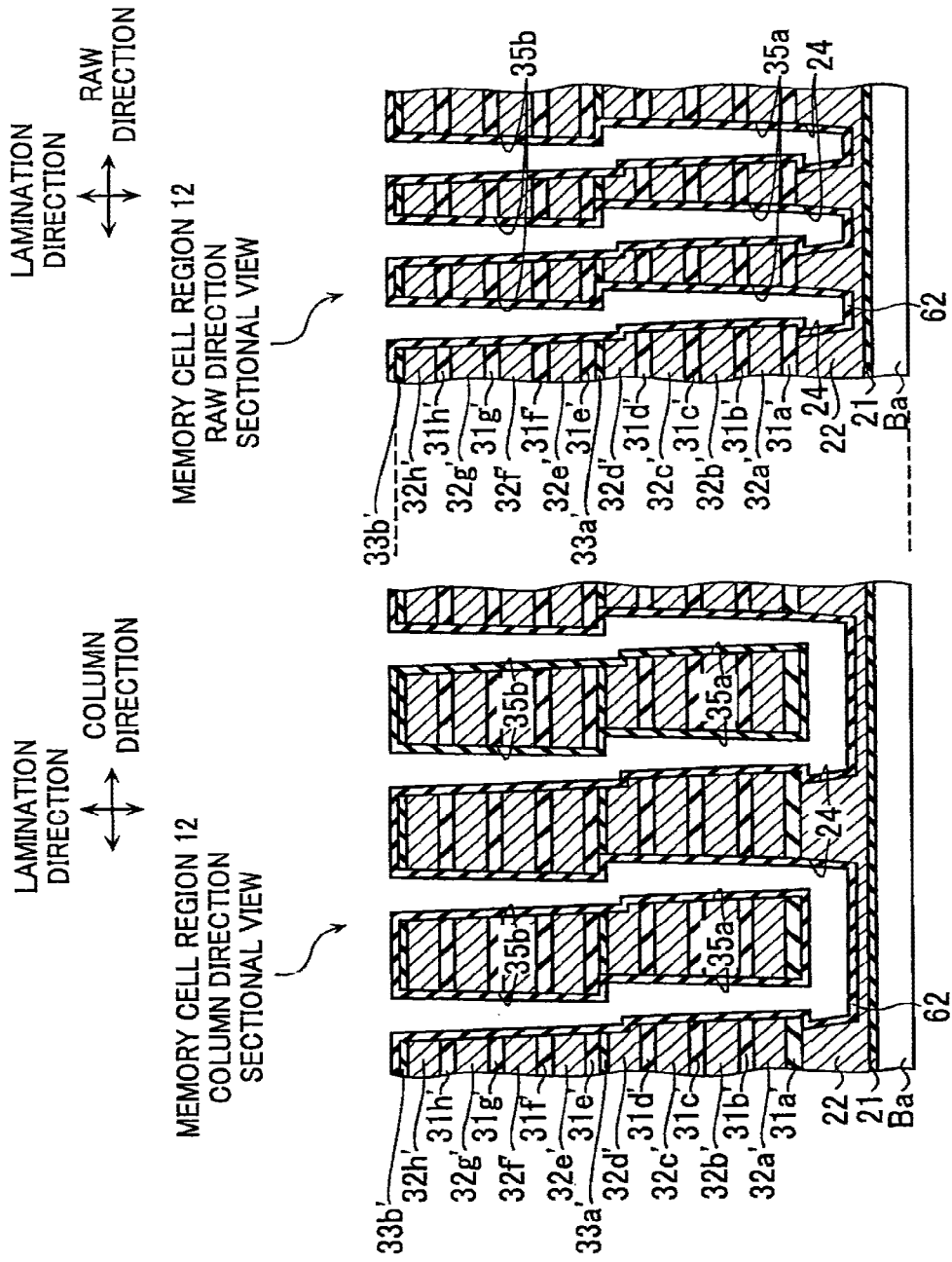
FIG. 15 is a sectional view of the memory transistor region 12 showing a manufacturing process according to the first embodiment.
Figure 16:
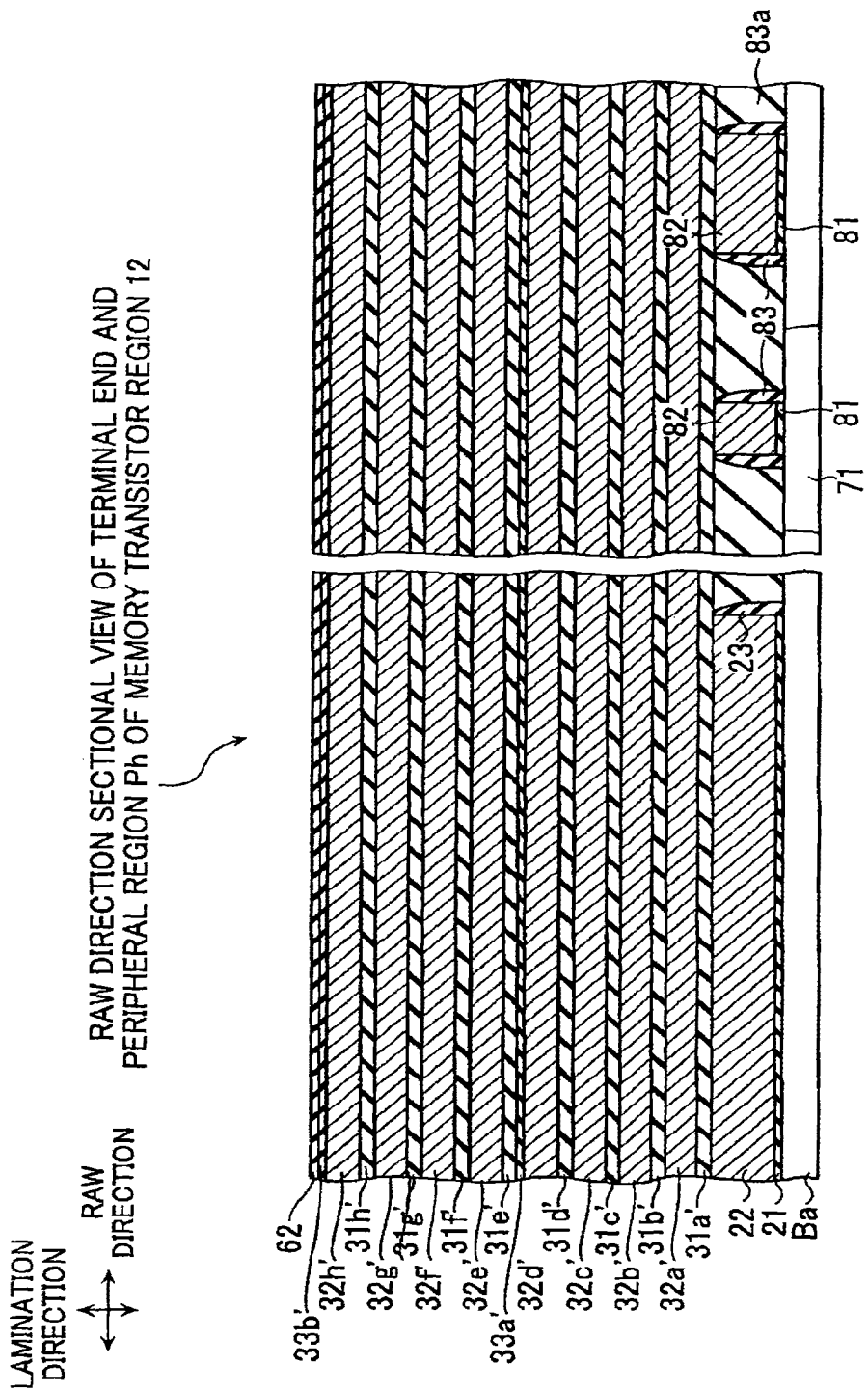
FIG. 16 is a sectional view of the memory transistor region 12 from the terminal end to the peripheral region Ph in the row direction showing a manufacturing process according to the first embodiment.

Subsequently, as shown in FIGS. 15 and 16, the memory gate insulation layers 62 are formed so as to cover the side walls, which face the back gate holes 24, the first memory holes 35a, and the second memory holes 35b, and to cover the second sheet-shaped separation/insulation layer 33b'. Specifically, silicon oxide ($SiO_2$), silicon nitride (SiN), and silicon oxide ($SiO_2$) are deposited, and the memory gate insulation layers 62 are formed.

Figure 17:
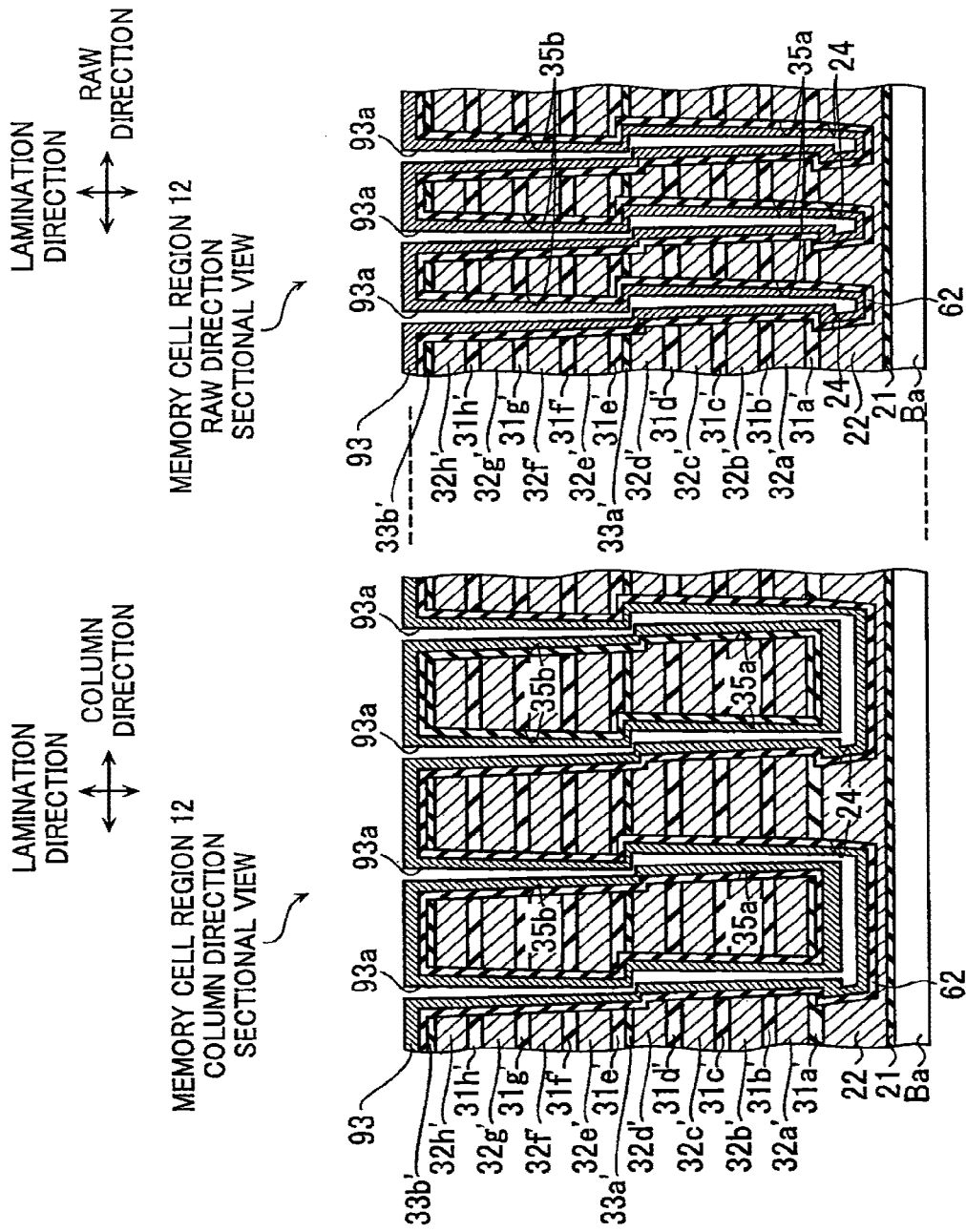
FIG. 17 is a sectional view of the memory transistor region 12 showing a manufacturing process according to the first embodiment.
Figure 18:
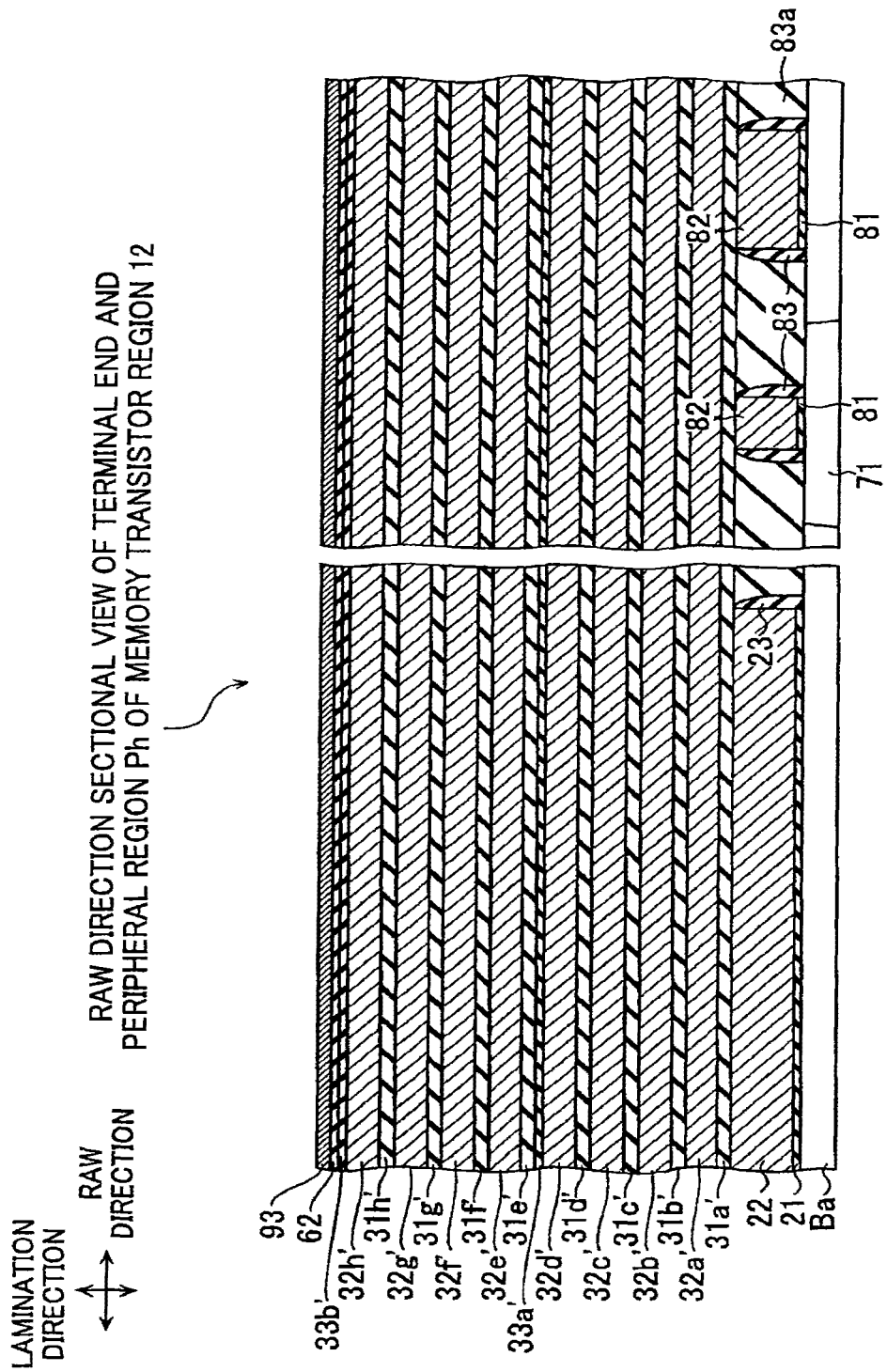
FIG. 18 is a sectional view of the memory transistor region 12 from the terminal end to the peripheral region Ph in the row direction showing a manufacturing process according to the first embodiment.

Next, as shown in FIGS. 17 and 18, amorphous silicon (a-Si) is deposited on the memory gate insulation layers 62, and an amorphous silicon layer 93 is formed. The amorphous silicon layer 93 is formed to have hollow portions 93a. In other words, the amorphous silicon layer 93 is formed so that the back gate holes 24, the first memory holes 35a, and the second memory holes 35b are not completely filled therewith.

Figure 19:
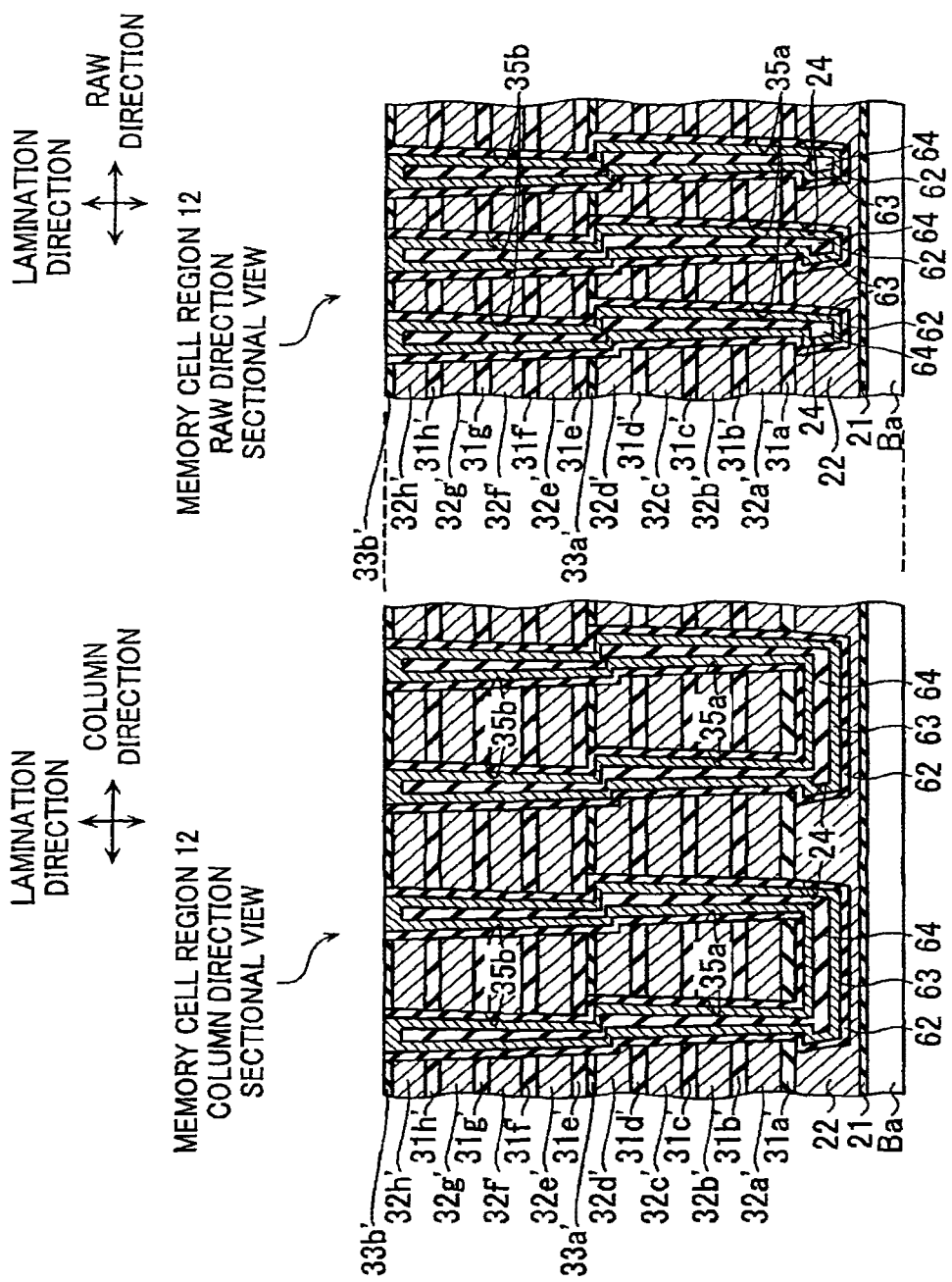
FIG. 19 is a sectional view of the memory transistor region 12 showing a manufacturing process according to the first embodiment.
Figure 20:
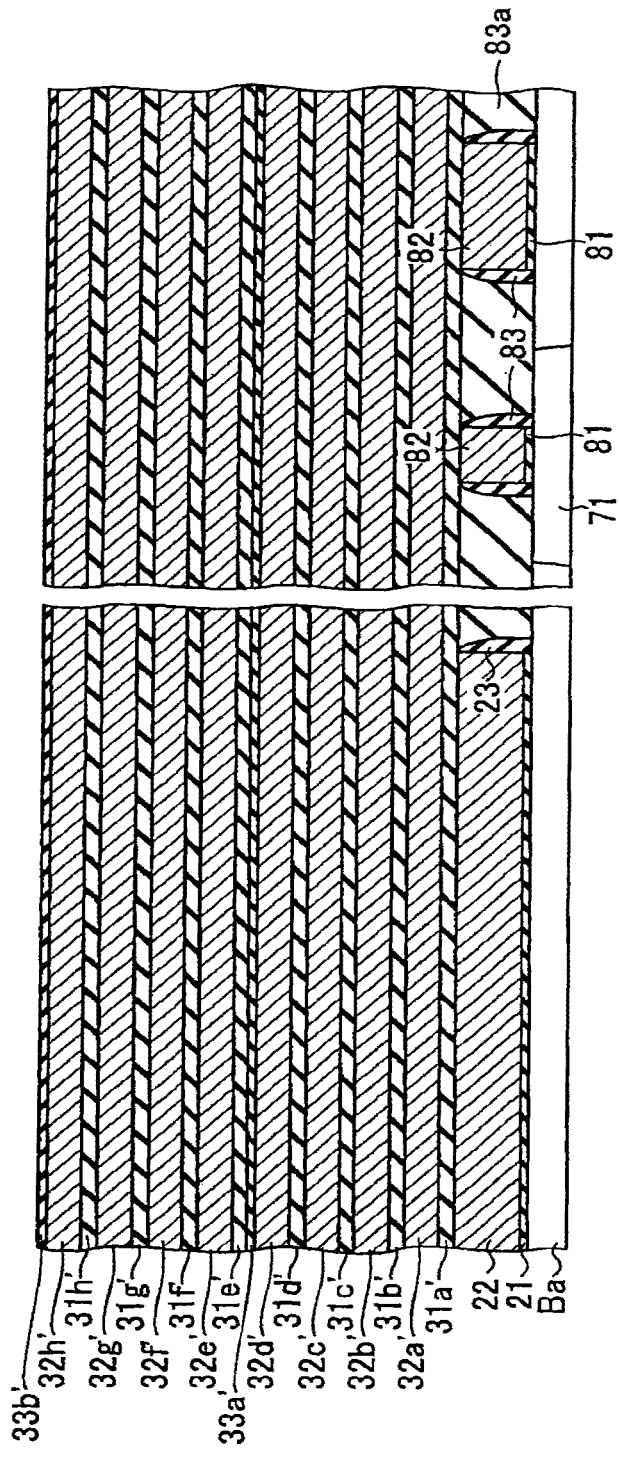
FIG. 20 is a sectional view of the memory transistor region 12 from the terminal end to the peripheral region Ph in the row direction showing a manufacturing process according to the first embodiment.

Subsequently, as shown in FIGS. 19 and 20, the side walls of the amorphous silicon layer 93 facing the hollow portions 93a are thermally oxidized, and silicon oxide ($SiO_2$) is formed. Further, the remaining amorphous silicon layer 93 is crystallized, polysilicon (p-Si) is formed, and the U-shaped semiconductor layer 63 is formed. Silicon oxide ($SiO_2$) is further deposited on the silicon oxide ($SiO_2$) formed in the hollow portions 93a of the U-shaped semiconductor layer 63a using a CVD (Chemical Vapor Deposition) method, and the internal dielectric layers 64 are formed so that hollow portions 93a are filled therewith. Further, the memory gate insulation layers 62, the U-shaped semiconductor layer 63, and the internal dielectric layers 64 deposited on the second sheet-shaped separation/insulation layer 33b' are removed by a CMP process.

Figure 21:
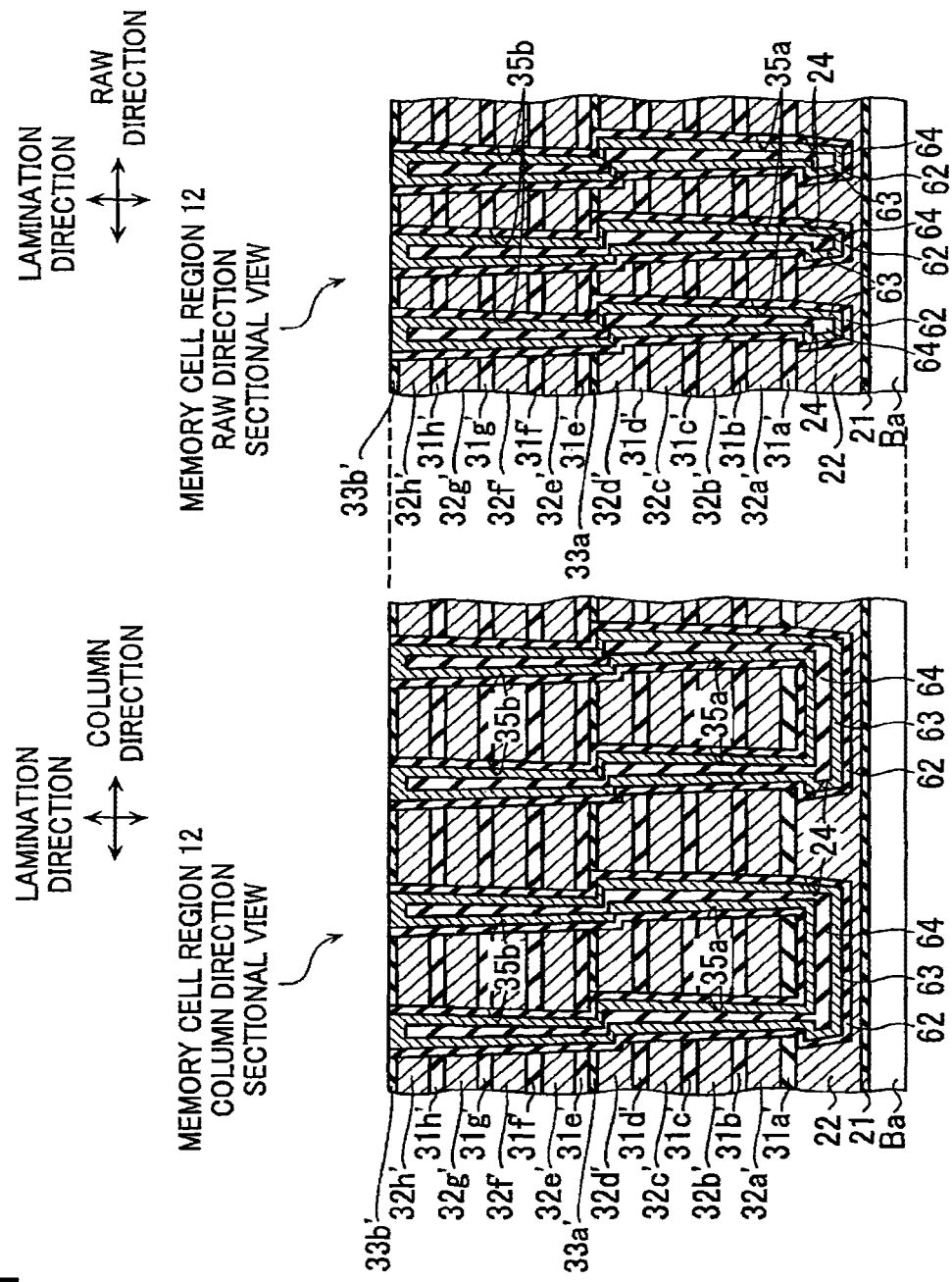
FIG. 21 is a sectional view of the memory transistor region 12 showing a manufacturing process according to the first embodiment.
Figure 22:
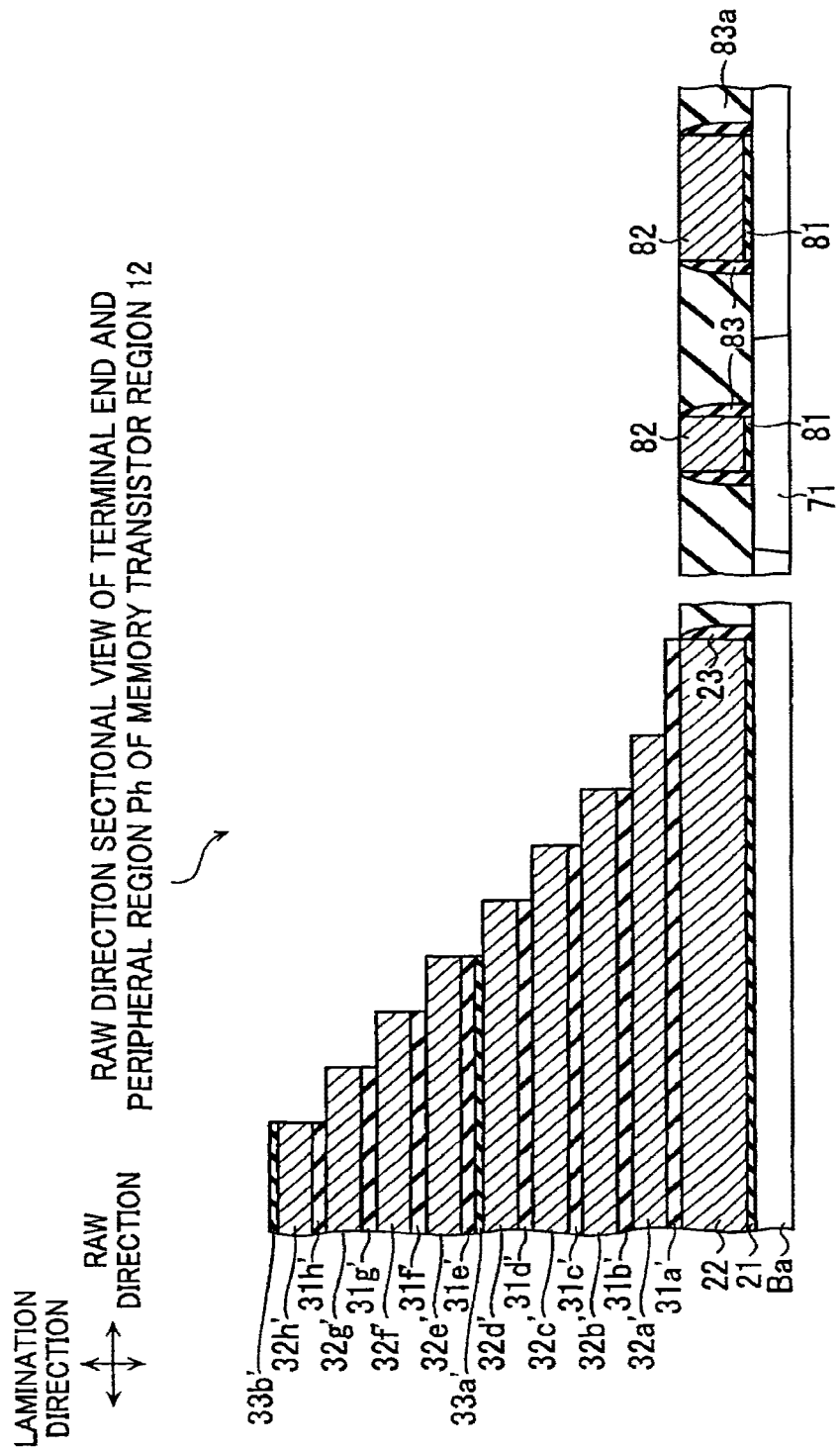
FIG. 22 is a sectional view of the memory transistor region 12 from the terminal end to the peripheral region Ph in the row direction showing a manufacturing process according to the first embodiment.

Next, as shown in FIGS. 21 and 22, the ends of the first to eighth sheet-shaped inter-word-line insulation layers 31a' to 31h', the first to eighth sheet-shaped polysilicon layers 32a' to 32h', and the first and second sheet-shaped separation/insulation layers 32a', 32b' on the peripheral region Ph side are processed stepwise. This process is executed by repeating, for example, slimming and RIE (or lithography) of a resist film.

Figure 23:
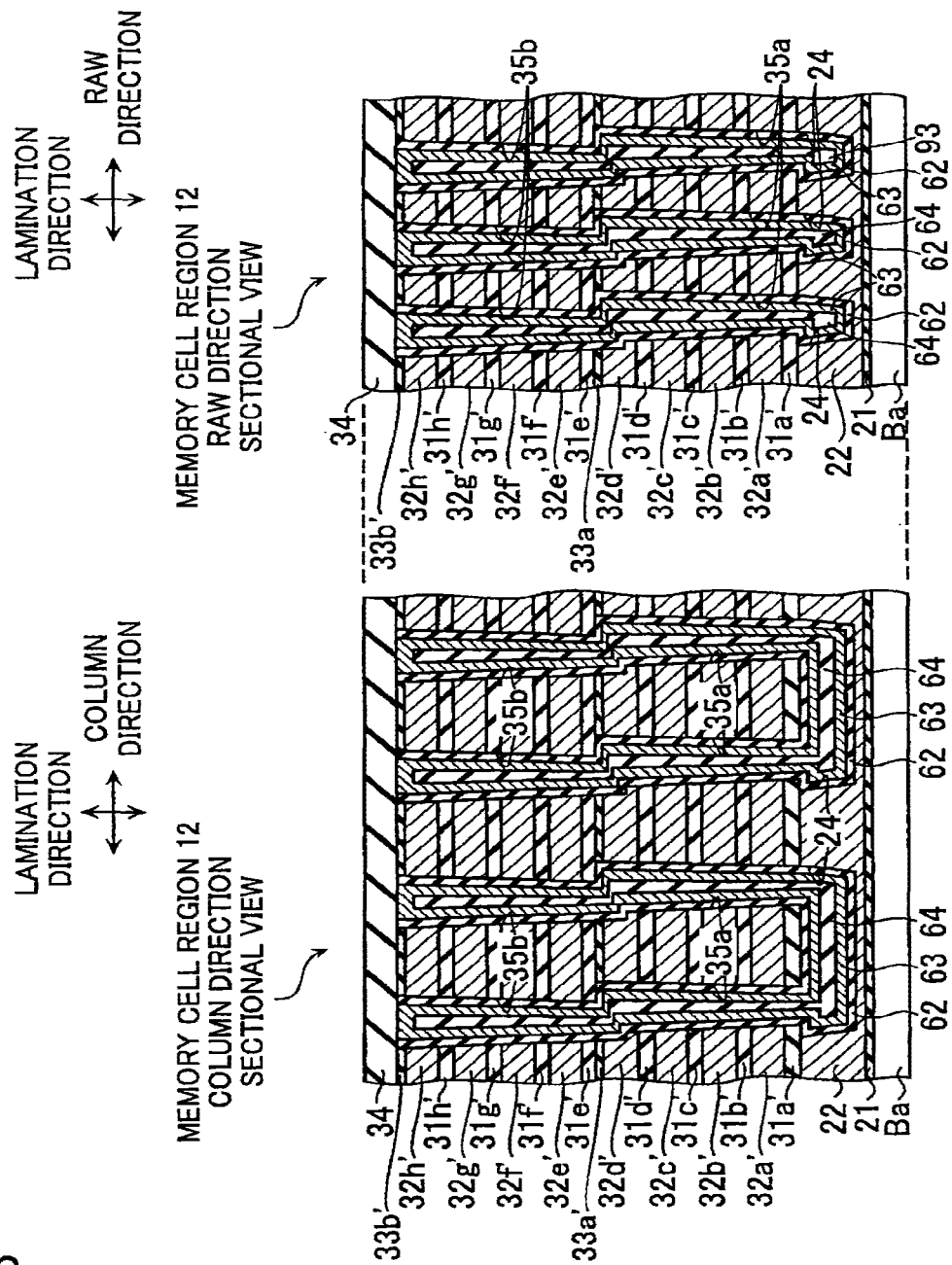
FIG. 23 is a sectional view of the memory transistor region 12 showing a manufacturing process according to the first embodiment.
Figure 24:
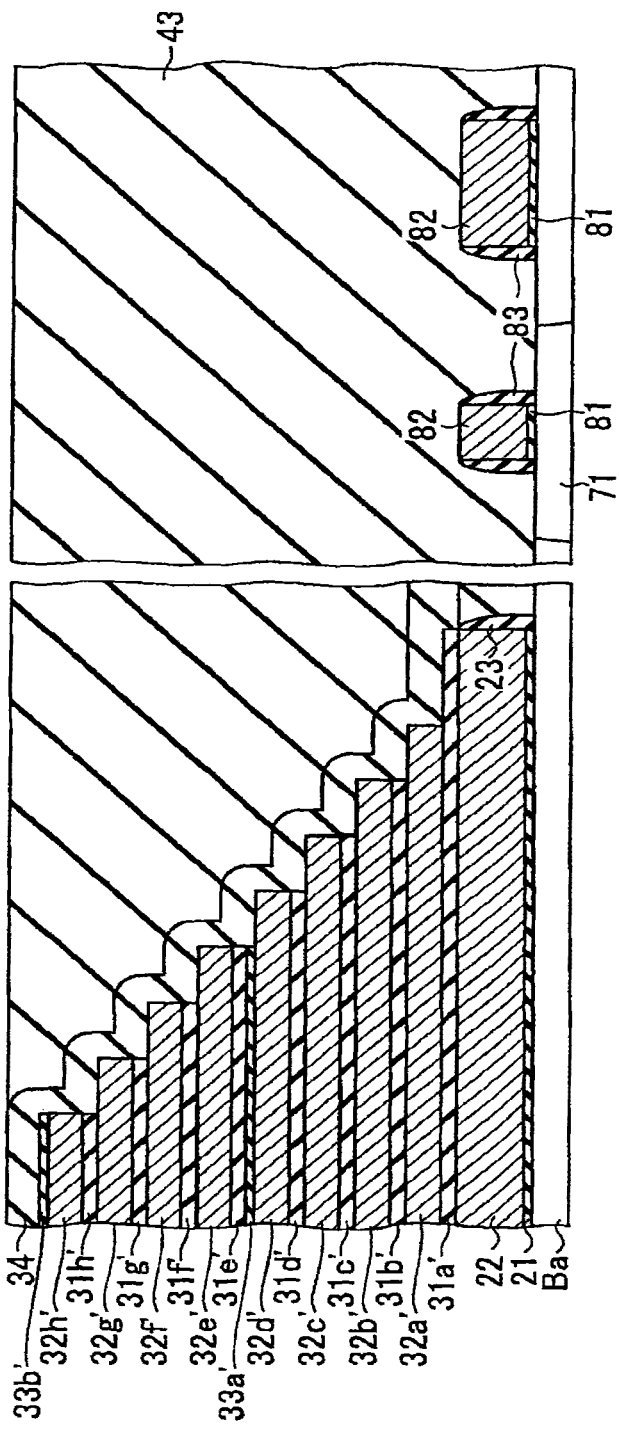
FIG. 24 is a sectional view of the memory transistor region 12 from the terminal end to the peripheral region Ph in the row direction showing a manufacturing process according to the first embodiment.

Subsequently, as shown in FIGS. 23 and 24, silicon nitride (SiN) is deposited to cover the second sheet-shaped separation/insulation layer 33b' and the ends processed stepwise in the memory transistor region 12, and the memory protection/insulation layers 34 are formed. Next, silicon oxide ($SiO_2$) is deposited up to the uppermost surface of the memory protection/insulation layers 34 in the memory transistor region 12 and the peripheral region Ph, and the interlayer insulation layers 43 are formed.

Figure 25:
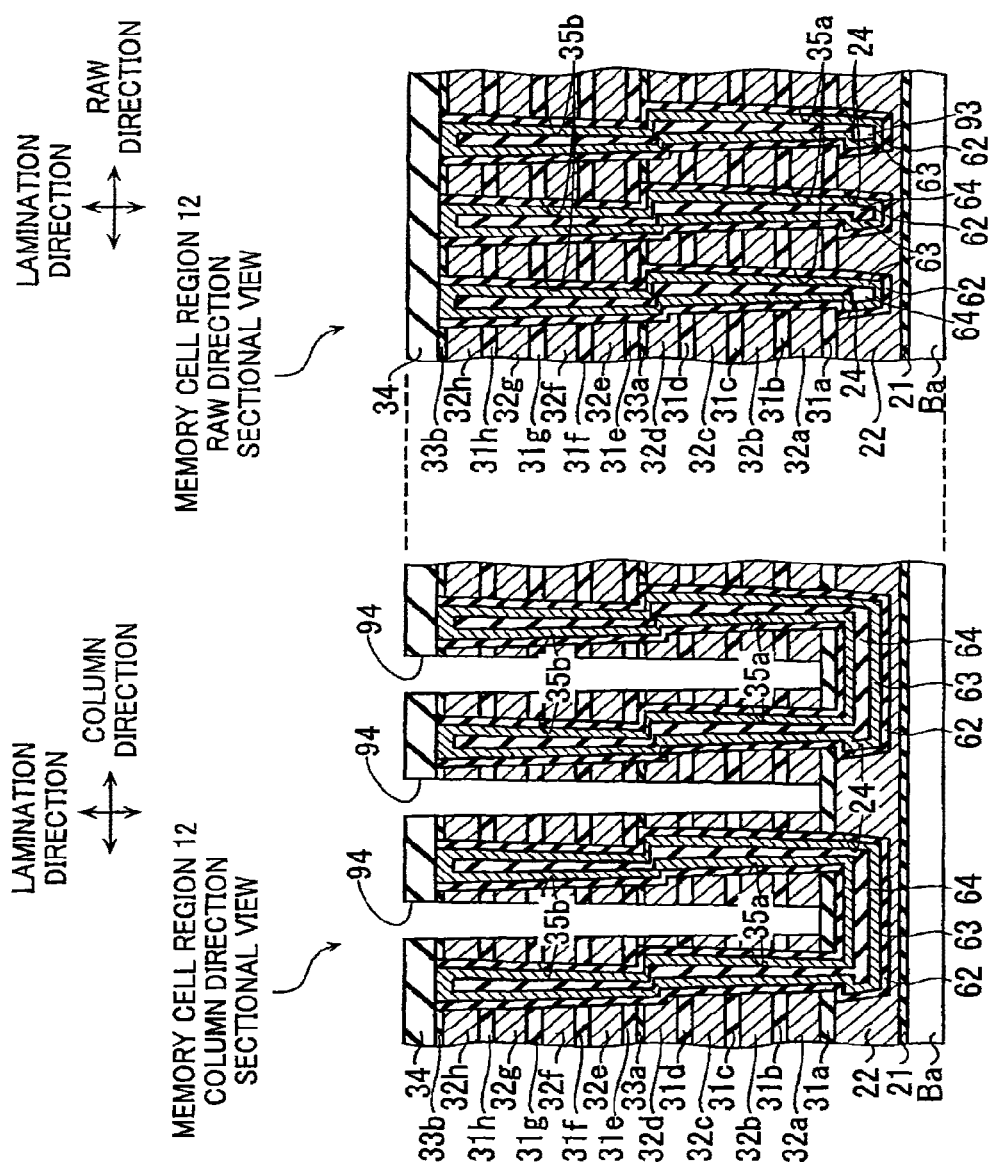
FIG. 25 is a sectional view of the memory transistor region 12 showing a manufacturing process according to the first embodiment.
Figure 26:
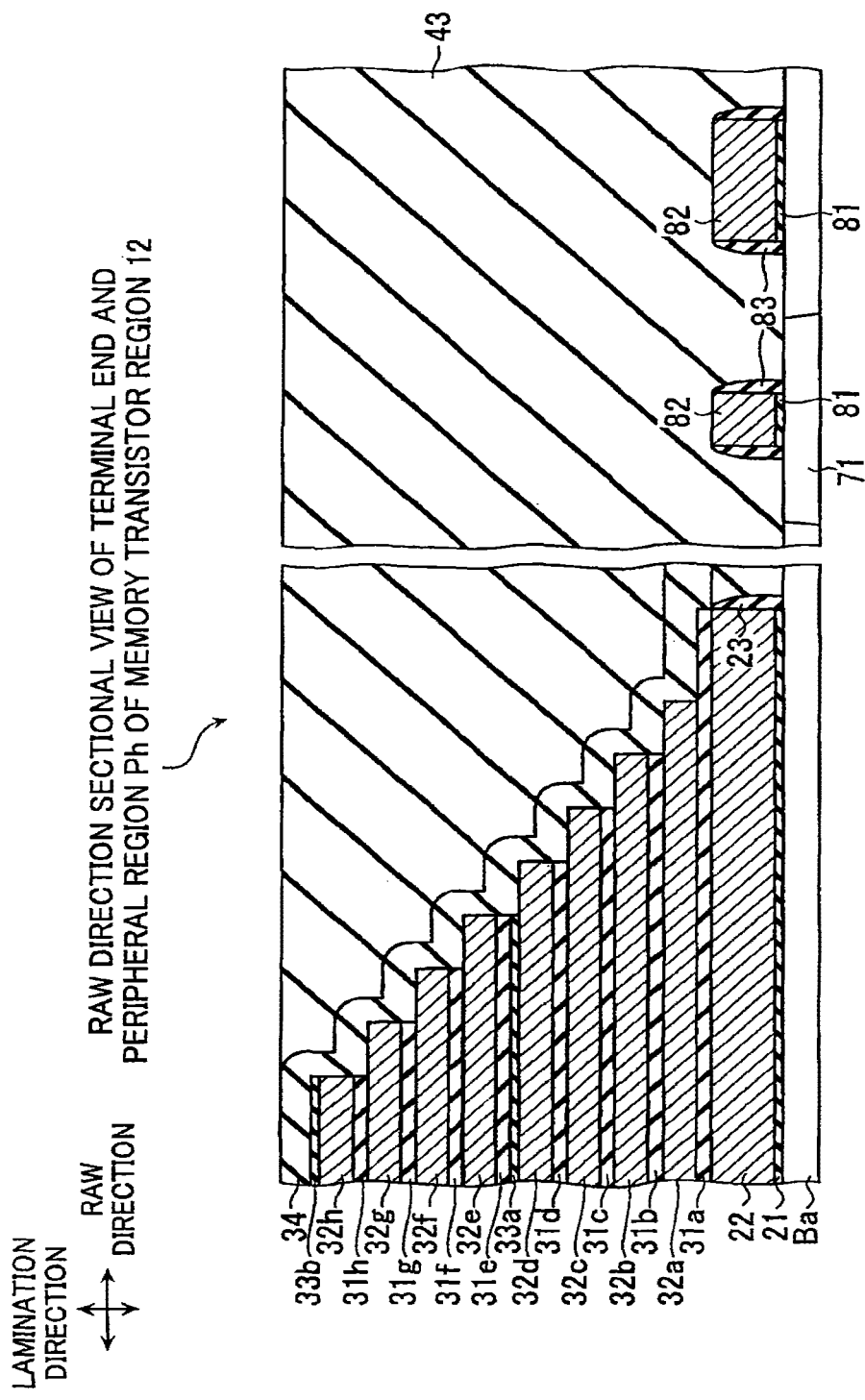
FIG. 26 is a sectional view of the memory transistor region 12 from the terminal end to the peripheral region Ph in the row direction showing a manufacturing process according to the first embodiment.

Next, as shown in FIGS. 25 and 26, memory separation grooves 94 are repeatedly formed in a line state so as to extend in the row direction at predetermined intervals formed in the column direction in the memory transistor region 12. The memory separation grooves 94 are formed to position between the first memory holes 35a and the second memory holes 35b in the column direction. The memory separation grooves 94 are formed to pass through the memory protection/insulation layers 34', the first to eighth sheet-shaped inter-word-line insulation layers 31a' to 31h', the first to eighth sheet-shaped polysilicon layers 32a' to 32h', and the first and second separation/insulation layers 33a', 33b'.

The first to eighth sheet-shaped inter-word-line insulation layers 31a' to 31h' are made to the first to eighth inter-word-line insulation layers 31a to 31h, which have a shape extending in parallel with each other in the row direction and are repeatedly formed in the line-state at the first intervals formed in the column direction by the processes of forming the memory separation grooves 94 shown in FIGS. 25 and 26. Further, the first to eighth sheet-shaped polysilicon layers 32a' to 32h' are made to the first to eighth word line conductive layers 32a to 32h which have a shape extending in parallel with each other in the row direction and repeatedly formed in the line-state at the first intervals formed in the column direction. Further, the first and second sheet-shaped separation/insulation layer 33a' and 33b' are made to the first and second separation/insulation layer 33a and 33b which have a shape extending in parallel with each other in the row direction and repeatedly formed in the line-state at the first intervals formed in the column direction.

Figure 27:
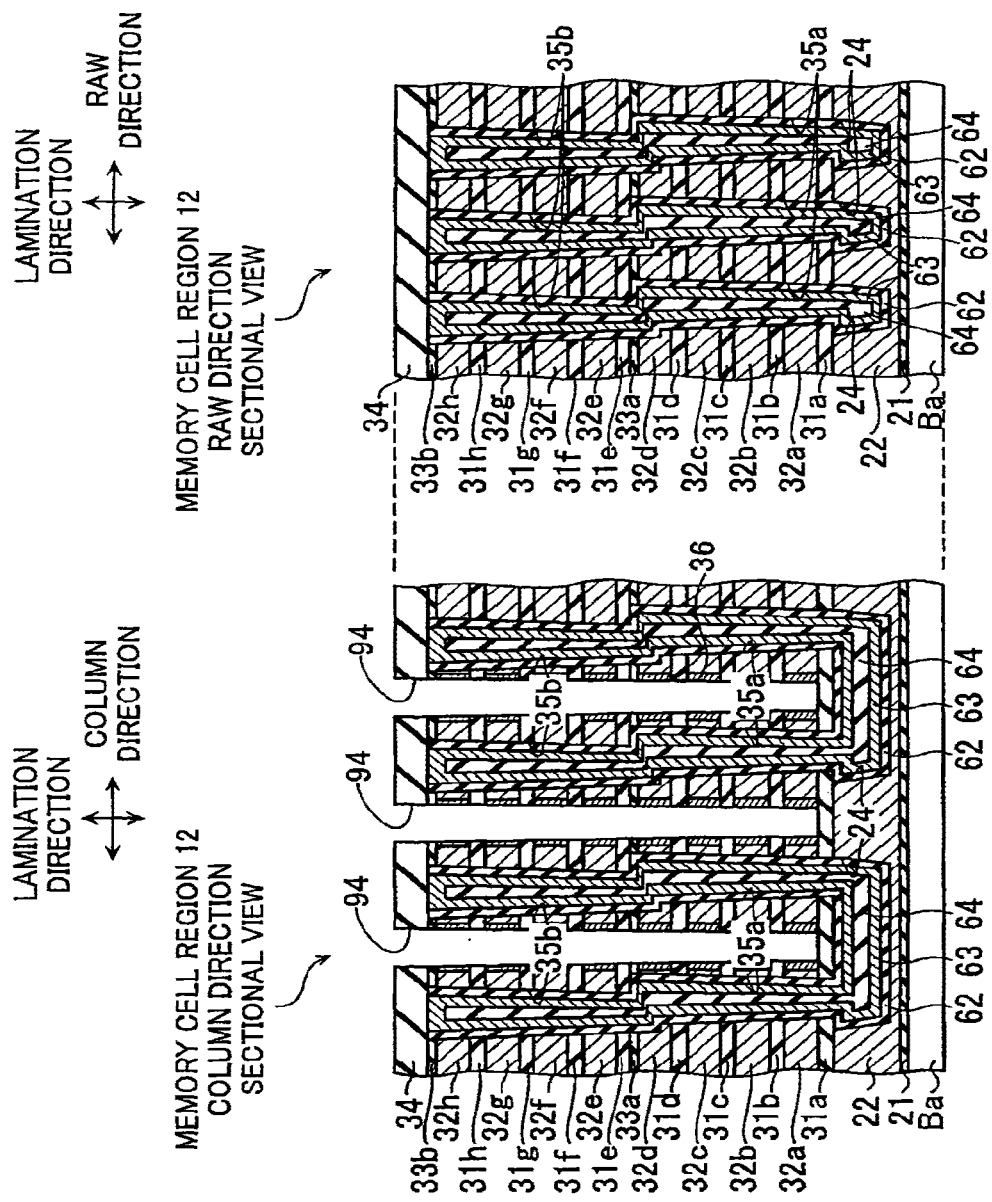
FIG. 27 is a sectional view of the memory transistor region 12 showing a manufacturing process according to the first embodiment.
Figure 28:
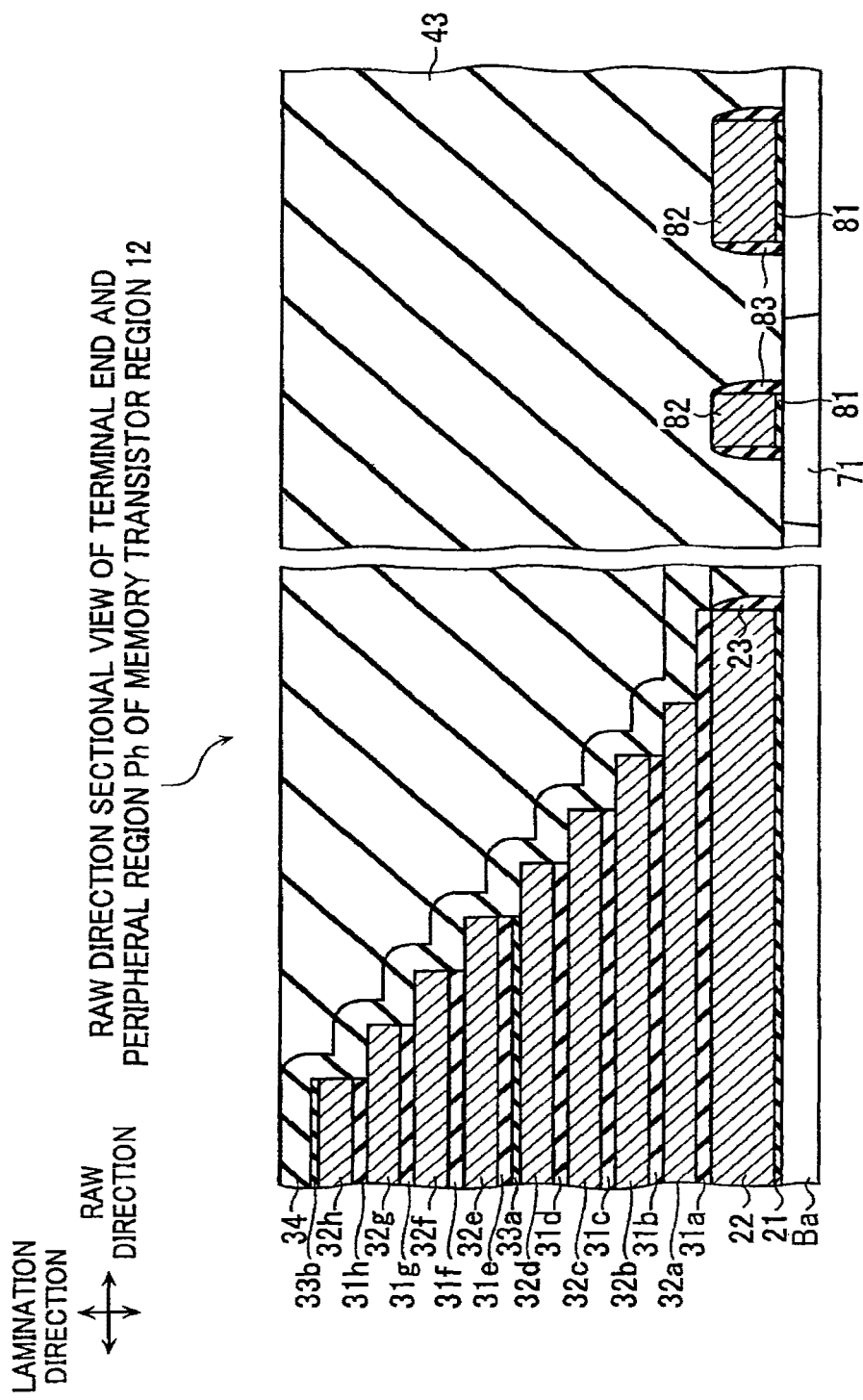
FIG. 28 is a sectional view of the memory transistor region 12 from the terminal end to the peripheral region Ph in the row direction showing a manufacturing process according to the first embodiment.

Subsequently, as shown in FIGS. 27 and 28, cobalt (Co) films are deposited on the side surfaces of the memory separation grooves 94 by CVD. Thereafter, a RTA (Rapid Thermal Annealing) process is further executed so that cobalt films react with polysilicon (p-Si) that constitutes the first to eighth word line conductive layers 32a to 32h in a self-alignment manner, and the silicide films 36 are formed on the front surfaces of the first to eighth word line conductive layers 32a to 32h. Note that unreacted cobalt films are removed in a sulfuric acid-hydrogen peroxide water mixed solution.

Figure 29:
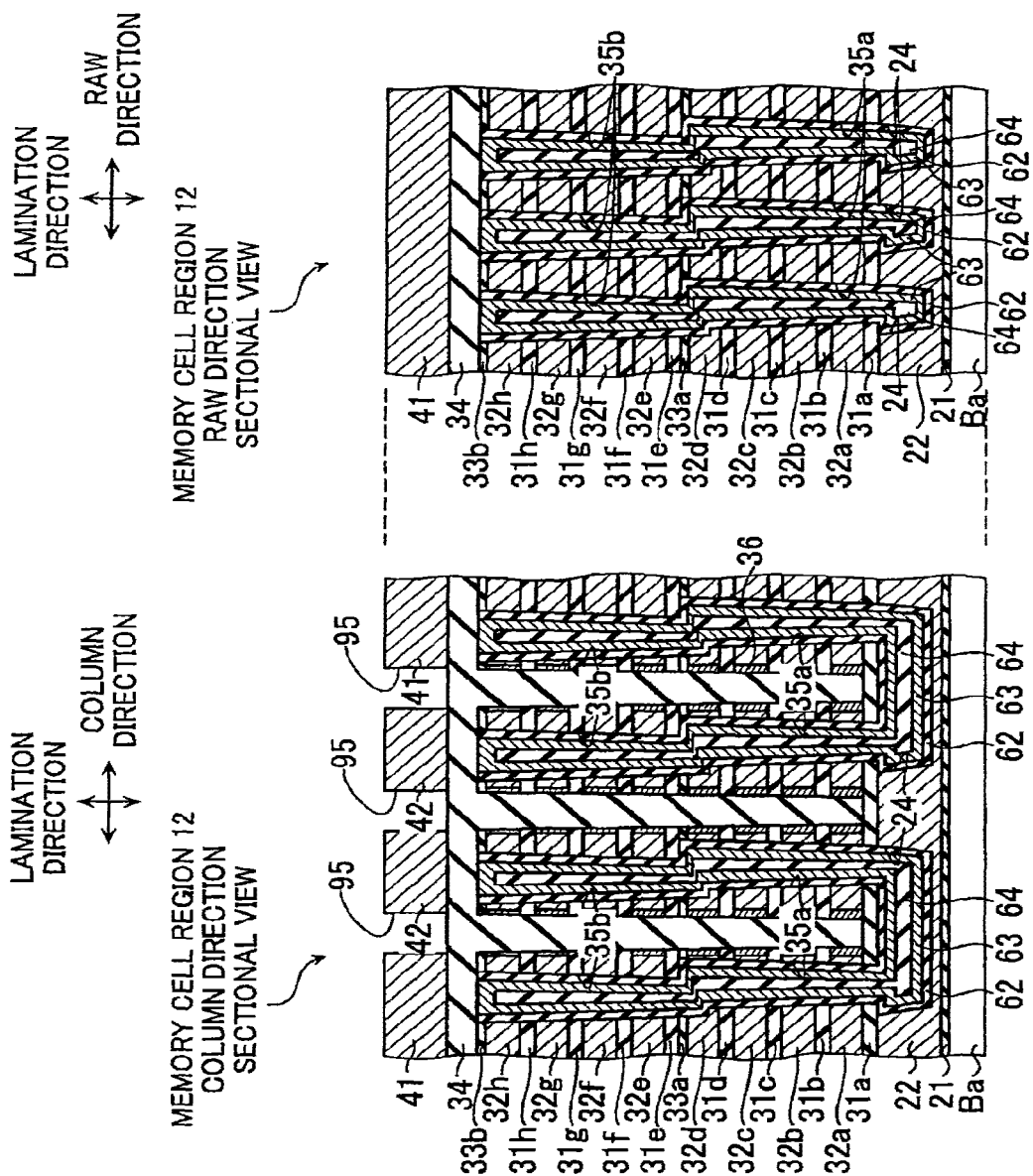
FIG. 29 is a sectional view of the memory transistor region 12 showing a manufacturing process according to the first embodiment.
Figure 30:
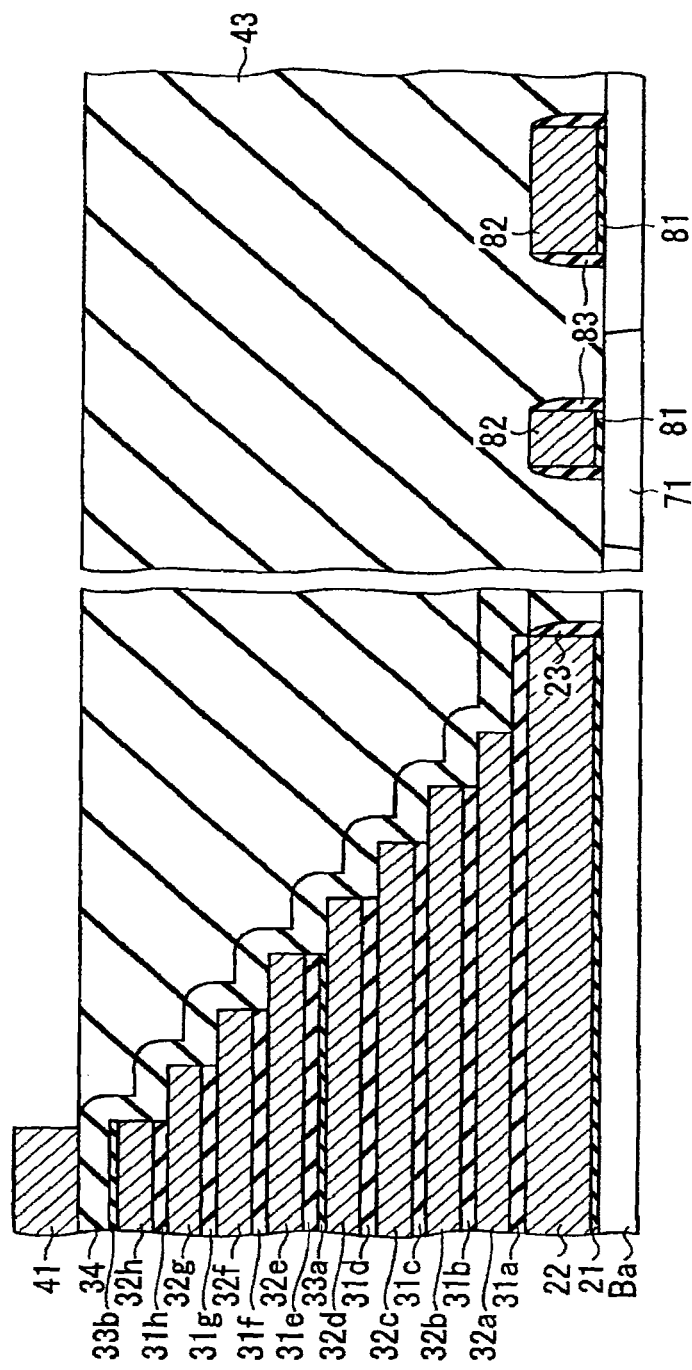
FIG. 30 is a sectional view of the memory transistor region 12 from the terminal end to the peripheral region Ph in the row direction showing a manufacturing process according to the first embodiment.

Next, as shown in FIGS. 29 and 30, the memory separation grooves 94 are filled with silicon nitride (SiN) so that the memory protection/insulation layers 34 are formed to extend into the memory separation grooves 94.

Subsequently, polysilicon (p-Si) is deposited on the memory protection/insulation layers 34. Then, select gate transistor separation grooves 95 are formed at the positions where they are aligned with the memory separation grooves 94. The select gate transistor separation grooves 95 are repeatedly formed in a line state at predetermined intervals formed in the column direction. The drain side conductive layers 41 and the source side conductive layers 42 are formed by the above processes.

Figure 31:
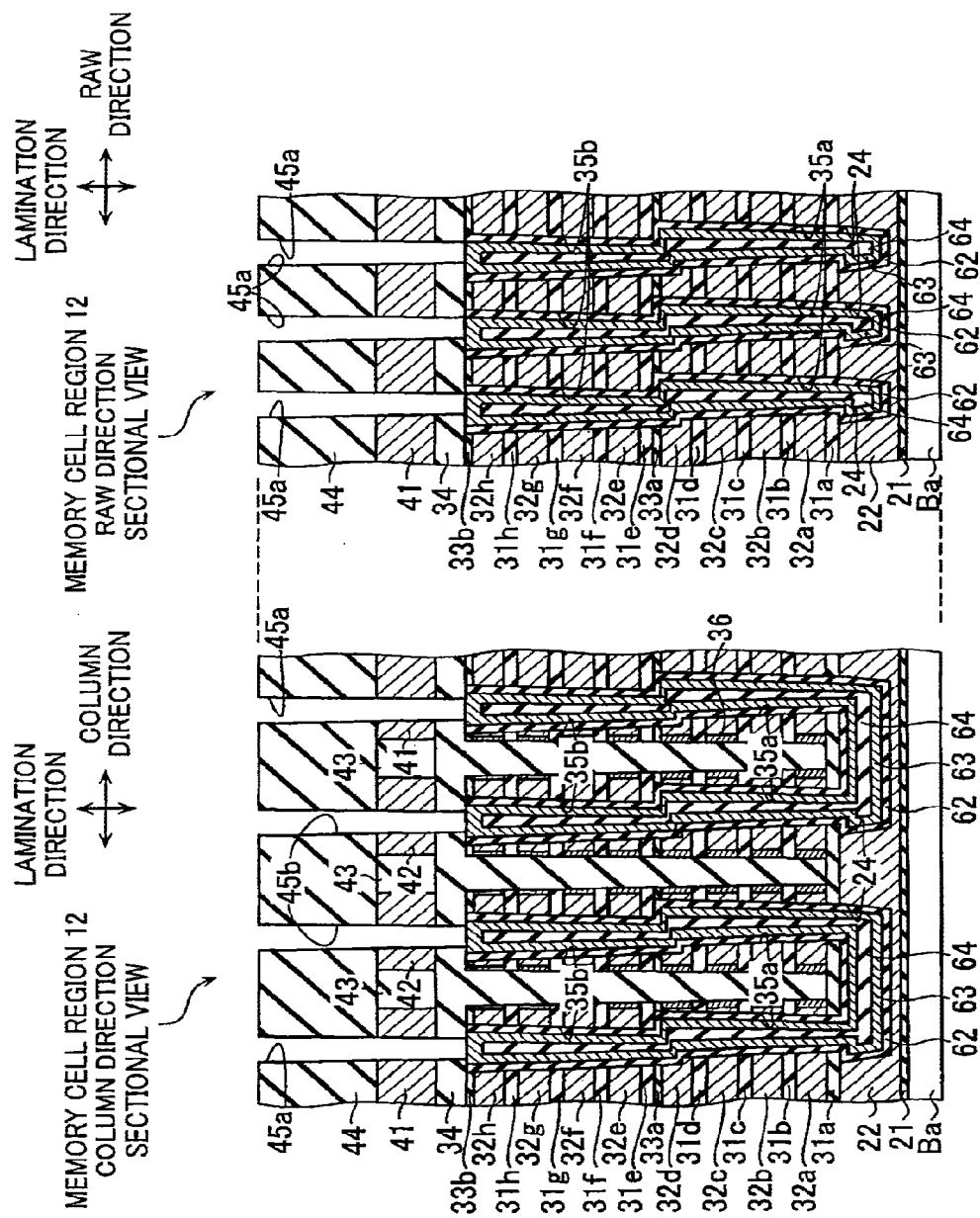
FIG. 31 is a sectional view of the memory transistor region 12 showing a manufacturing process according to the first embodiment.
Figure 32:
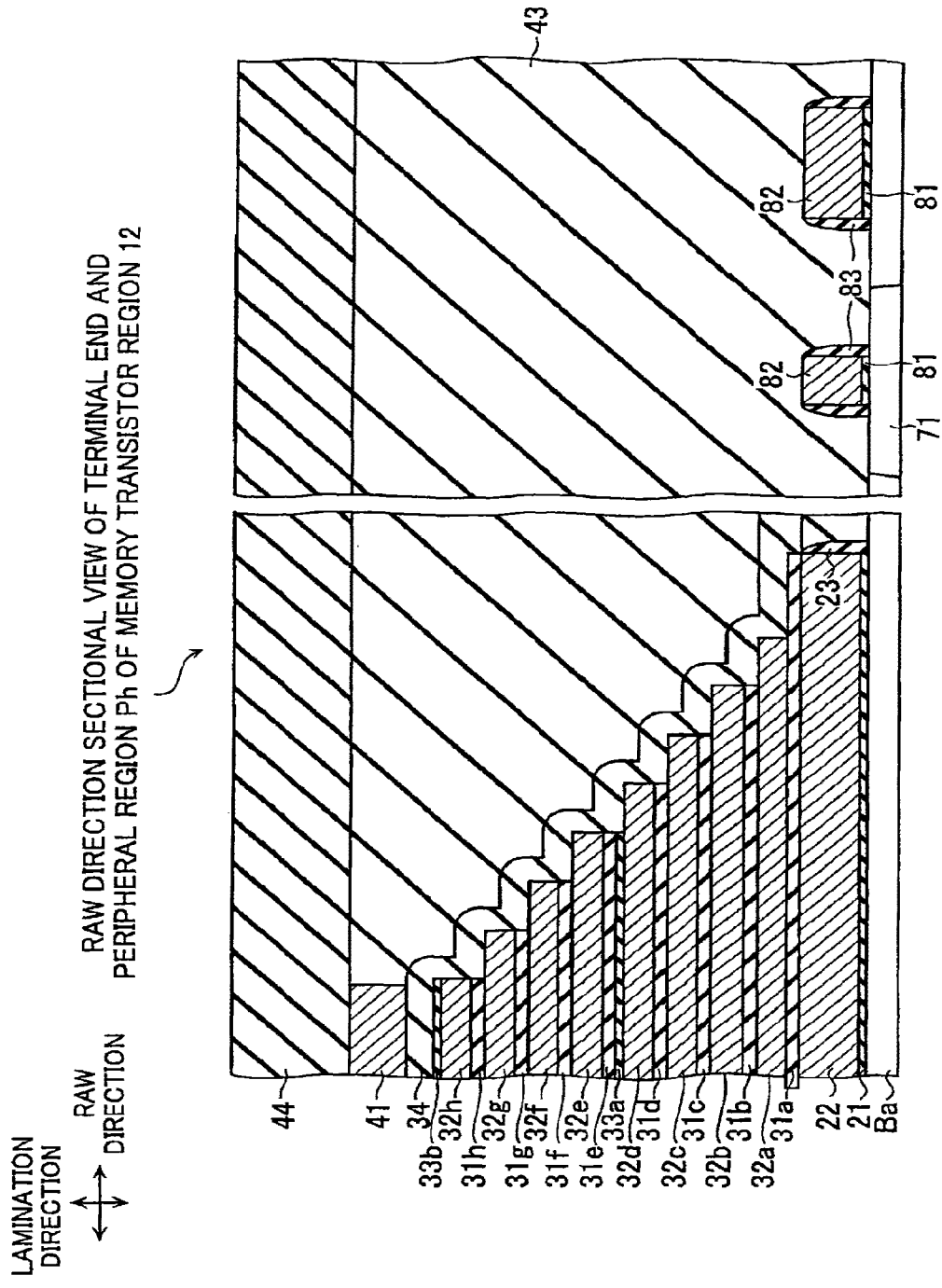
FIG. 32 is a sectional view of the memory transistor region 12 from the terminal end to the peripheral region Ph in the row direction showing a manufacturing process according to the first embodiment.

Next, as shown in FIGS. 31 and 32, silicon oxide ($SiO_2$) is deposited on the drain side conductive layers 41 and the source side conductive layers 42, and the select gate transistor insulation layers 44 are formed. Subsequently, the drain side holes 45a are formed to pass through the select gate transistor insulation layers 44, the drain side conductive layers 41, and the memory protection/insulation layers 34 so that they are aligned with the second memory holes 35b. Further, the source side holes 45b are formed to pass through the select gate transistor insulation layers 44, the source side conductive layers 42, and the memory protection/insulation layers 34 so that they are aligned with the second memory holes 35b.

Figure 33:
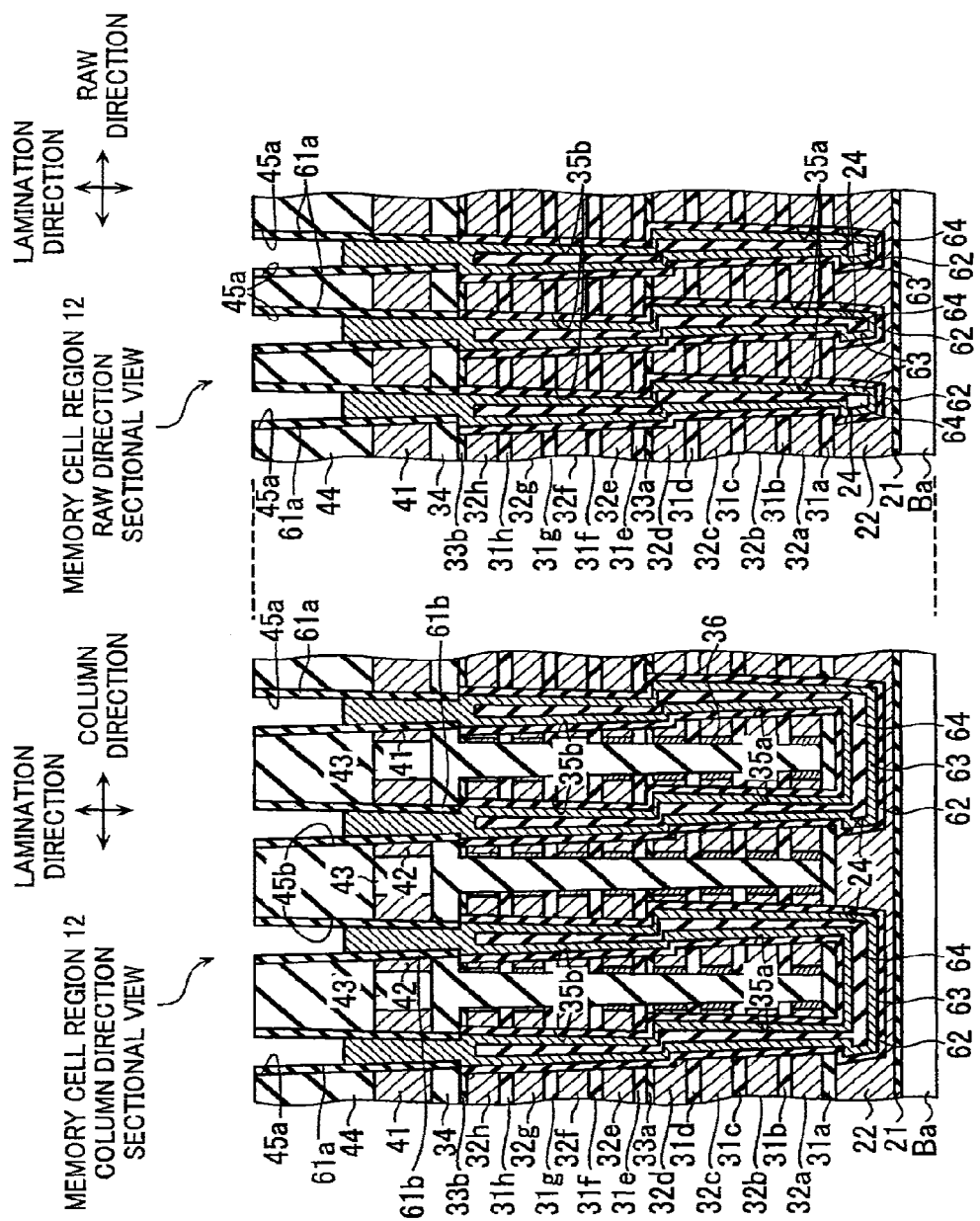
FIG. 33 is a sectional view of the memory transistor region 12 showing a manufacturing process according to the first embodiment.
Figure 34:
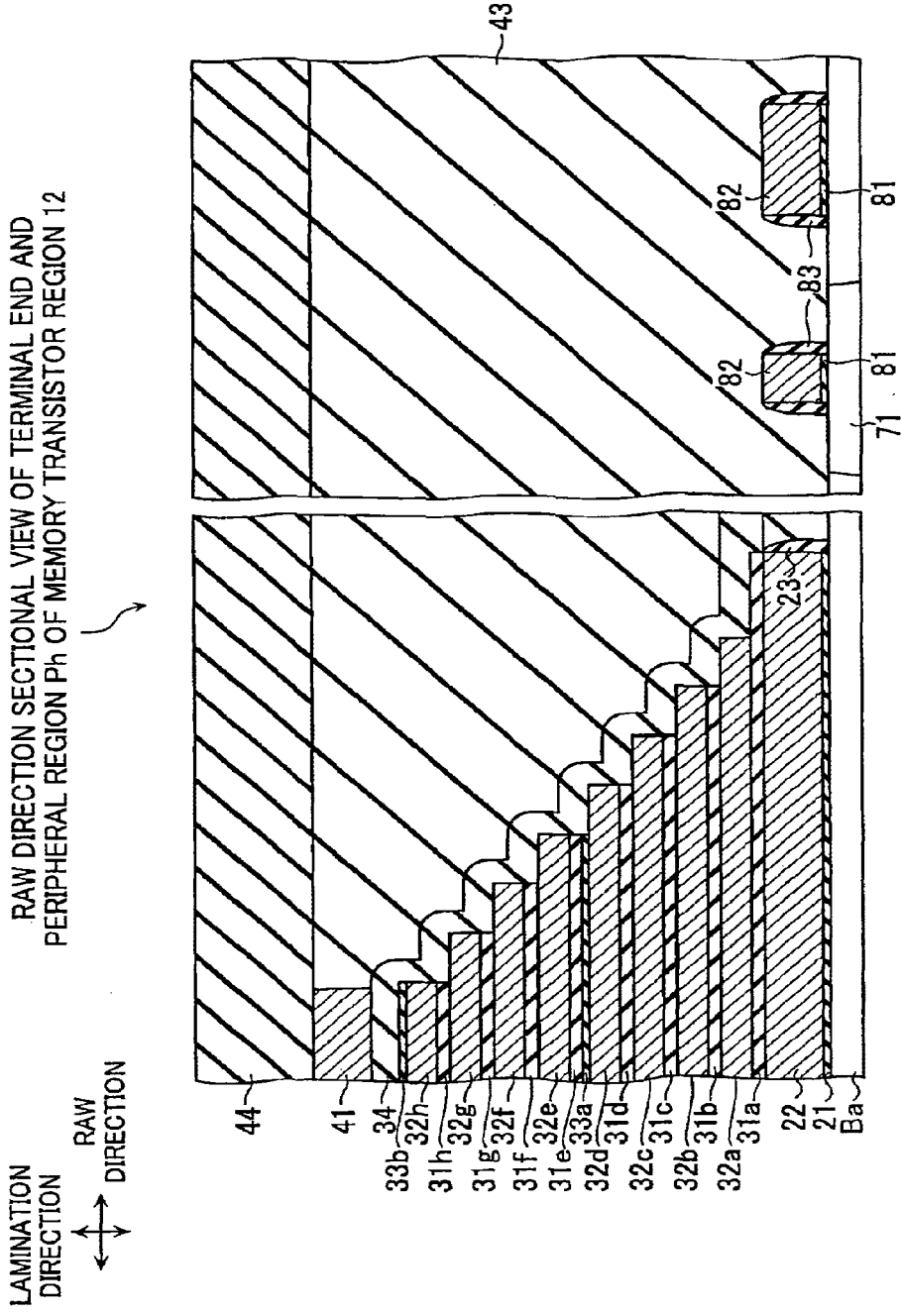
FIG. 34 is a sectional view of the memory transistor region 12 from the terminal end to the peripheral region Ph in the row direction showing a manufacturing process according to the first embodiment.

Next, as shown in FIGS. 33 and 34, after silicon nitride (SiN) is deposited, a lithography process is executed. The drain side gate insulation layers 61a and the source side gate insulation layers 61b are formed to the side walls of the drain side holes 45a and the source side holes 45b by the process.

Subsequently, polysilicon (p-Si) is deposited up to a predetermined position higher than the drain side conductive layers 41 and the source side conductive layers 42 so that it comes into contact with the gate insulation layers 61a in the drain side holes 45a and the source side holes 45b. That is, the U-shaped semiconductor layer 63 is formed so that the upper surface thereof extends to a predetermined position higher than the drain side conductive layers 41 and the source side conductive layers 42.

Figure 35:
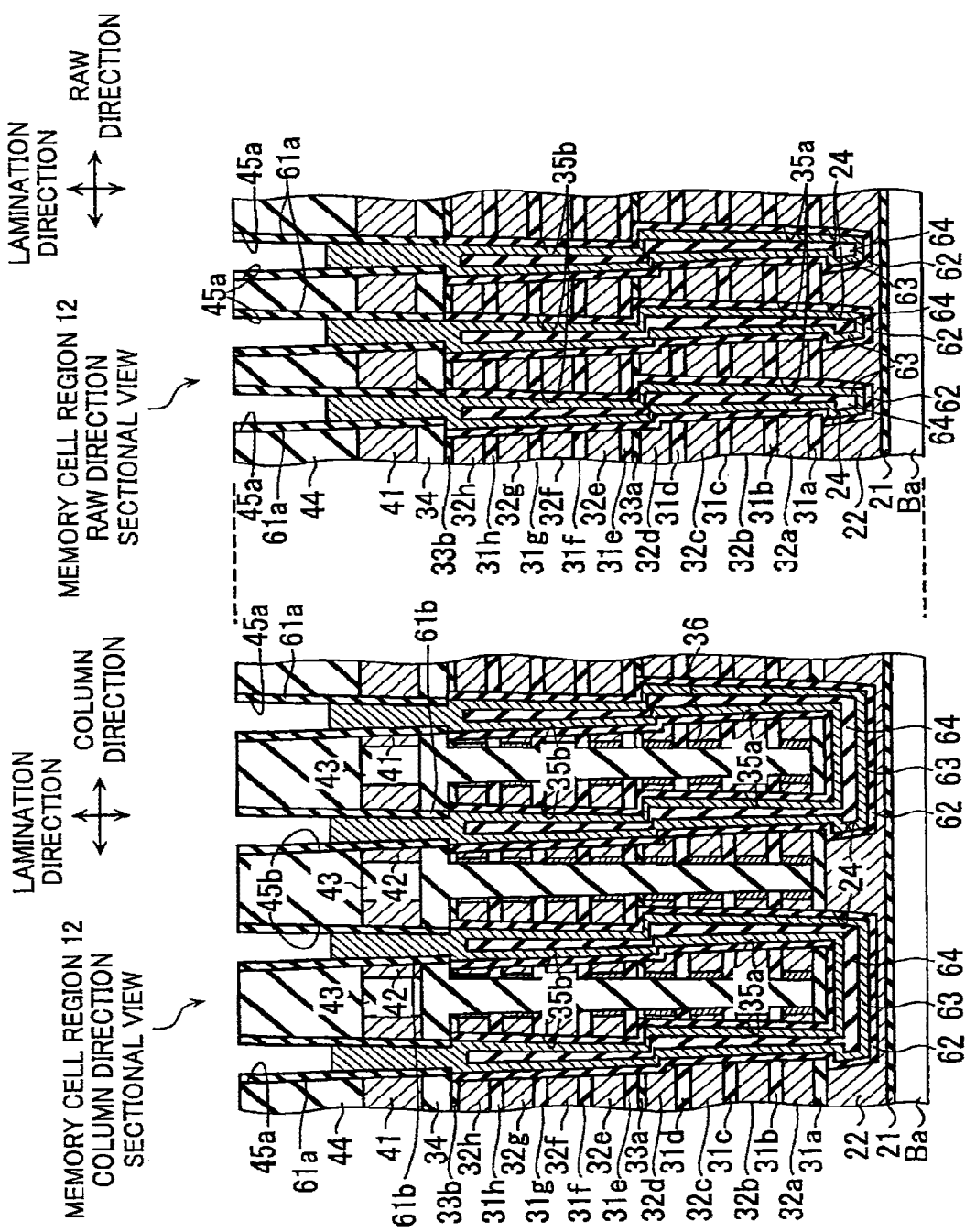
FIG. 35 is a sectional view of the memory transistor region 12 showing a manufacturing process according to the first embodiment.
Figure 36:
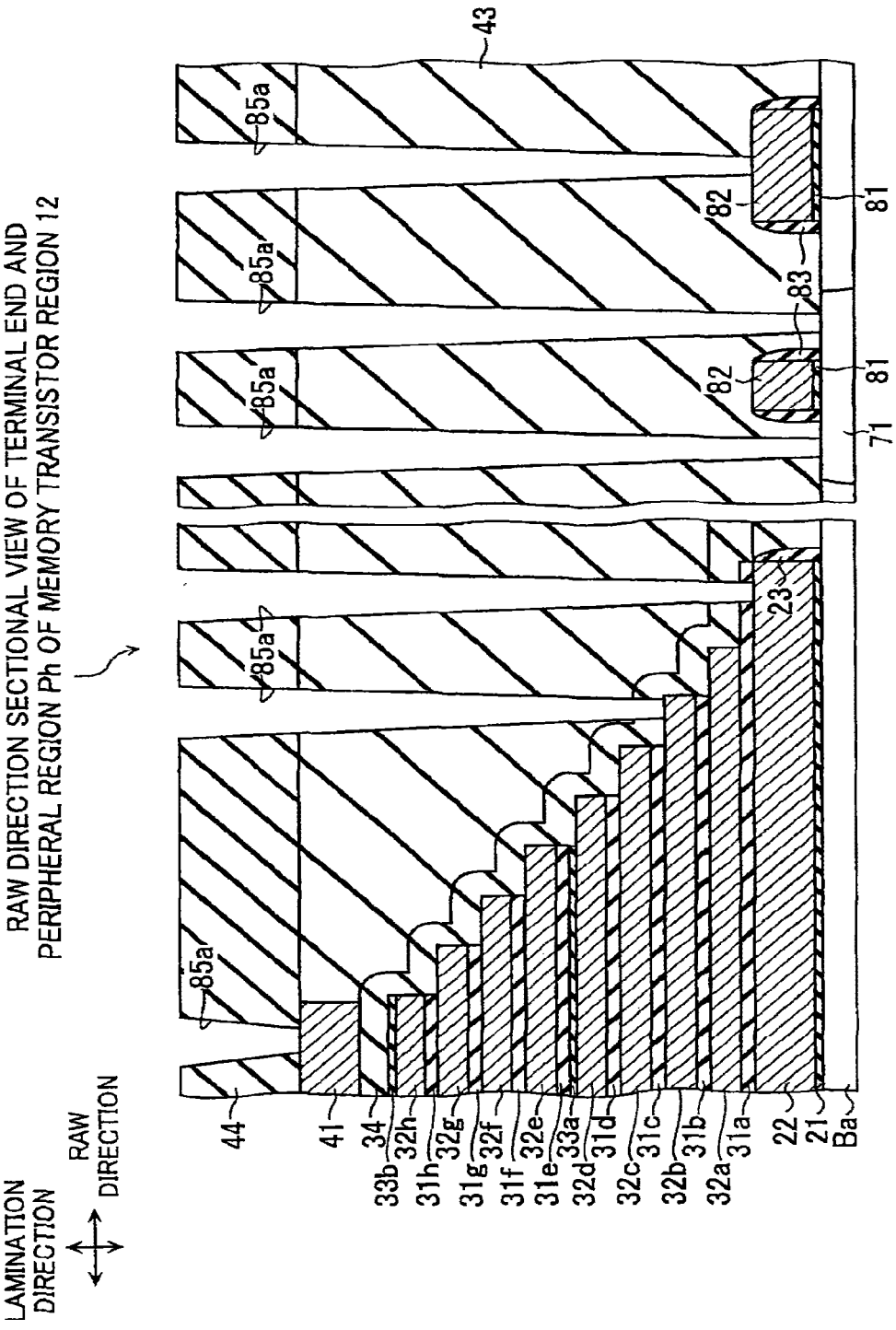
FIG. 36 is a sectional view of the memory transistor region 12 from the terminal end to the peripheral region Ph in the row direction showing a manufacturing process according to the first embodiment.

Next, as shown in FIGS. 35 and 36, the first plug holes 85*a* are formed to pass through the select gate transistor insulation layers 44, the interlayer insulation layers 43, and the memory protection/insulation layers 34 in the peripheral region Ph. The first plug holes 85*a* are formed to reach the base region 71, the gate conductive layers 82, the back gate conductive layer 22, the first to eighth word line conductive layer 32*a* to 32*h*, the drain side conductive layers 41, and the source side conductive layers 42. Note that, in FIG. 36, illustration of the first plug holes 85*a*, which reach the source side conductive layer 42, and illustration of the first plug holes 85*a*, which reach the first word line conductive layer 32*a* and the third to eighth the word line conductive layers 32*c* to 32*h*, are omitted.

Figure 37:
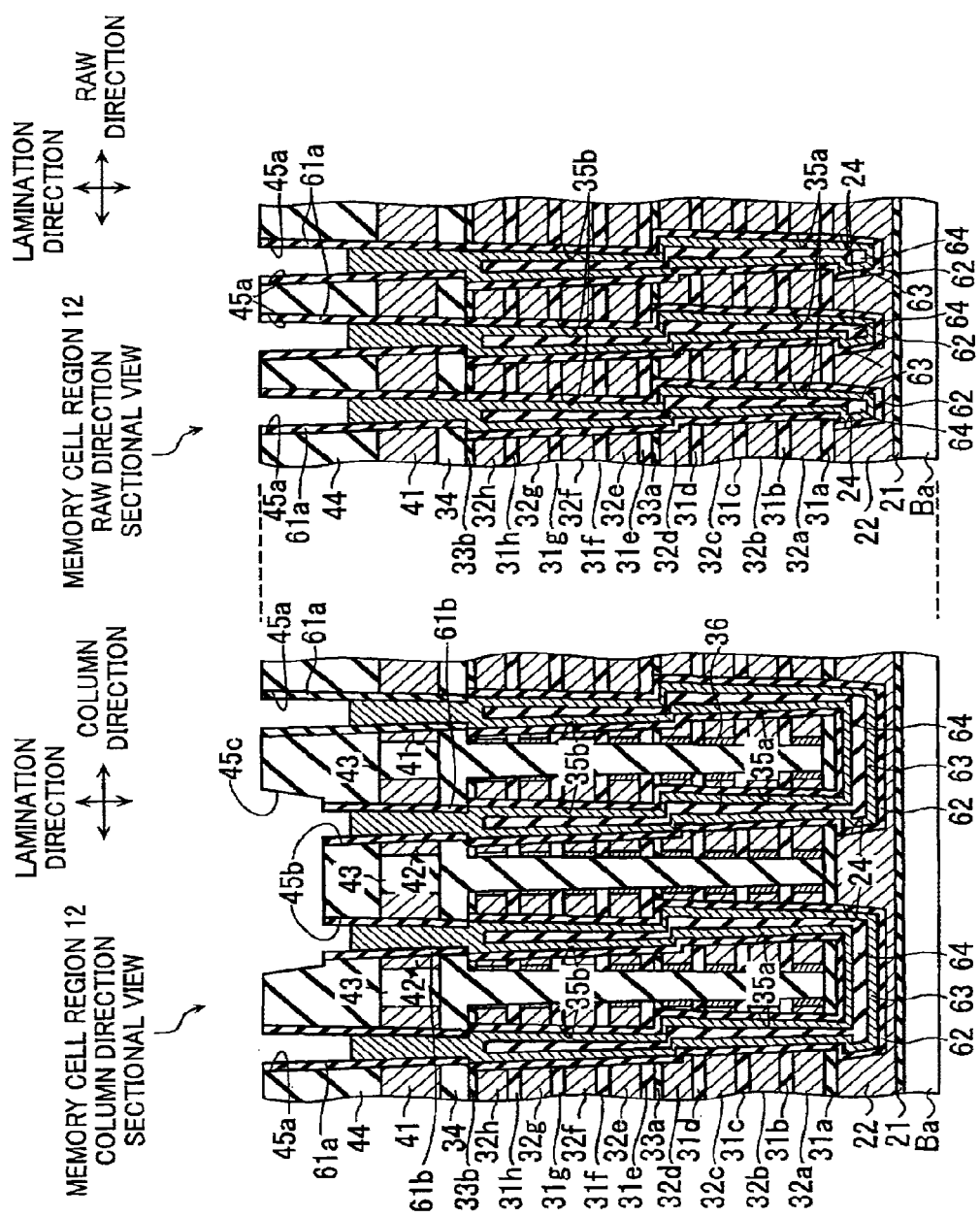
FIG. 37 is a sectional view of the memory transistor region 12 showing a manufacturing process according to the first embodiment.
Figure 38:
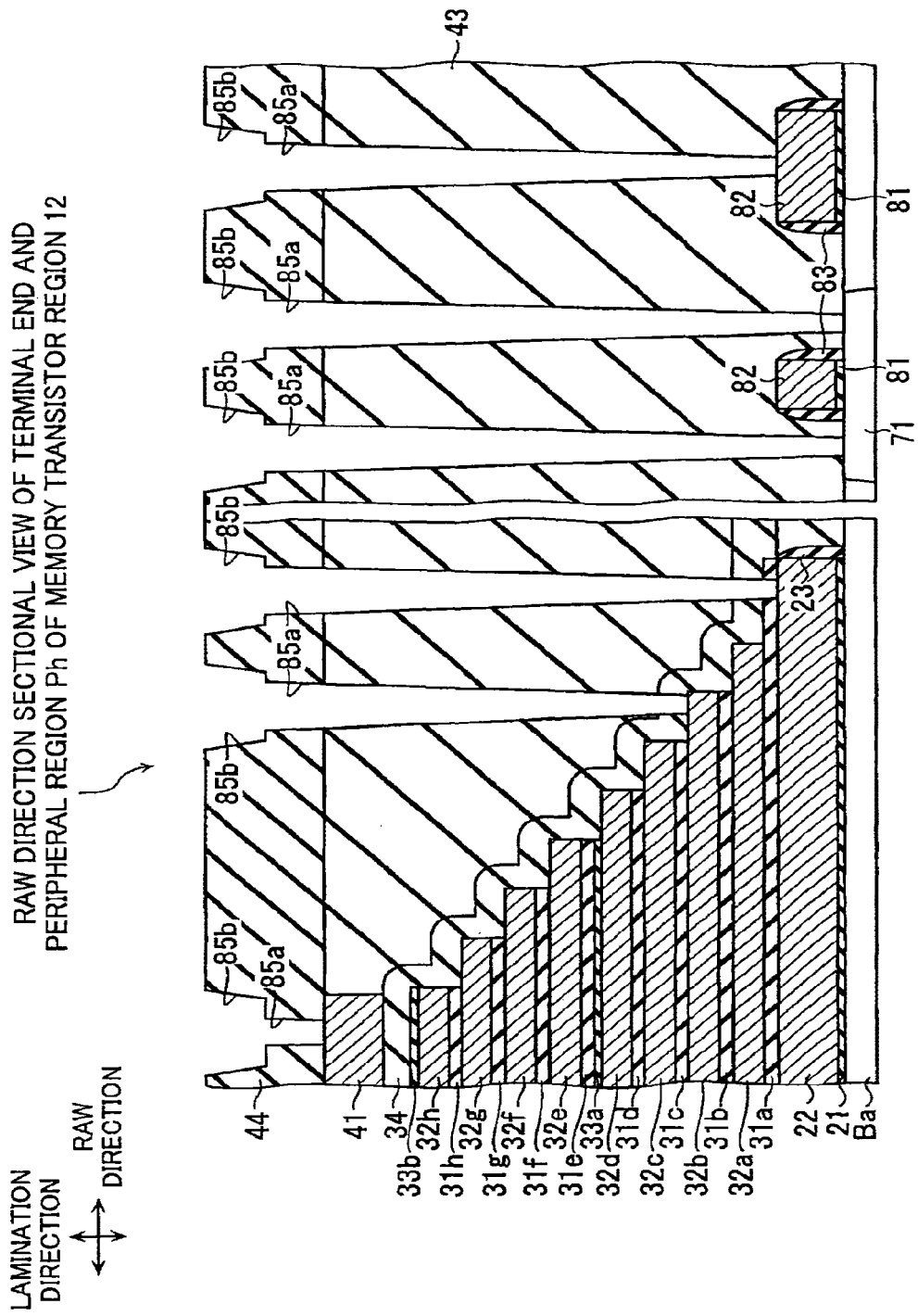
FIG. 38 is a sectional view of the memory transistor region 12 from the terminal end to the peripheral region Ph in the row direction showing a manufacturing process according to the first embodiment.

Subsequently, as shown in FIGS. 37 and 38, the select gate transistor insulation layers 44 are dug so that the upper portions of the source side holes 45*b* adjacent to each other in the column direction are connected in the column direction, and the source line wiring grooves 45*c* are formed. The source line wiring grooves 45*c* are formed to have rectangular openings each having a long side in the row direction and a short side in the column direction. At the same time, the select gate transistor insulation layers 44 are etched in the upper portions of the first plug holes 85*a*, and the first wiring grooves 85*b* are formed in the peripheral region Ph.

Figure 39:
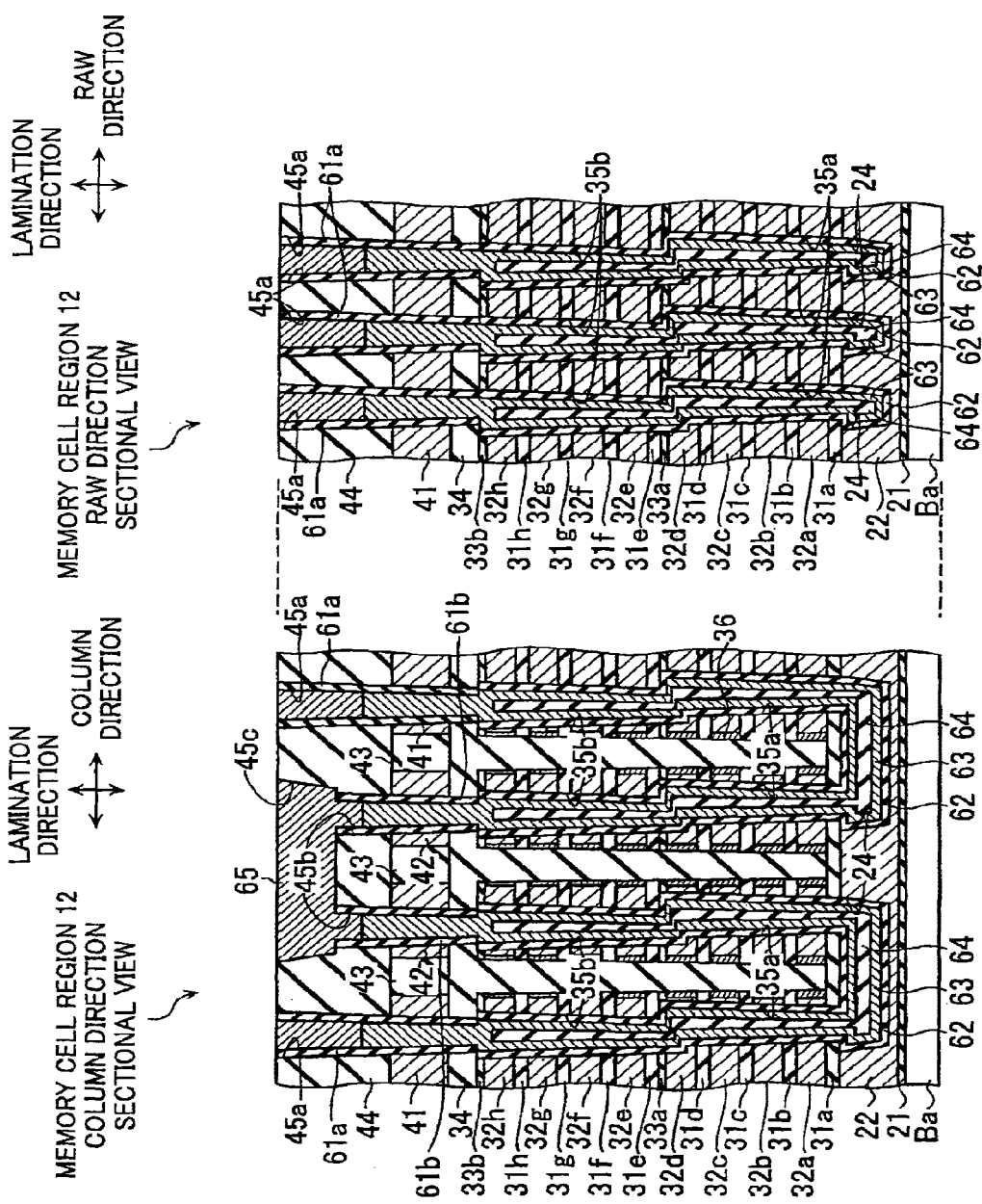
FIG. 39 is a sectional view of the memory transistor region 12 showing a manufacturing process according to the first embodiment.
Figure 40:
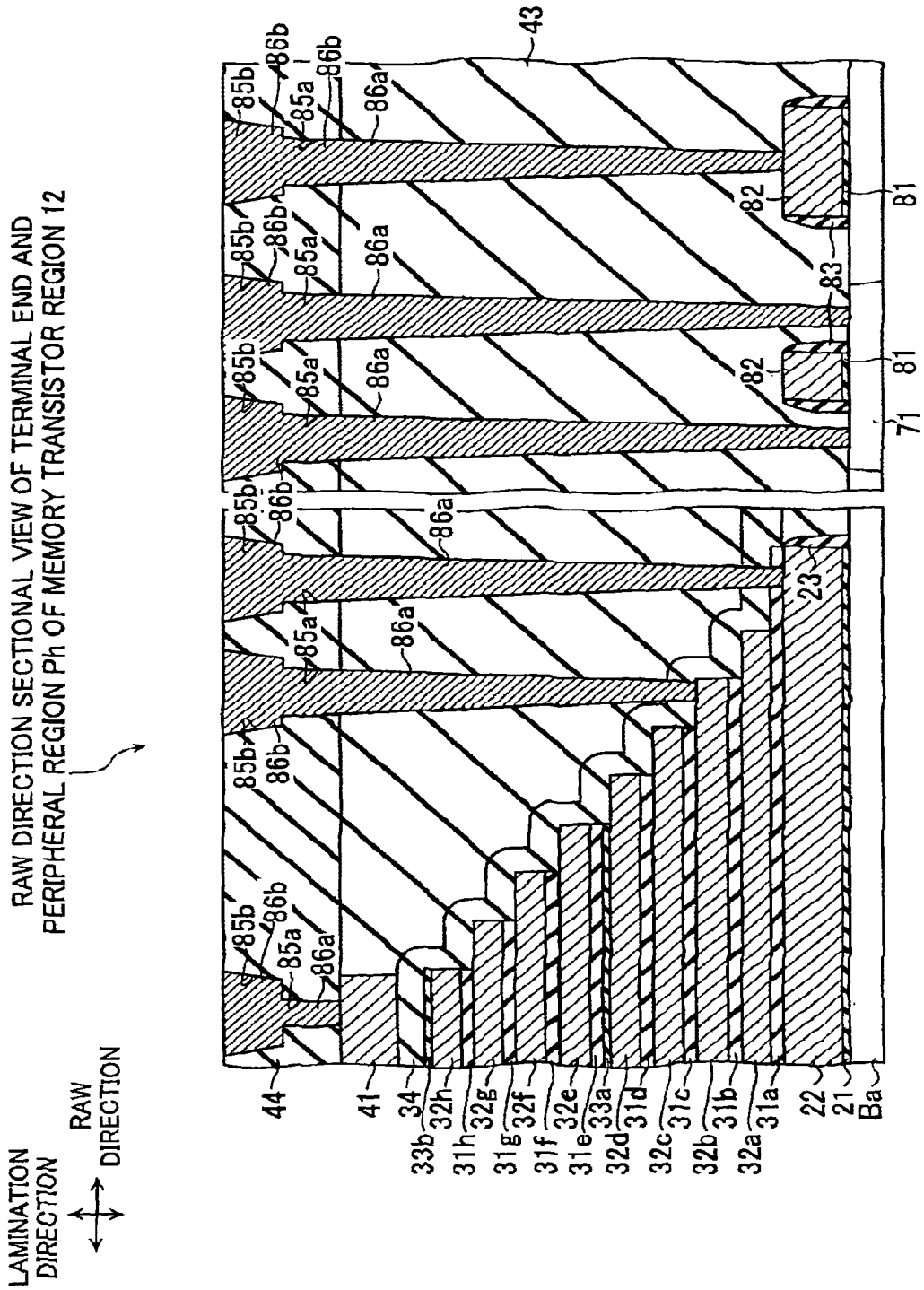
FIG. 40 is a sectional view of the memory transistor region 12 from the terminal end to the peripheral region Ph in the row direction showing a manufacturing process according to the first embodiment.

Next, as shown in FIGS. 39 and 40, titanium (Ti), titanium nitride (TiN), and tungsten (W) are sequentially deposited so that the source line wiring grooves 45*c*, the first wiring grooves 85*b*, and the first plug holes 85*a* are filled therewith. Thereafter, the titanium (Ti), the titanium nitride (TiN), and the tungsten (W) deposited on the upper surfaces of the select gate transistor insulation layers 44 are removed by CMP. The source line conductive layer 65 is formed so as to fill the source line wiring grooves 45*c* through the above process (so-called, dual damascene process). Further, the first plug conductive layers 86*a* are formed so that the first plug holes 85*a* are filled therewith, and the first wiring layers 86*b* are formed so that the first wiring grooves 85*b* are filled therewith.

Figure 41:
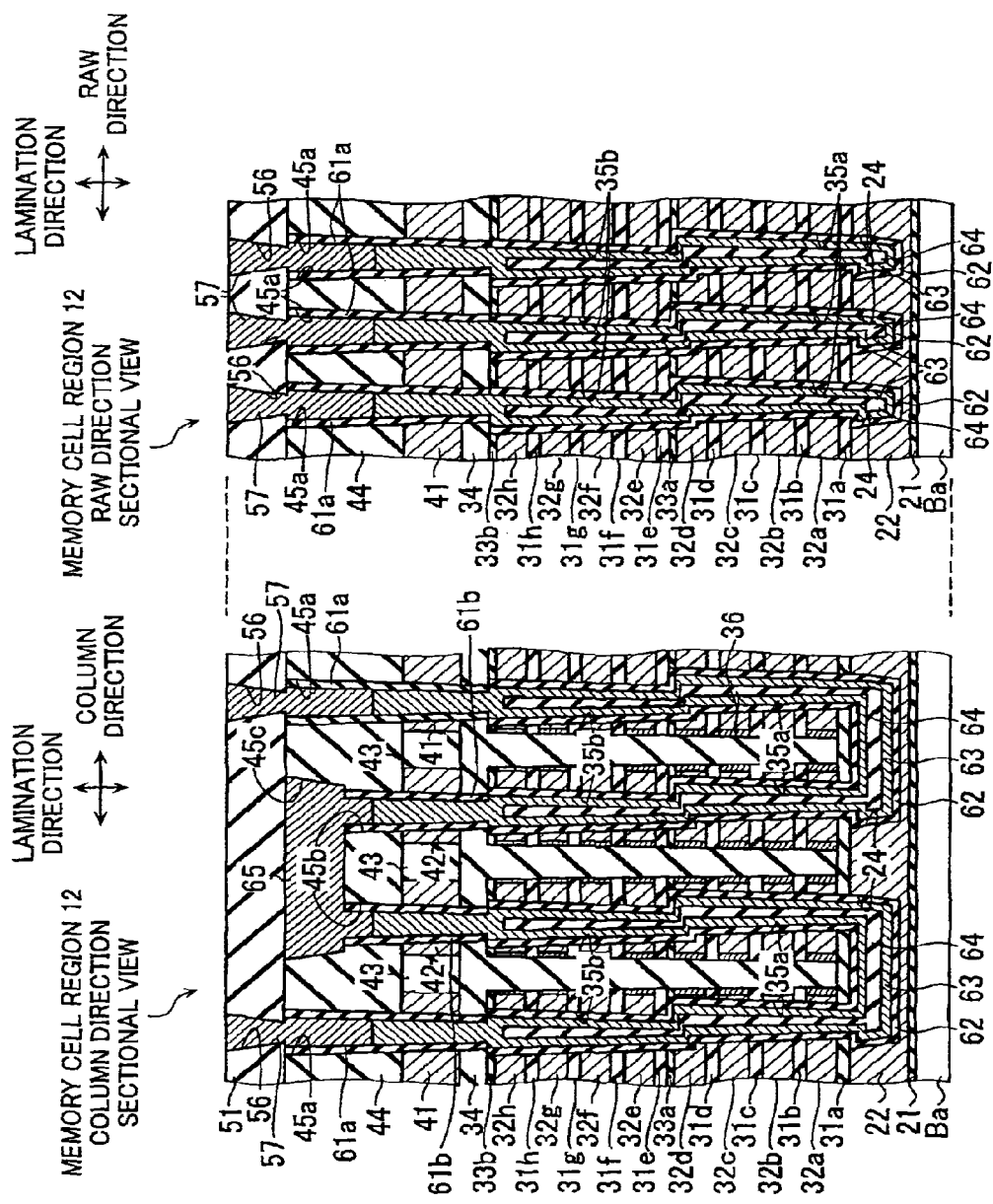
FIG. 41 is a sectional view of the memory transistor region 12 showing a manufacturing process according to the first embodiment.
Figure 42:
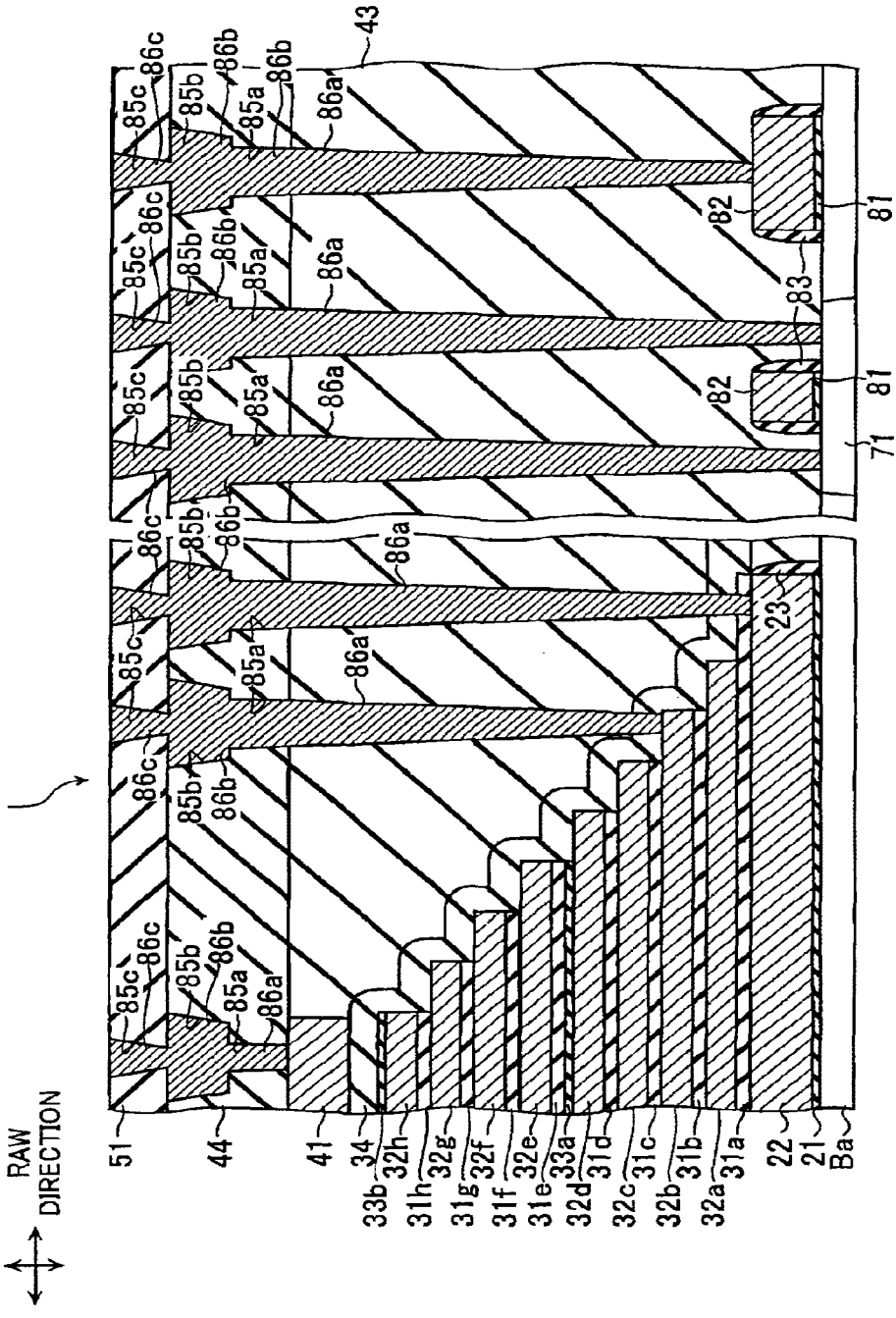
FIG. 42 is a sectional view of the memory transistor region 12 from the terminal end to the peripheral region Ph in the row direction showing a manufacturing process according to the first embodiment.

Subsequently, as shown in FIGS. 41 and 42, silicon oxide (SiO$_2$) is deposited on the select gate transistor insulation layers 44, and the first wiring insulation layer 51 is formed. Next, the bit line plug holes 56 and the second plug holes 85*c* are formed to pass through the first wiring insulation layer 51. The bit line plug holes 56 are formed at the positions where they are aligned with the drain side holes 45*a*. Further, the second plug holes 85*c* are formed at the positions where they are aligned with the first memory holes 85*a*.

Next, titanium (Ti), titanium nitride (TiN), and tungsten (W) are sequentially deposited so that the bit line plug holes 56 and the second plug holes 85*c* are filled therewith. Subsequently, the titanium (Ti), the titanium nitride (TiN), and the tungsten (W) on the first wiring insulation layer 51 are removed by CMP. The bit line plug layers 57 are formed in the bit line plug holes 56 through the processes shown in FIGS. 41 and 42. Further, the second plug conductive layers 86*c* are formed in the second plug holes 85*c*.

Figure 43:
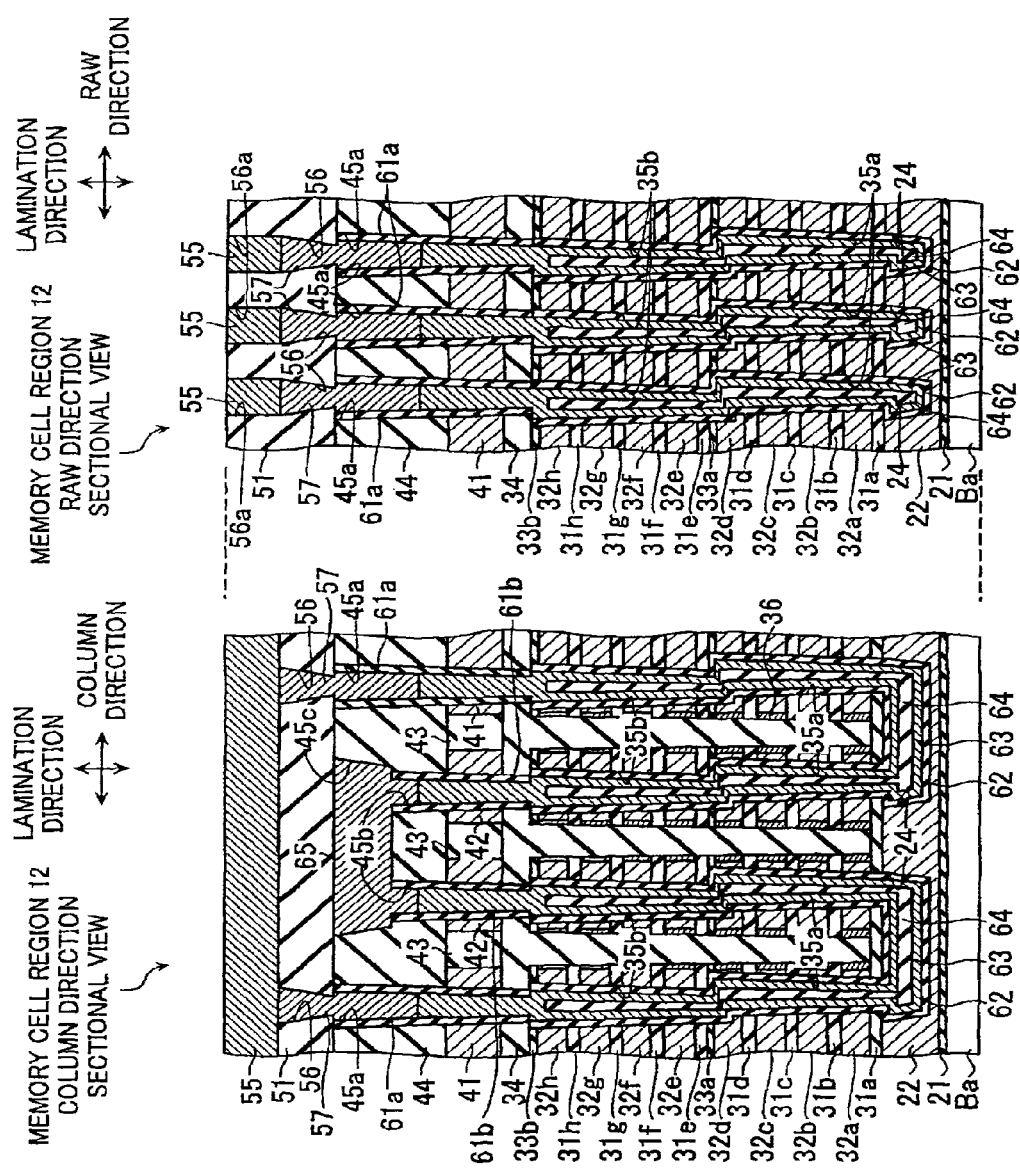
FIG. 43 is a sectional view of the memory transistor region 12 showing a manufacturing process according to the first embodiment.
Figure 44:
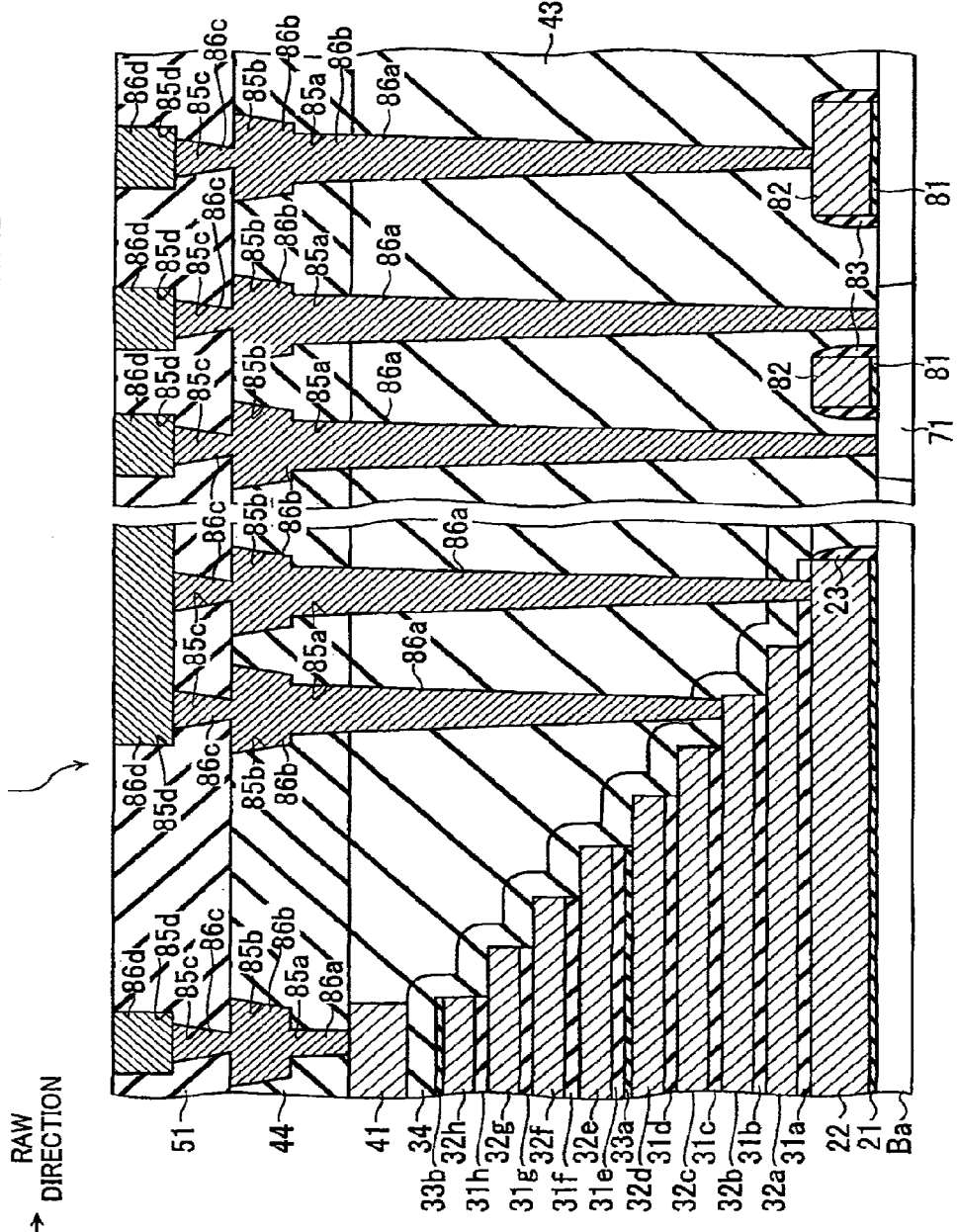
FIG. 44 is a sectional view of the memory transistor region 12 from the terminal end to the peripheral region Ph in the row direction showing a manufacturing process according to the first embodiment.

Subsequently, as shown in FIGS. 43 and 44, silicon oxide (SiO$_2$) is deposited so that the upper surface of the first wiring insulation layer 51 is made much higher. Next, the bit line wiring grooves 56*a* are formed by etching the first wiring insulation layer 51.

The bit line wiring grooves 56*a* are formed at the positions where they are aligned with the bit line plug holes 56. The bit line wiring grooves 56*a* are repeatedly formed in the line state so as to extend in the column direction at the predetermined intervals formed in the row direction. Further, the second wiring grooves 85*d* are formed by etching the first wiring insulation layer 51 in the peripheral region Ph.

Next, tantalum (Ta), tantalum nitride (TaN), and copper (Cu) are sequentially deposited so that the bit line wiring grooves 56*a* and the second wiring grooves 85*d* are filled therewith. Subsequently, the tantalum (Ta), the tantalum nitride (TaN), and the copper (Cu) on the first wiring insulation layer 51 are removed by CMP. The bit line conductive layers 55 are formed to the bit line wiring grooves 56*a* through the above processes. Further, the second wiring layers 86*d* are formed to the second wiring grooves 85*d*.

Figure 45:
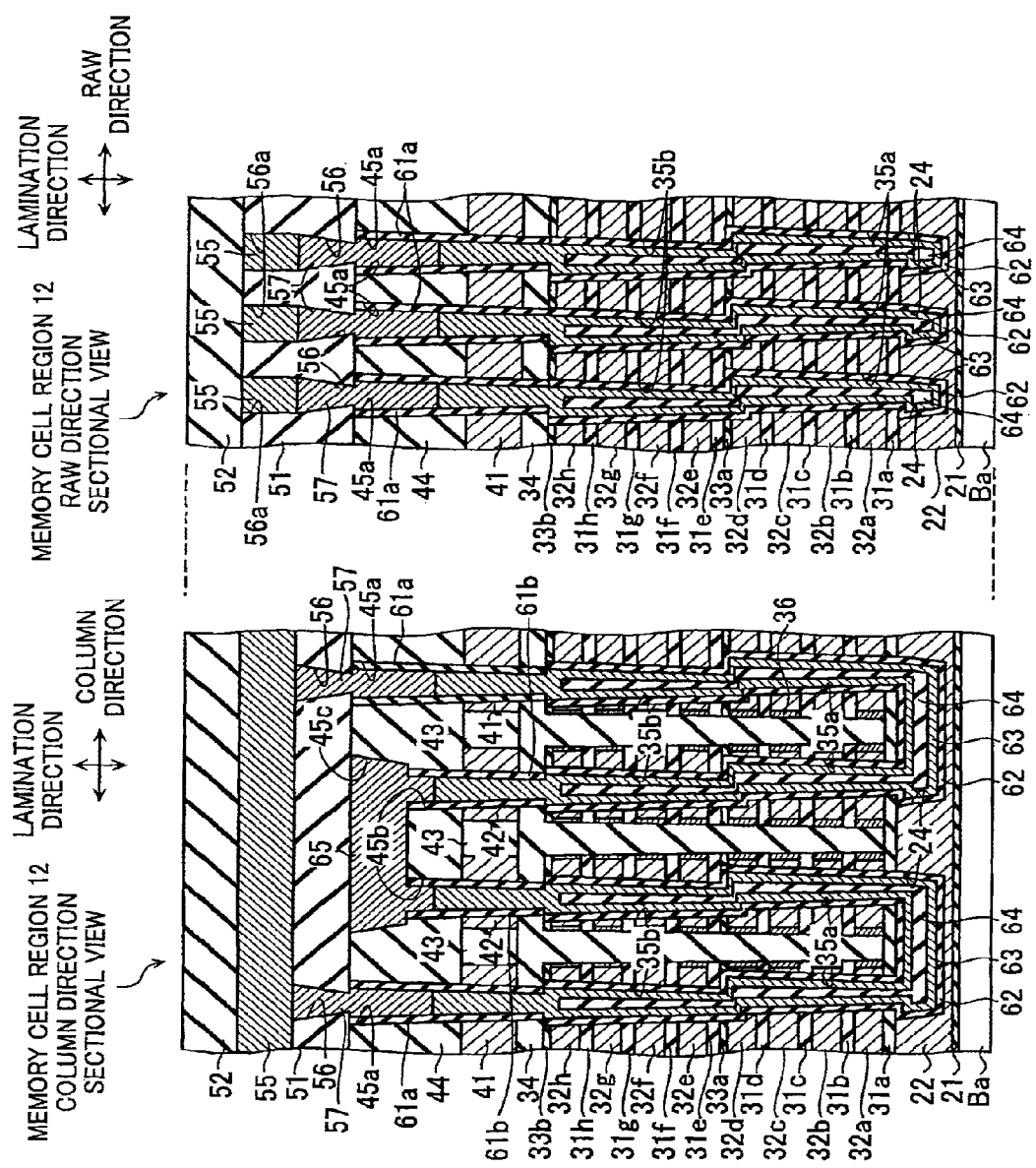
FIG. 45 is a sectional view of the memory transistor region 12 showing a manufacturing process according to the first embodiment.
Figure 46:
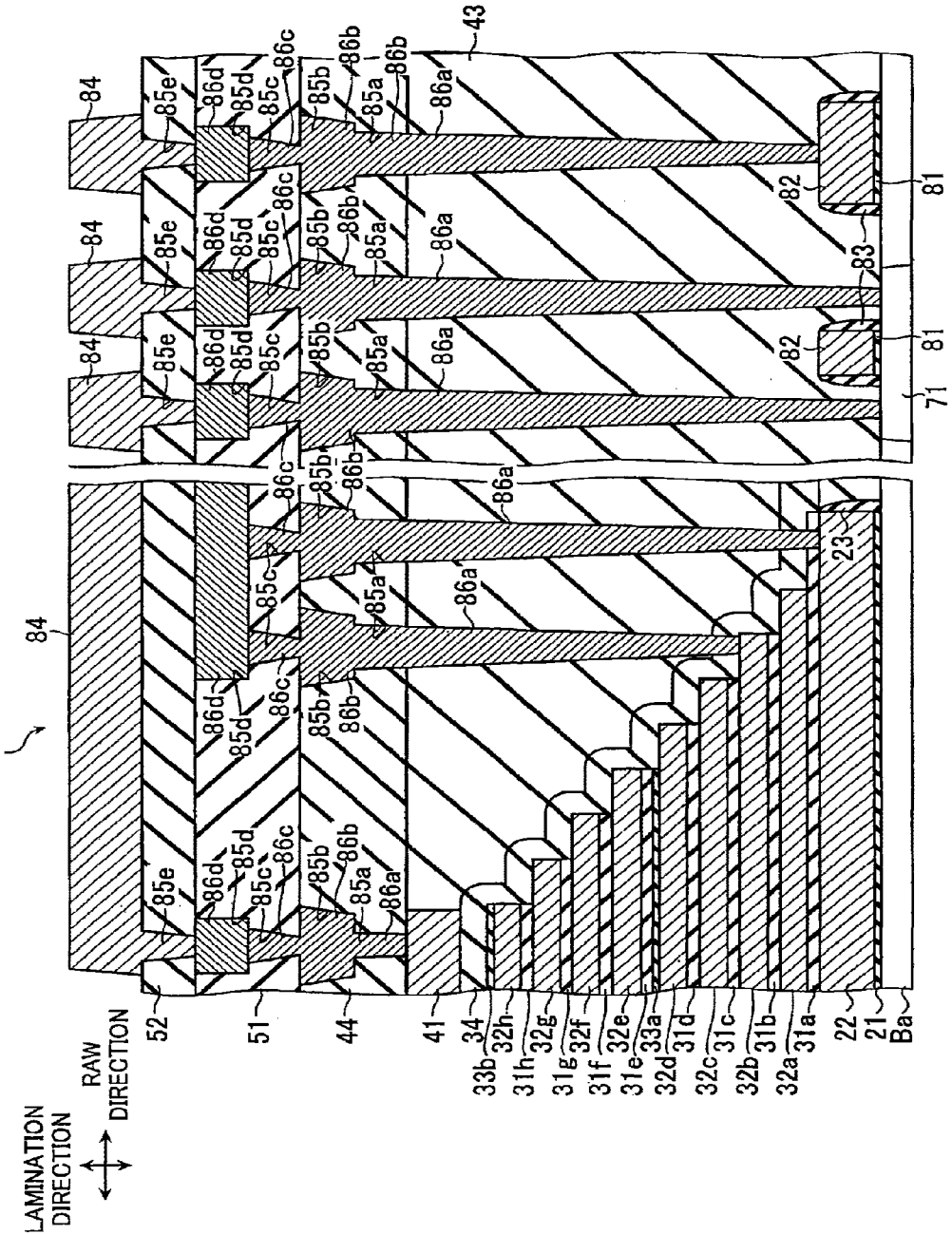
FIG. 46 is a sectional view of the memory transistor region 12 from the terminal end to the peripheral region Ph in the row direction showing a manufacturing process according to the first embodiment.

Subsequently, as shown in FIGS. 45 and 46, silicon oxide (SiO$_2$) is deposited on the first wiring insulation layer 51, and the second wiring insulation layer 52 is formed. The third plug holes 85*e* are formed to pass through the second wiring insulation layer 52 in the peripheral region Ph. The third plug holes 85*e* are formed at the positions where they are aligned with the second wirings grooves 85*d*. Subsequently, titanium (Ti), titanium nitride (TiN), and aluminum-copper (AlCu) are sequentially deposited to a predetermined height on the upper surface of the second wiring insulation layer 52 so that the third plug holes 85*e* are filled therewith. Next, the titanium (Ti), the titanium nitride (TiN), and the aluminum-copper (AlCu) are processed to a predetermined shape. The third wiring layers 84 are formed from the titanium (Ti)-the titanium nitride (TiN)-the aluminum-copper (AlCu) through the above processes. Further, bonding pads (not shown) are formed through the same processes.

Subsequent to FIGS. 45 and 46, silicon oxide (SiO$_2$) and silicon nitride (SiN) are deposited on the second wiring insulation layer 52 and the third wiring layers 84, and the third wiring insulation layer 53 and the fourth wiring insulation layer 54 are formed. The non-volatile semiconductor storage device 100 according to the first embodiment shown FIGS. 5 and 6 is manufactured through the above processes.

Advantage of Non-Volatile Semiconductor Storage Device 100 According to First Embodiment Next, an advantage of the non-volatile semiconductor storage device according to the first embodiment will be explained. The non-volatile semiconductor storage device 100 according to the first embodiment can be highly integrated as shown in the above laminated structure. Further, as explained in the above manufacturing processes, in the non-volatile semiconductor storage device 100, the respective layers acting as the memory transistors $MTr_{mn}$ and the respective layers acting as the source side select gate transistor $SSTr_{mn}$ and the drain side select gate transistor layers $SDTr_{mn}$ can be manufactured by the predetermined number of lithography processes regardless of laminated number of the word lines $WL_{mn}$. That is, the non-volatile semiconductor storage device 100 can be manufactured at a less expensive cost.

Further, the non-volatile semiconductor storage device 100 according to the first embodiment has the back gate line BG which is in contact with the coupling portion $JP_{mn}$ (U-shaped lower portion) of the U-shaped semiconductor layer $SC_{mn}$. Then, the back gate line BG functions as the back gate transistor $BGTr_{mn}$ for forming a channel to the coupling portion $JP_{mn}$. Accordingly, the memory strings MS having excellent conductivity can be arranged by the U-shaped semiconductor layer $SC_{mn}$ in an almost non-doped state.

Further, in the non-volatile semiconductor storage device 100 according to the first embodiment, the source line $SL_n$ (source line conductive layer 65) is composed of titanium (Ti), titanium nitride (TiN), and tungsten (W). Accordingly, the non-volatile semiconductor storage device 100 according to the first embodiment can improve a read-out speed as compared with a case that the source line $SL_n$ is composed of a semiconductor of poly silicon and the like.

A comparative example, in which a U-shaped semiconductor layer 63 is formed by depositing polysilicon a plurality of times, will be contemplated here. In the manufacturing process of the comparative example, polysilicon is formed in, for example, first memory holes 35a in place of the sacrificial layers 91. Subsequently, fifth to eighth word line conductive layers 32e to 32h are formed on the polysilicon, second memory holes 35b are formed, and memory gate insulation layers 32 are formed in the second memory holes 35b.

In the comparative example, when the polysilicon is deposited in the second memory holes 35b subsequently, it is necessary to remove natural oxide films on the bottoms of the second memory holes 35b (upper surface of the polysilicon in the first memory holes 35a) by a wet process. However, a problem arises in that the memory gate insulation layers 32 in the second memory holes 35b are removed by etching due to the wet process.

Further, in the manufacturing process of the comparative example, a contact resistance is generated between the polysilicon in the first memory holes 35a and the polysilicon in the second memory holes 35b. The contact resistance makes a current flowing in the U-shaped semiconductor layer 63 unstable.

In contrast, in the manufacturing process of the non-volatile semiconductor storage device 100 according to the first embodiment, the memory gate insulation layers 62 and the U-shaped semiconductor layer 63 can be formed without executing the wet process. More specifically, the memory gate insulation layers 62 and the U-shaped semiconductor layer 63 are continuously formed in the back gate holes 24, the first memory holes 35a, and the second memory holes 35b. Accordingly, in the non-volatile semiconductor storage device 100 according to the first embodiment, the memory gate insulation layers 62 can be formed in a predetermined thickness without being removed by etching. Further, since the wet process is not necessary, a material that constitutes the memory gate insulation layers 62 can be selected from a wide range. Accordingly, the memory gate insulation layers 62 can be composed of a material corresponding to multi-valuation. As a result, the density of a memory device can be more increased.

Further, since the U-shaped semiconductor layer 63 is continuously formed, no contact resistance is generated in the boundary between the first memory holes 35a and the second memory holes 35b. Thus, in the non-volatile semiconductor storage device 100 according to the first embodiment, the U-shaped semiconductor layer 63 can cause a current to flow more stably than the comparative example.

Further, in the non-volatile semiconductor storage device 100 according to the first embodiment, the U-shaped semiconductor layer 63 is formed to have the hollow portions. With this arrangement, the U-shaped semiconductor layer 63 having a predetermined thickness can be formed without depending on the diameter of the back gate holes 24, the diameter of the first memory holes 35a, and the diameter of the second memory holes 35b. More specifically, in the non-volatile semiconductor device 100 according to the first embodiment, the characteristics of the memory transistors $MTr_{mn}$ can be kept regardless of the dispersion of the diameters of openings in manufacture.

Further, in the non-volatile semiconductor storage device 100 according to the first embodiment, the first memory holes 35a and the second memory holes 35b are formed by being overlapped in the lamination direction. Accordingly, even if the center positions of the first memory holes 35a are offset from the center positions of the second memory holes 35b a predetermined length, the first memory holes 35a can be caused to communicate with the second memory holes 35b. More specifically, the reliability of the non-volatile semiconductor storage device 100 according to the first embodiment can be enhanced as well as the decrease of yield thereof can be suppressed.

Further, in the non-volatile semiconductor device 100 according to the first embodiment, the drain side select gate transistor layer 41 and the source side select gate transistor layer 42 are composed of the same deposited layer. Accordingly, the process cost of the non-volatile semiconductor device 100 according to the first embodiment can be reduced.

As described above, the non-volatile semiconductor storage device 100 according to the first embodiment has high reliability and can be manufactured less expensively.

Second Embodiment

Figure 47:
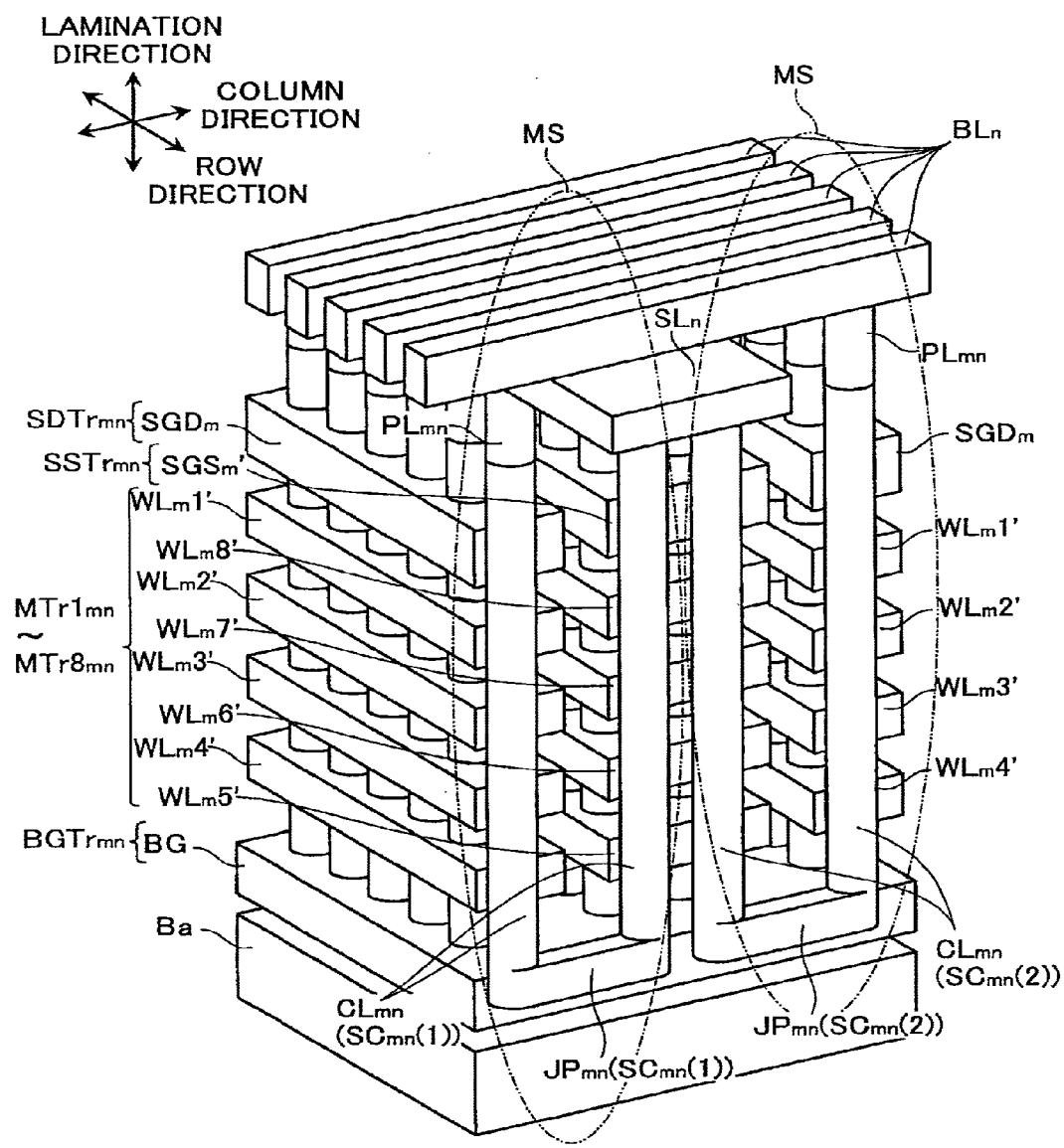
FIG. 47 is a schematic perspective view of a part of a memory transistor region of a non-volatile semiconductor storage device according to a second embodiment of the present invention.

Arrangement of Non-Volatile Semiconductor Storage Device According to Second Embodiment Next, an arrangement of a non-volatile semiconductor storage device according to a second embodiment will be explained referring to FIGS. 47 and 48. FIG. 47 is a schematic perspective view of a part of a memory transistor region of the non-volatile semiconductor storage device according to the second embodiment, and FIG. 48 is a sectional view of the memory transistor region.

Figure 48:
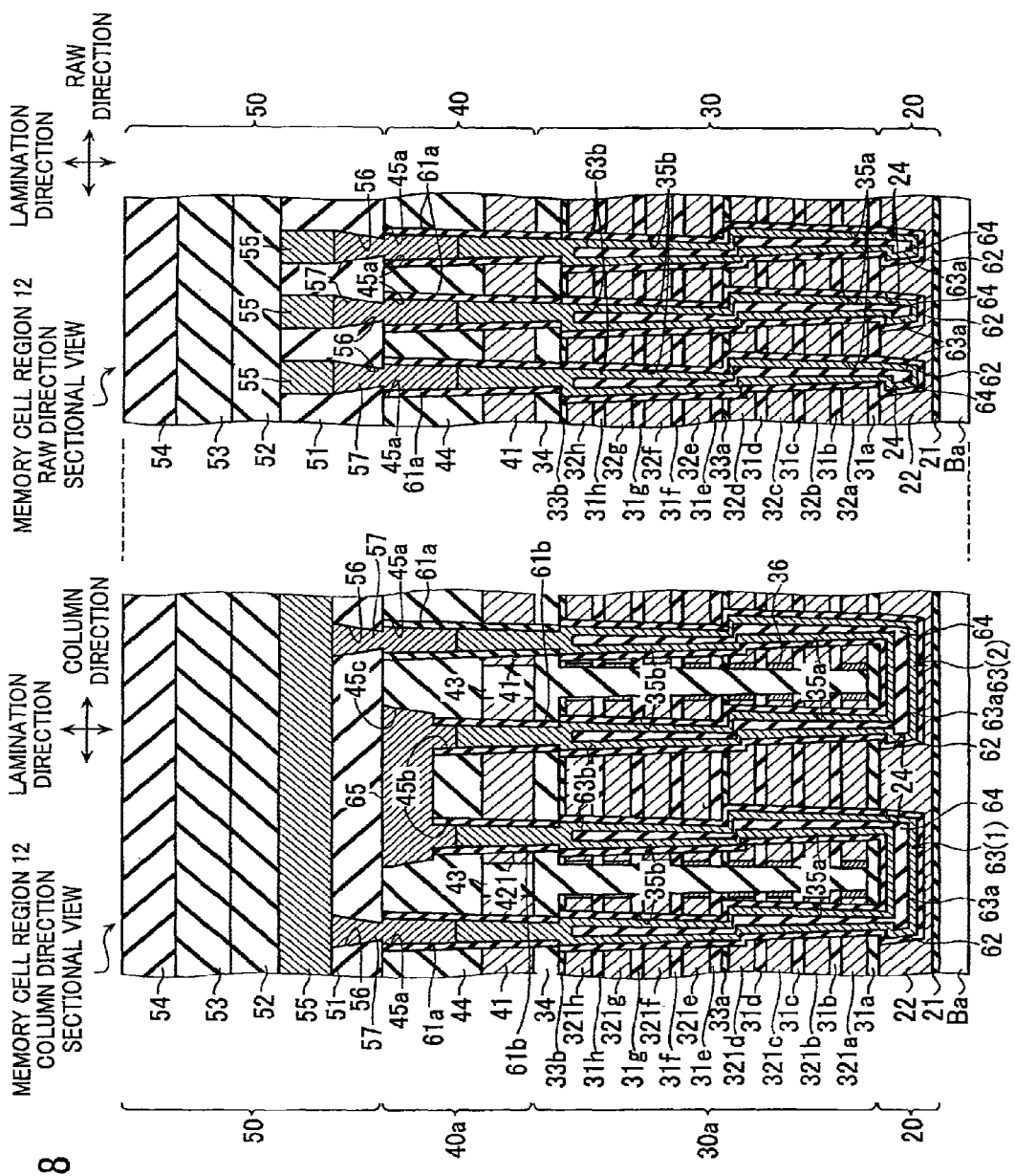
FIG. 48 is a sectional view of the memory transistor region according to the second embodiment.

As shown in FIGS. 47 and 48, a memory transistor layer 30a and a select gate transistor layer 40a in the non-volatile semiconductor storage device according to the second embodiment are arranged different from those of the first embodiment.

In the memory transistor layer 30a and the select gate transistor layer 40a, a source side selection gate line $SGS_m'$ (source side conductive layer 421) and word lines $WL_m1'$ to $WL_m8'$ (first to eighth word line conductive layers 321a to 321h) are arranged different from those of the first embodiment.

Here, a U-shaped semiconductor layer 63 (U-shaped semiconductor layer $SC_{mn}$) disposed at a predetermined position is shown as a "U-shaped semiconductor layer 63 (1) (U-shaped semiconductor layer $SC_{mn}$)". Further, a U-shaped semiconductor layer 63 (U-shaped semiconductor layer $SC_{mn}$), which is disposed adjacent to a column with respect to the "U-shaped semiconductor layer 63 (1) (U-shaped semiconductor layer $SC_{mn}(1)$)", is shown as a "U-shaped semiconductor layer 63 (2) (U-shaped semiconductor layer $SC_{mn}(2)$)".

In the second embodiment, the U-shaped semiconductor layers $SC_{mn}(1)$ and $SC_{mn}(2)$ arranged in a column direction are formed such that they share the word lines $WL_m1'$ to $WL_m8'$ and the source side selection gate line $SGS_m'$ in columnar portions $CL_{mn}$. In other words, the word lines $WL_m1'$ to $WL_m8'$ and the source side selection gate line $SGS_m'$ are divided by respective pairs of columnar portions $CL_{mn}$ which constitutes U-shaped semiconductor layers $SC_{mn}$ adjacent to each other in the column direction. Note that a drain side selection gate line $SGD_m$ is arranged similar to the first embodiment. A source side selection gate line $SGS_m'$ may be also arranged similar to the first embodiment.

Method of Manufacturing Non-Volatile Semiconductor Storage Device According to Second Embodiment Next, a method of manufacturing the non-volatile semiconductor storage device according to the second embodiment will be explained. In the manufacturing process of the non-volatile semiconductor storage device according to the second embodiment, memory separation grooves 94 are not formed between the respective U-shaped semiconductor layers 63 adjacent to each other in the column direction in the processes shown in FIGS. 25 and 26 of the first embodiment. In other words, in the manufacturing process of the non-volatile semiconductor storage device according to the second embodiment, the memory separation grooves 94 are formed only at the centers in the column direction of the respective U-shaped semiconductor layers 63. Thereafter, the non-volatile semiconductor storage device according to the second embodiment is manufactured through the same processes as the first embodiment.

Advantage of Non-Volatile Semiconductor Storage Device According to Second Embodiment The non-volatile semiconductor storage device according to the second embodiment achieves the same advantage as the first embodiment.

Further, in the non-volatile semiconductor storage device according to the second embodiment, the word lines $WL_m5'$ to $WL_m8'$ and the source side selection gate line $SGS_m'$ are formed to surround a pair of the columnar portions $CL_{mn}$ adjacent to each other in the column direction. That is, the word lines $WL_m1'$ to $WL_m8'$ and the source side selection gate line $SGS_m'$ are formed wider in the column direction as compared with the first embodiment. With this arrangement, the non-volatile semiconductor storage device according to the second embodiment can reduce a contact resistance between a first plug conductive layer 86a and the source side selection gate line $SGS_m'$ (source side conductive layer 421) and a contact resistance between the first plug conductive layer 86a and the word lines $WL_m1'$ to $WL_m8'$ (first to eighth word line conductive layers 321a to 321h) as compared with the first embodiment.

Further, the non-volatile semiconductor device according to the second embodiment does not form the memory separation grooves 94 between the U-shaped semiconductor layers 63 adjacent to each other in the column direction in the manufacturing processes as compared with the first embodiment. Accordingly, when the process (silicide process) shown in FIGS. 27 and 28 of the first embodiment is executed, since an aspect ratio of a portion where a metal film is formed can be reduced, process stability can be improved in the silicide process.

Third Embodiment

Figure 49:
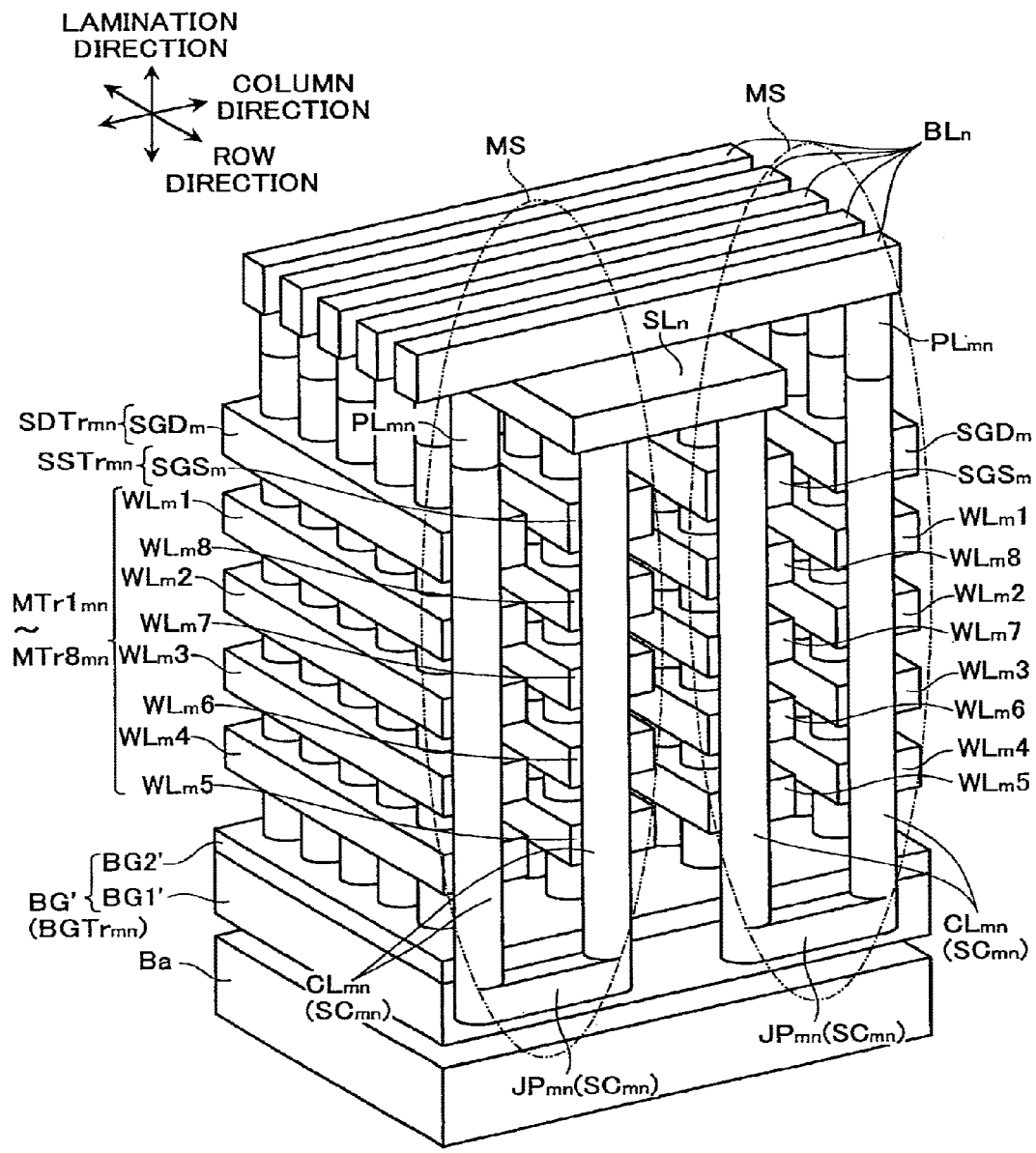
FIG. 49 is a schematic perspective view of a part of a memory transistor region of a non-volatile semiconductor storage device according to a third embodiment of the present invention.

Arrangement of Non-Volatile Semiconductor Storage Device According to Third Embodiment Next, an arrangement of a non-volatile semiconductor storage device according to a third embodiment will be explained referring to FIGS. 49 and 50. FIG. 49 is a schematic perspective view of a part of a memory transistor region of the non-volatile semiconductor storage device according to the third embodiment, and FIG. 50 is a sectional view of the memory transistor region.

Figure 50:
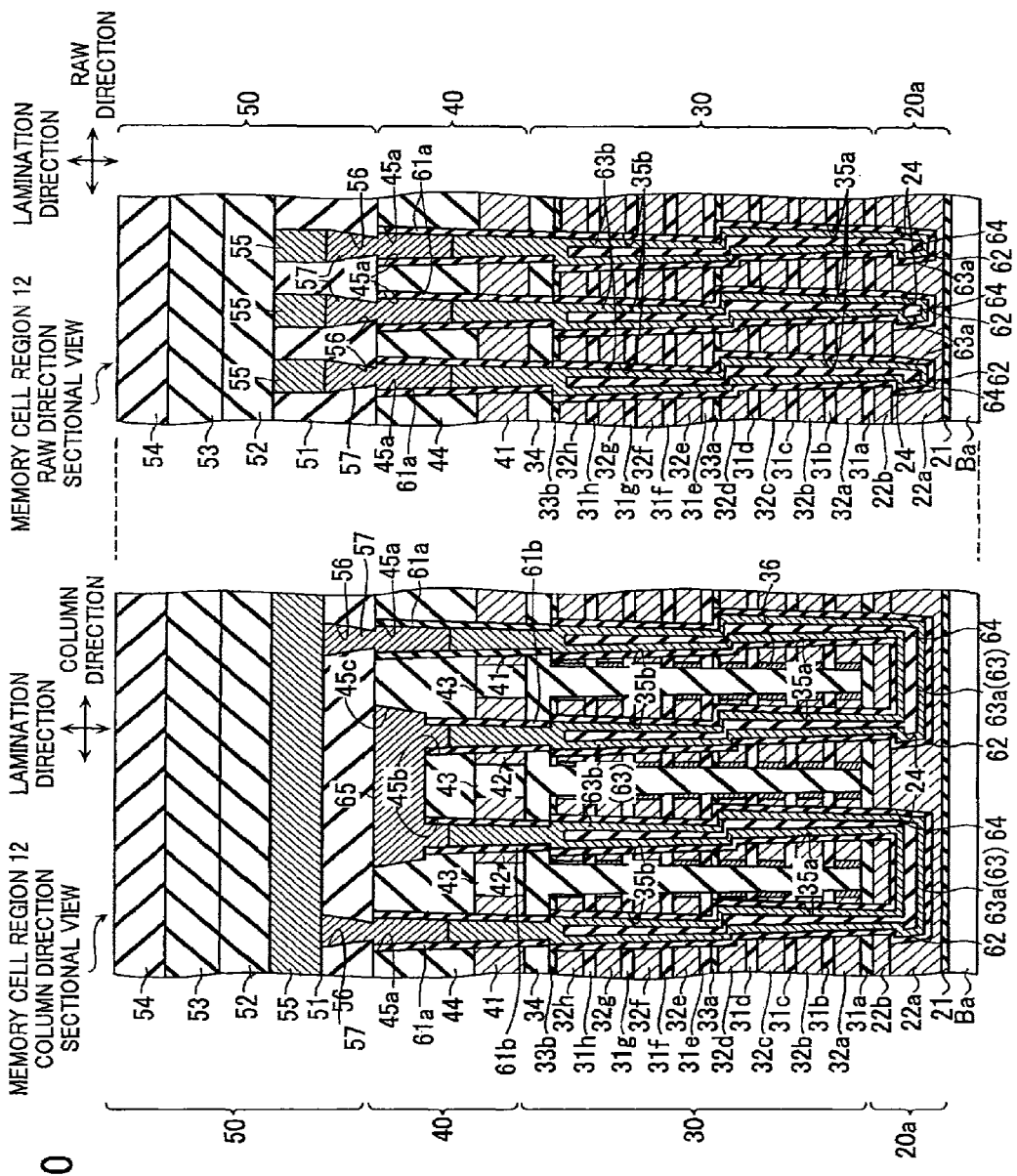
FIG. 50 is a sectional view of the memory transistor region according to the third embodiment.

As shown in FIGS. 49 and 50, in the non-volatile semiconductor storage device according to the third embodiment, an arrangement of a back gate line BG' (back gate transistor layer 20a) is different from the first embodiment. The back gate line BG' (back gate transistor layer 20a) according to the third embodiment has a first back gate line BG1' (first back gate conductive layer 22a) and a second back gate line BG2' (second back gate conductive layer 22b) formed on the first back gate line BG1' (first back gate conductive layer 22a). The first back gate line BG1' (first back gate conductive layer 22a) is formed such that it covers the lower surface and the side surface of a coupling portion $JP_{mn}$ (lower portion of a U-shaped semiconductor layer 63) as well as is formed up to the same height as the upper surface of the coupling portion $JP_{mn}$ likewise the first embodiment. The second back gate line BG2' (second back gate conductive layer 22b) is formed to cover the upper surface of the coupling portion $JP_{mn}$ (coupling portion 63a).

Method of Manufacturing Non-Volatile Semiconductor Storage Device According to Third Embodiment Next, a method of manufacturing the non-volatile semiconductor storage device according to the third embodiment will be explained. In the non-volatile semiconductor storage device according to the third embodiment, the first back gate conductive layer 22a is formed through the processes shown in FIGS. 11 and 12 of the first embodiment. Subsequently, after first sacrificial layers 91 is formed, polysilicon is deposited on the first sacrificial layers 91, and the second back gate conductive layer 22b is further formed. Thereafter, the non-volatile semiconductor storage device according to the third embodiment shown in FIG. 50 is manufactured through the processes shown in FIGS. 13 to 46 of the first embodiment.

Advantage of Non-Volatile Semiconductor Storage Device According to Third Embodiment The non-volatile semiconductor storage device according to the third embodiment achieves the same advantage as the first embodiment.

Further, the non-volatile semiconductor storage device according to the third embodiment has the first back gate line BG1', which covers the lower surface and the side surface of the coupling portion $JP_{mn}$ as well as is formed to the same height as the upper surface of the coupling portion $JP_{mn}$, and the second back gate line BG2' which covers the upper end of the coupling portion $JP_{mn}$. Accordingly, a channel can be formed around the entire periphery of the coupling portion $JP_{mn}$ by the first back gate line BG1' and the second back gate line BG2'. That is, the non-volatile semiconductor storage device according to the third embodiment can reduce the resistance of the coupling portion $JP_{mn}$ as compared with the first and second embodiments.

Further, the design of the distance between the lowermost word line $WL_{mn}$ and the coupling portion $JP_{mn}$ can be easily changed in the manufacturing process by changing only the thickness of the second back gate line BG2' as compared with the first and second embodiments.

Fourth Embodiment

Figure 51:
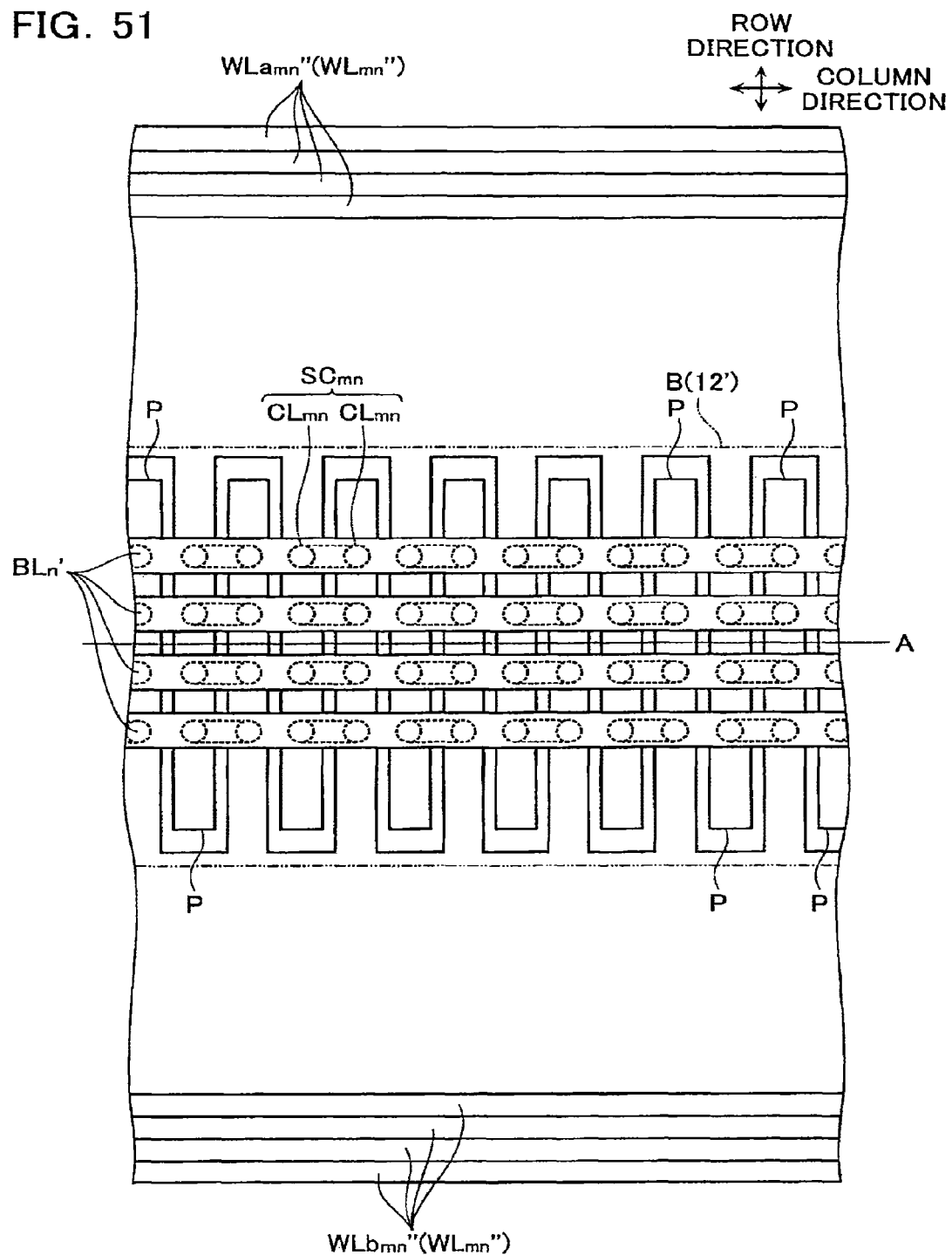
FIG. 51 is a schematic upper surface view of a part of a memory transistor region of a non-volatile semiconductor storage device according to a fourth embodiment of the present invention.

Arrangement of Non-Volatile Semiconductor Storage Device According to Forth Embodiment Next, an arrangement of a non-volatile semiconductor storage device according to a fourth embodiment will be explained referring to FIG. 51. FIG. 51 is a schematic upper surface view of a part of a memory transistor region of the non-volatile semiconductor storage device according to the fourth embodiment.

As shown in FIG. 51, in the non-volatile semiconductor storage device according to the fourth embodiment, word lines $WL_{mn}"$ are arranged different from the first embodiment.

In the fourth embodiment, respective word lines $WL_{mn}"$ have such a shape that they two-dimensionally expand in a row direction and a column direction at respective positions in a lamination direction. Further, when viewed from upper surfaces, the respective word lines $WL_{mn}"$ are broken (divided) so that they are made to a pair of comb shapes facing in the row direction about predetermined positions A in the row direction. More specifically, each of the word lines $WL_{mn}"$ is composed of a first word line $WLa_{mn}"$ and a second word line $WLb_{mn}"$ facing in the row direction.

The first word line $WLa_{mn}"$ and the second word line $WLb_{mn}"$ have projecting portions P extending in the row direction. The projecting portion P of the first word line $WLa_{mn}"$ is formed to surround one of columnar portions $CL_{mn}$ of a U-shaped semiconductor $SC_{mn}$. The projecting portion P of the second word line $WLb_{mn}"$ is formed to surround the other columnar portion $CL_{mn}$ of the U-shaped semiconductor $SC_{mn}$.

A bit line BL is formed on the upper layers of a region B in which the respective word lines $WL_{mn}"$ are broken. More specifically, the region B functions as a memory transistor region 12'.

Advantage of Non-Volatile Semiconductor Storage Device According to Forth Embodiment The non-volatile semiconductor storage device according to the fourth embodiment achieves the same advantage as the first embodiment.

Further, in the non-volatile semiconductor storage device according to the fourth embodiment, the respective word lines $WL_{mn}"$ have such a shape that they two-dimensionally expand in the row direction and the column direction at the respective positions in the lamination direction when viewed from the upper surfaces. Further, when viewed from the upper surfaces, the respective word lines $WL_{mn}"$ are broken so that they made to a comb shape about predetermined positions A in the row direction. Accordingly, in the non-volatile semiconductor storage device according to the fourth embodiment, since the word lines $WL_{mn}$ are not processed to a line state as in the first to third embodiments, they can be manufactured by manufacturing processes which are easier than the first to third embodiments. Further, a word line drive circuit 13 can be arranged as a common circuit by the arrangement of the word lines $WL_{mn}"$. Accordingly, in the non-volatile semiconductor storage device according to the fourth embodiment, an area occupied by a control circuit including the word line drive circuit 13 and the like can be reduced.

Other Embodiments

Although the embodiments of the non-volatile semiconductor storage device have been explained above, the present invention is not limited to the embodiments, and various modifications, additions, replacements, and the like can be made within a scope which does not depart from the gist of the invention.

For example, in the first embodiment, the conductive voltage Vj is applied to the back gate line BG when the read-out operation, the write operation, and then erase operation are executed, the conductive voltage Vj may be applied thereto also in an ordinary operation.

Further, in the first embodiment, although the back gate conductive layer 22 covers the lower surface and the side surface of the coupling portion 63a of the U-shaped semiconductor layer 63, it may cover only the side surface of the coupling portion 63a. Further, the back gate conductive layer 22 may cover only the bottom surface of the coupling portion 63a.

The invention claimed is:

1. A semiconductor device comprising:
   memory cells electrically connected in series in a first direction crossing a substrate, the memory cells including:
   a first cell transistor at a first level, the first cell transistor including a first semiconductor portion, a first electrode, and a first memory portion provided between the first semiconductor portion and the first electrode, the first cell transistor having a first distance between a central axis and an outer surface of the first semiconductor portion,
   a second cell transistor at a second level, the second cell transistor including a second semiconductor portion, a second electrode, and a first insulating layer provided between the second semiconductor portion and the second electrode, the second cell transistor having a second distance between a central axis and an outer surface of the second semiconductor portion, and
   a third cell transistor at a third level, the second level being between the first level and the third level in the first direction, the third cell transistor including a third semiconductor portion, a third electrode, and a second memory portion provided between the third semiconductor portion and the third electrode, the third memory cell having a third distance between a central axis and an outer surface of the third semiconductor portion,
   wherein the second distance is larger than the first distance and the third distance.

2. The device according to claim 1, wherein the central axis of the first semiconductor portion and the central axis of the third semiconductor portion are shifted in a second direction perpendicular to the first direction.

3. The device according to claim 1, wherein the first semiconductor portion has a first diameter the second semiconductor portion has a second diameter, and the third semiconductor portion has a third diameter, the second diameter being larger than the first diameter and the third diameter.

4. The device according to claim 1, wherein the memory cells include a fourth cell transistor at a fourth level, the first level being between the second level and the fourth level, the fourth cell transistor including a fourth semiconductor portion, a fourth electrode, and a third memory portion provided between the fourth semiconductor portion and the fourth electrode, the fourth cell transistor having a fourth distance between a central axis and an outer surface of the fourth semiconductor portion, the fourth distance being larger than the first distance.

5. The device according to claim 4, wherein the memory cells include a fifth cell transistor at a fifth level, the third level being between the second level and the fifth level, the fifth cell transistor including a fifth semiconductor portion, a fifth electrode, and a fourth memory portion provided between the fifth semiconductor portion and the fifth electrode, the fifth memory cell having a fifth distance between a central axis and an outer surface of the fifth semiconductor portion, the fifth distance being smaller than the third distance.

6. The device according to claim 1, wherein the memory cells include a fifth cell transistor at a fifth level, the third level being between the second level and the fifth level, the fifth cell transistor including a fifth semiconductor portion, a fifth electrode, and a fourth memory portion provided between the fifth semiconductor portion and the fifth electrode, the fifth memory cell having a fifth distance between a central axis and an outer surface of the fifth semiconductor portion, the fifth distance being smaller than the third distance.

7. The device according to claim 1, further comprising a second insulating layer and a third insulating layer provided on the second insulating layer in the first direction, the second insulating layer and the third insulating layer being provided between the first cell transistor and the second cell transistor, a material of the second insulating layer being different from a material of the third insulating layer.

8. A semiconductor device comprising
a first stacked unit including
a first semiconductor layer extending in a first direction,
first electrodes stacked in the first direction, and
a first memory portion provided between the first semiconductor layer and one of the first electrodes, and
a second stacked unit provided on the first stacked unit in the first direction, the second stacked unit including
a second semiconductor layer extending in the first direction,
second electrodes stacked in the first direction, and
a second memory portion provided between the second semiconductor layer and one of the second electrodes,
wherein a central axis of the first semiconductor layer and a central axis of the second semiconductor layer are shifted in a second direction perpendicular to the first direction.

9. The device according to claim 8, further comprising an intermediate layer provided above the first stacked body and below the second stacked body.

10. The device according to claim 9, further comprising a first insulating layer provided between the first electrodes, a material of the intermediate layer being different from a material of the first insulating layer and the first electrodes.

11. The device according to claim 10, wherein the first electrodes include silicon and the first insulating layer includes silicon oxide.

\* \* \* \* \*